(12) United States Patent
Kurokawa

(10) Patent No.: US 10,453,381 B2
(45) Date of Patent: Oct. 22, 2019

(54) ELECTRONIC DEVICE, OPERATION METHOD OF THE ELECTRONIC DEVICE, AND MOVING VEHICLE

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 183 days.

(21) Appl. No.: 15/632,448

(22) Filed: Jun. 26, 2017

(65) Prior Publication Data

US 2018/0005566 A1 Jan. 4, 2018

(30) Foreign Application Priority Data

Jun. 29, 2016 (JP) .................................. 2016-128736
Aug. 1, 2016 (JP) .................................. 2016-151239

(51) Int. Cl.
*G09G 3/20* (2006.01)
*G09G 3/3208* (2016.01)
(Continued)

(52) U.S. Cl.
CPC ......... *G09G 3/2096* (2013.01); *G09G 3/2003* (2013.01); *G09G 3/32* (2013.01);
(Continued)

(58) Field of Classification Search
CPC ............... G06N 3/02; G09G 2300/023; G09G 2300/0456; G09G 2300/046;
(Continued)

(56) References Cited

U.S. PATENT DOCUMENTS 6,470,328 B1 10/2002 Varshavsky
6,870,529 B1 3/2005 Davis
(Continued)

FOREIGN PATENT DOCUMENTS

JP 06-274661 A 9/1994
JP 08-292752 A 11/1996
(Continued)

OTHER PUBLICATIONS

Arima.Y et al., "A Self-Learning Neural Network Chip with 125 Neurons and 10K Self-Organization Synapses", IEEE Journal of Solid-State Circuits, Apr. 1, 1991, vol. 26, No. 4, pp. 607-611.
(Continued)

*Primary Examiner* — Dmitriy Bolotin
(74) *Attorney, Agent, or Firm* — Fish & Richardson P.C.

(57) ABSTRACT

To provide an electronic device whose display quality is independent of environment light. The display quality of an image of an electronic device that is viewed by a user depends on the brightness of external light, the angle of external light incident on the electronic device, and the orientation of a display portion in the electronic device. The electronic device is provided with an optical sensor, an acceleration sensor, and the like so that the brightness of external light, the angle of external light incident on the electronic device, and the orientation of the display portion in the electronic device are determined, and the luminance and color tone of the display portion in the electronic device are corrected on the basis of the information. As the correcting method, calculation using a neural network is performed using the luminance and color tone meeting the preference of the user as teacher data and the brightness of external light, the angle of external light incident on the electronic device, and the orientation of the display portion in the electronic device as input data. The calculation result
(Continued)

is reflected on the luminance and color tone of the display portion in the electronic device, whereby an image with display quality that suits the user's preference can be displayed.

9 Claims, 39 Drawing Sheets

(51) Int. Cl.
*G09G 3/36* (2006.01)
*G09G 5/10* (2006.01)
*G09G 3/32* (2016.01)
*G06N 3/02* (2006.01)
*H01L 29/786* (2006.01)

(52) U.S. Cl.
CPC ............ *G09G 3/3208* (2013.01); *G09G 3/36* (2013.01); *G09G 3/3648* (2013.01); *G09G 5/10* (2013.01); *G06N 3/02* (2013.01); *G09G 2300/023* (2013.01); *G09G 2300/046* (2013.01); *G09G 2300/0456* (2013.01); *G09G 2320/0276* (2013.01); *G09G 2320/0626* (2013.01); *G09G 2320/0666* (2013.01); *G09G 2320/0673* (2013.01); *G09G 2320/103* (2013.01); *G09G 2330/022* (2013.01); *G09G 2340/0492* (2013.01); *G09G 2354/00* (2013.01); *G09G 2360/144* (2013.01); *G09G 2360/18* (2013.01); *G09G 2380/10* (2013.01); *G09G 2380/12* (2013.01); *H01L 29/78648* (2013.01)

(58) Field of Classification Search
CPC ... G09G 2320/0276; G09G 2320/0626; G09G 2320/0666; G09G 2320/0673; G09G 2320/103; G09G 2330/022; G09G 2340/0492; G09G 2354/00; G09G 2360/144; G09G 2360/18; G09G 2380/10; G09G 2380/12; G09G 3/2003; G09G 3/2096; G09G 3/32; G09G 3/3208; G09G 3/36; G09G 3/3648; G09G 5/10; H01L 29/78648

See application file for complete search history.

(56) References Cited

U.S. PATENT DOCUMENTS

| | | |
|---|---|---|
| 2003/0107688 A1 | 6/2003 | Yamagishi |
| 2011/0148835 A1* | 6/2011 | Yamazaki ........... G02F 1/13318 345/207 |
| 2012/0105515 A1* | 5/2012 | Iwasaki ................ G09G 3/3406 345/691 |
| 2012/0212466 A1* | 8/2012 | Kohtoku ........... G02F 1/133385 345/207 |
| 2012/0212467 A1* | 8/2012 | Kohtoku ............... G02F 1/1354 345/207 |
| 2017/0270405 A1* | 9/2017 | Kurokawa ........... G06N 3/0635 |
| 2017/0301376 A1* | 10/2017 | Kurokawa ............. G11C 5/063 |

FOREIGN PATENT DOCUMENTS

| | | |
|---|---|---|
| JP | 2000-057244 A | 2/2000 |
| JP | 2008-225381 A | 9/2008 |
| WO | WO-2007/041150 | 4/2007 |

OTHER PUBLICATIONS

International Search Report (Application No. PCT/IB2017/053751) dated Oct. 17, 2017.
Written Opinion (Application No. PCT/IB2017/053751) dated Oct. 17, 2017.

* cited by examiner

1301

1311

1302

1311

1303

1311

1304

1311

ELECTRONIC DEVICE, OPERATION METHOD OF THE ELECTRONIC DEVICE, AND MOVING VEHICLE

TECHNICAL FIELD

Embodiments of the present invention relate to an electronic device, an operation method of the electronic device, and a moving vehicle.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

BACKGROUND ART

Display devices included in mobile phones such as smartphones, tablet information terminals, and notebook personal computers (PC) have undergone various improvements in recent years. For example, there have been developed display devices with features such as higher resolution, higher color reproducibility (higher NTSC ratio), a smaller driver circuit, and lower power consumption.

As an example, an improved display device has a function of automatically adjusting the brightness of an image displayed on the display device in accordance with ambient light. An example of such a display device is a display device having a function of displaying an image by reflecting ambient light and a function of displaying an image by making a light-emitting element emit light. This structure enables the brightness of an image displayed on a display device to be adjusted in the following manner: the display device is set to a display mode for displaying an image with the use of reflected light (hereinafter referred to as a reflective mode) when ambient light is sufficiently strong, whereas the display device is set to a display mode for displaying an image with light emitted from a light-emitting element (hereinafter referred to as a self-luminous mode) when ambient light is weak. In other words, the display device can display images in a display mode that is selected from the reflective mode, the self-luminous mode, and a mode using both the reflective and self-luminous modes in accordance with the intensity of ambient light sensed with an illuminometer (illuminance sensor).

As examples of a display device having a function of displaying an image by making a light-emitting element emit light and a function of displaying an image by reflecting ambient light, Patent Documents 1 to 3 each disclose a display device in which one pixel includes a pixel circuit for controlling a liquid crystal element and a pixel circuit for controlling a light-emitting element (such a display device is referred to as a hybrid display device).

For image processing for a display device to display an image, the utilization of a neural network has been considered. Non-Patent Document 1 discloses a technique relating to a chip having a self-learning function with a neural network.

REFERENCE

Patent Document

[Patent Document 1] United States Patent Application Publication No. 2003/0107688
[Patent Document 2] PCT International Publication No. WO2007/041150
[Patent Document 3] Japanese Published Patent Application No. 2008-225381

Non-Patent Document

[Non-Patent Document 1] Yutaka Arima et al., "A Self-Learning Neural Network Chip with 125 Neurons and 10K Self-Organization Synapses," *IEEE Journal of Solid-State Circuits*, Vol. 26, No. 4, April 1991, pp. 607-611

DISCLOSURE OF INVENTION

In order that a hybrid display device has display quality that is independent of environment light, it is necessary to adjust the luminance and correct color tone in accordance with the usage environment. For example, when the brightness of external light changes, it is necessary to adjust the luminance of a hybrid display device and correct color tones, depending on the brightness.

In addition, the hybrid display device needs to adjust the luminance and correct color tone, depending on the angle of external light incident on the hybrid display device or the angle between the hybrid display device and the user's eyes. Note that the adjustment of the luminance and the correction of color tone are preferably performed according to the user's preference.

An object of one embodiment of the present invention is to provide a novel electronic device. Another object of one embodiment of the present invention is to provide an operation method of the novel electronic device.

Another object of one embodiment of the present invention is to provide an electronic device with high display quality. Another object of one embodiment of the present invention is to provide an electronic device with low power consumption.

Note that the objects of one embodiment of the present invention are not limited to the above objects. The objects described above do not disturb the existence of other objects. The other objects are the ones that are not described above and will be described below. The other objects are apparent from and can be derived from the description of the specification, the drawings, and the like by those skilled in the art. One embodiment of the present invention achieves at least one of the above objects and the other objects. One embodiment of the present invention does not necessarily achieve all the above objects and the other objects.

(1) One embodiment of the present invention is an electronic device including a sensor and a semiconductor device. The semiconductor device includes a first memory cell, a second memory cell, and an offset circuit. The first memory cell is configured to generate a first current in accordance with first analog data held in the first memory cell. The second memory cell is configured to output a second current in accordance with reference analog data held in the second memory cell. The offset circuit is configured to output a third current corresponding to a difference between the first current and the second current. The first memory cell is configured to output a fourth current in accordance with the first analog data held in the first memory cell when second analog data is supplied as a signal to the first memory cell. The second memory cell is configured to output a fifth current in accordance with the reference analog data held in the second memory cell and the second analog data when the second analog data is supplied as a signal to the second memory cell. The semiconductor device is configured to output a sixth current that corresponds to the sum of products of the first analog data and the second analog data and that is obtained by subtracting the third current from a difference between the fourth current and the fifth current. The sensor is configured to acquire first data. The semiconductor device is configured to generate third data in accordance with the first data, second data selected by a user, and the sixth current. The second data includes a set value corresponding to first luminance and first color tone.

(2) Another embodiment of the present invention is the electronic device according to (1) that includes a first display element and a second display element. The third data includes fourth data including a set value corresponding to second luminance and second color tone and fifth data including a set value corresponding to third luminance and third color tone. The first display element is configured to display an image depending on the set value corresponding to the second luminance and the second color tone with use of reflection of light. The second display element is configured to display an image depending on the set value corresponding to the third luminance and the third color tone by self-emission.

(3) Another embodiment of the present invention is the electronic device according to (1) or (2) in which the first memory cell, the second memory cell, and the offset circuit each include a transistor. A channel formation region in the transistor includes an oxide containing at least one of indium, zinc, and an element M that is aluminum, gallium, yttrium, or tin.

(4) Another embodiment of the present invention is the electronic device according to any one of (1) to (3) in which the sensor includes a first sensor portion. The first sensor portion includes a first light-blocking film, a second light-blocking film, and a plurality of optical sensors. The first light-blocking film is provided with a plurality of first openings at intervals of a first distance. The second light-blocking film is provided with a plurality of second openings at intervals of a second distance longer than the first distance. The first light-blocking film is located over the optical sensors. The second light-blocking film is located over the first light-blocking film. One of the plurality of optical sensors, one of the plurality of first openings, and one of the plurality of second openings partly overlap with one another.

(5) Another embodiment of the present invention is the electronic device according to any one of (1) to (4) in which the sensor further includes a second sensor portion. The second sensor portion includes an acceleration sensor.

(6) Another embodiment of the present invention is an operation method of the electronic device according to (5), including first to sixth steps. The first step is a step of inputting the second data to the electronic device. The second step is a step of generating sixth data depending on illuminance and an incident angle of light received in the first sensor portion. The third step is a step of generating seventh data depending on inclination of the electronic device in the second sensor portion. The first data includes the sixth data and the seventh data. The fourth step is a step of sending the first data from the sensor to the semiconductor device. The fifth step is a step of outputting a weight coefficient depending on the first data and the second data in the semiconductor device. The sixth step is a step of outputting the third data depending on the first data and the weight coefficient in the semiconductor device.

(7) One embodiment of the present invention is a moving vehicle including a sensor, a semiconductor device, and a display portion. The semiconductor device includes a first memory cell, a second memory cell, and an offset circuit. The first memory cell is configured to output a first current in accordance with first analog data held in the first memory cell. The second memory cell is configured to output a second current in accordance with reference analog data held in the second memory cell. The offset circuit is configured to output a third current corresponding to a difference between the first current and the second current. The first memory cell is configured to output a fourth current in accordance with the first analog data held in the first memory cell and second analog data when the second analog data is supplied as a signal to the first memory cell. The second memory cell is configured to output a fifth current in accordance with the reference analog data held in the second memory cell and the second analog data when the second analog data is supplied as a signal to the second memory cell. The semiconductor device is configured to output a sixth current that corresponds to the sum of products of the first analog data and the second analog data and that is obtained by subtracting the third current from a difference between the fourth current and the fifth current. The sensor is configured to acquire first data. The semiconductor device is configured to generate third data in accordance with the first data, second data selected by a user, and the sixth current. The second data includes a set value corresponding to first luminance and first color tone. The display portion displays an image based on the third data.

(8) Another embodiment of the present invention is the moving vehicle according to (7) in which the sensor is provided in a housing.

According to one embodiment of the present invention, a novel electronic device can be provided. According to another embodiment of the present invention, an operation method of the novel electronic device can be provided.

According to another embodiment of the present invention, an electronic device with high display quality can be provided. According to another embodiment of the present invention, an electronic device with low power consumption can be provided.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BEST MODE FOR CARRYING OUT THE INVENTION

An "electronic device", an "electronic component", a "module", and a "semiconductor device" will be described. In general, an "electronic device" may refer to a personal computer, a mobile phone, a tablet terminal, an e-book reader, a wearable terminal, an audiovisual (AV) device, an electronic appliance, a household appliance, an industrial appliance, a digital signage, a car, or an electronic appliance including a system, for example. An "electronic component" or a "module" may refer to a processor, a memory device, a sensor, a battery, a display device, a light-emitting device, an interface device, a radio frequency (RF) tag, a receiver, or a transmitter included in an electronic device. A "semiconductor device" may refer to a device including a semiconductor element or a driver circuit, a control circuit, a logic circuit, a signal generation circuit, a signal conversion circuit, a potential level converter circuit, a voltage source, a current source, a switch circuit, an amplifier circuit, a memory circuit, a memory cell, a display circuit, a display pixel, or the like that includes a semiconductor element and is included in an electronic component or a module.

In this specification and the like, a metal oxide that is included in (a channel formation region of) a transistor having at least one of an amplification function, a rectification function, and a switching function is referred to as a metal oxide semiconductor or an oxide semiconductor (abbreviated to an OS). Thus, a transistor including an oxide semiconductor in a channel formation region is referred to as an OS transistor in some cases.

Embodiment 1

<Structure Example>

In this embodiment, an example of an electronic device including a hybrid display device that can achieve the object described above will be described.

Figure 1A:
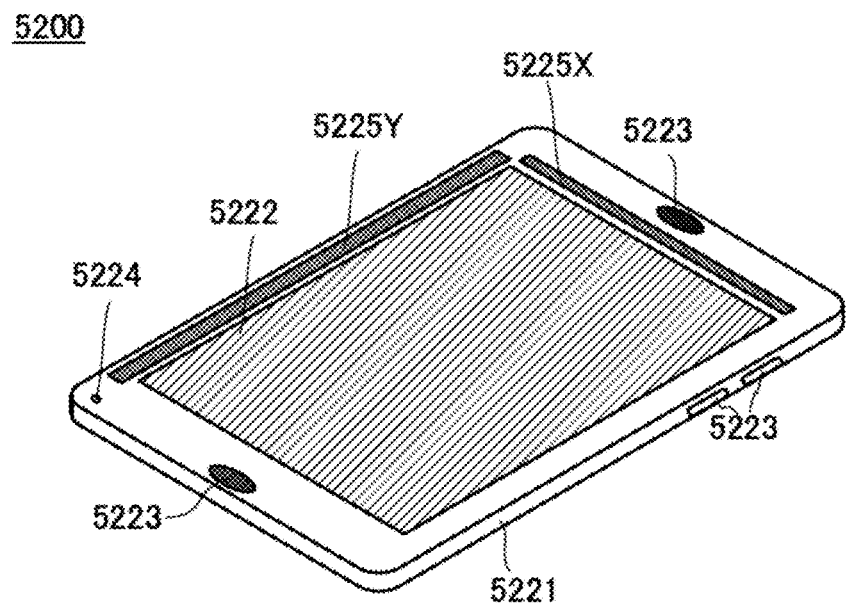
FIGS. 1A and 1B are perspective views each illustrating an example of an electronic device.

FIG. 1A illustrates an example of the electronic device disclosed as one embodiment of the present invention. FIG. 1A illustrates a tablet information terminal 5200, which includes a housing 5221, a display portion 5222, operation buttons 5223, and a speaker 5224. A display device having a position input function may be used as the display portion 5222. The position input function can be added by providing a touch panel in the display device. Alternatively, the position input function can be added by providing a photoelectric conversion element also called a photosensor in a pixel portion of the display device. As the operation buttons 5223, any one of a power switch for starting the information terminal 5200, a button for operating an application of the information terminal 5200, a volume control button, a switch for turning on or off the display portion 5222, and the like can be provided. Although the number of the operation buttons 5223 is four in the information terminal 5200 illustrated in FIG. 1A, the number and position of operation buttons included in the information terminal 5200 are not limited to this example.

The information terminal 5200 further includes an optical sensor 5225X and an optical sensor 5225Y for measuring the incident angle of external light. The optical sensor 5225X and the optical sensor 5225Y are located in a bezel of the housing 5221. Specifically, the optical sensor 5225X is located along one of two short sides of the bezel of the housing 5221, and the optical sensor 5225Y is located along one of two long sides of the bezel of the housing 5221. In one embodiment of the present invention, the incident angle and illuminance of external light are measured with the optical sensor 5225X and the optical sensor 5225Y. On the basis of the obtained data, the light and color of image data to be displayed on the display portion 5222 are adjusted.

Figure 1B:
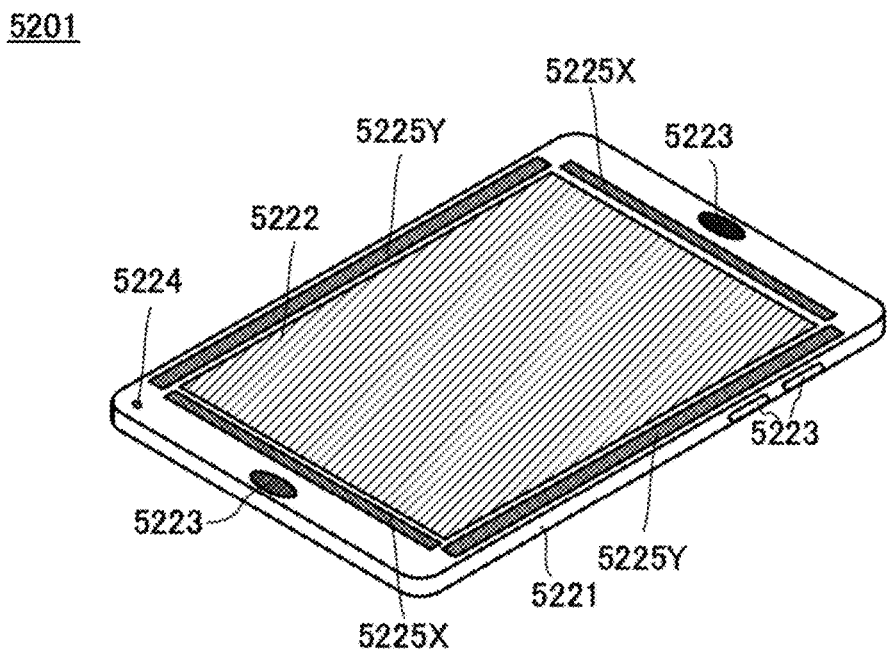

The locations of the optical sensor 5225X and the optical sensor 5225Y are not limited to those in the information terminal 5200 illustrated in FIG. 1A. For example, as in an information terminal 5201 illustrated in FIG. 1B, the optical sensor 5225X may be located along each of the two short sides of the bezel of the housing 5221, and the optical sensor 5225Y may be located along each of the two long sides of the bezel of the housing 5221.

Note that the optical sensor 5225X and the optical sensor 5225Y will be described in detail in Embodiment 10.

Although not illustrated, the information terminal 5200 illustrated in FIG. 1A may include a sensor (which measures force, displacement, position, speed, acceleration, angular velocity, rotational frequency, distance, light, liquid, magnetism, temperature, a chemical substance, a sound, time, hardness, electric field, current, voltage, electric power, radiation, flow rate, humidity, gradient, oscillation, smell, infrared rays, or the like) inside the housing 5221. In particular, when a measuring device including a sensor for measuring inclination, such as a gyroscope sensor or an acceleration sensor, is provided, display on the screen of the display portion 5222 can be automatically changed in accordance with the orientation of the information terminal 5200 illustrated in FIG. 1A by determining the orientation of the information terminal 5200 (the orientation of the information terminal with respect to the vertical direction).

A combination of information about the inclination with information about the incident angle and illuminance of external light that is obtained by the optical sensors 5225X and 5225Y described above enables more accurate adjustments of the light and color of image data to be displayed on the display portion 5222. In that case, with an imaging sensor provided in the housing 5221, information about the position of user's eyes (or viewing direction) with respect to the information terminal 5200 is obtained, and the information is combined with information about the inclination and the incident angle and illuminance of external light. This enables even more accurate adjustments of the light and color of image data to be displayed on the display portion 5222.

Note that a neural network can be utilized for a method for automatically adjusting light and color. The neural network will be described in Embodiment 3.

<Other Structure Examples>

Although not illustrated, the information terminal 5200 illustrated in FIG. 1A may include a microphone. With this structure, the information terminal 5200 can have a telephone function like a cellular phone, for example.

Although not illustrated, the information terminal 5200 illustrated in FIG. 1A may include a camera. Although not illustrated, the information terminal 5200 illustrated in FIG. 1A may include a light-emitting device for use as a flashlight or a lighting device.

Although not illustrated, the information terminal 5200 illustrated in FIG. 1A may include a device for obtaining biological information such as fingerprints, veins, iris, or voice prints. With this structure, the information terminal 5200 can have a biometric identification function.

In the case where the information terminal 5200 includes a microphone, it can have a speech interpretation function. With the speech interpretation function, the information terminal 5200 can have a function of operating the information terminal 5200 by speech recognition, a function of interpreting a speech or a conversation and creating a summary of the speech or the conversation, and the like. This can be utilized to create meeting minutes or the like, for example.

This embodiment can be combined with any of the other embodiments in this specification as appropriate.

Embodiment 2

In this embodiment, a controller integrated chip (controller IC) that controls the display portion of the hybrid display device described in Embodiment 1 will be described.

<Controller IC>

Figure 2:
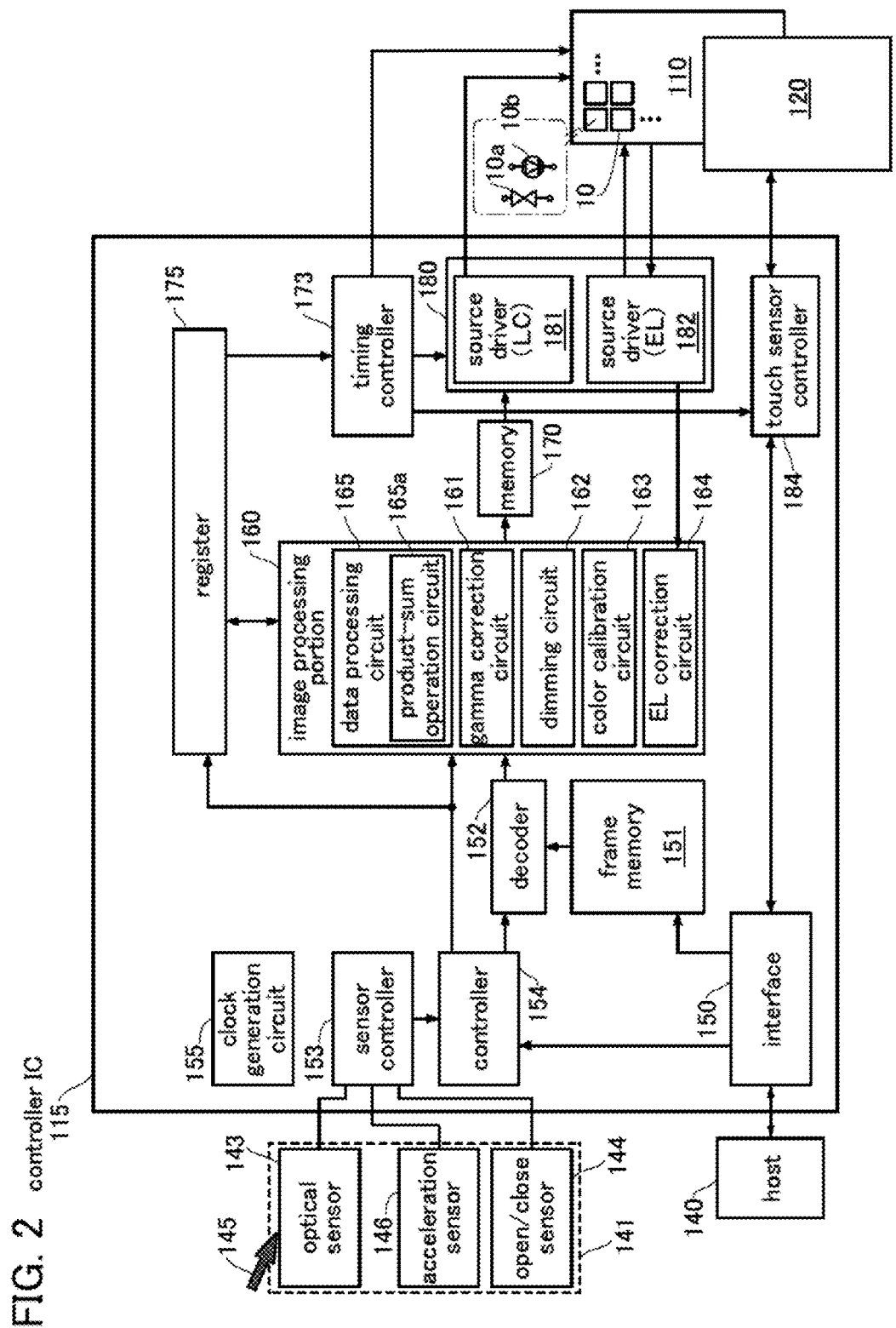
FIG. 2 is a block diagram illustrating a configuration example of a controller IC.

FIG. 2 is a block diagram illustrating a configuration example of a controller IC 115. The controller IC 115 includes an interface 150, a frame memory 151, a decoder 152, a sensor controller 153, a controller 154, a clock generation circuit 155, an image processing portion 160, a memory 170, a timing controller 173, a register 175, a source driver 180, and a touch sensor controller 184.

The controller IC 115 is electrically connected to a display unit 110 and a touch sensor unit 120. The display unit 110 includes a pixel array that includes a plurality of pixels 10. The pixel 10 includes a reflective element 10a and a light-emitting element 10b. In this embodiment, the display unit 110 and the touch sensor unit 120 are components of the display portion 5222 of the information terminal 5200 described in Embodiment 1. Note that the display unit 110 and the touch sensor unit 120 will be described in detail in Embodiment 5.

The reflective element 10a is a display element that displays an image with use of reflected light in the display device, and a liquid crystal element, for example, can be used as the reflective element 10a. The light-emitting element 10b is a display element that displays an image by self-emission in the display device, and an organic EL element, for example, can be used as the light-emitting element 10b. In this embodiment, the reflective element 10a is assumed to be a liquid crystal (LC) element, and the light-emitting element 10b is assumed to be an organic electroluminescence (EL) element. Note that the reflective element 10a and the light-emitting element 10b will be described in detail in Embodiment 7.

The controller IC 115 is electrically connected to a sensor 141 that includes multiple kinds of sensors. In FIG. 2, the sensor 141 includes an optical sensor 143, an open/close sensor 144, and an acceleration sensor 146.

The source driver 180 includes a source driver 181 and a source driver 182. The source driver 181 is a driver for driving the reflective element 10a, and the source driver 182 is a driver for driving the light-emitting element 10b.

Communication between the controller IC 115 and a host 140 is performed via the interface 150. Image data, a variety of control signals, and the like are transmitted from the host 140 to the controller IC 115. Information about a touch position or the like obtained by the touch sensor controller 184 is transmitted from the controller IC 115 to the host 140. Note that in this embodiment, the host 140 is a component of the information terminal 5200 described in Embodiment 1. Note that which to use out of the circuits included in the controller IC 115 can be determined as appropriate depending on, for example, the standard for the host 140 and the specifications of the display unit 110, the touch sensor unit 120, and the like.

The frame memory 151 is a memory for storing the image data input to the controller IC 115. In the case where compressed image data is transmitted from the host 140, the frame memory 151 can store the compressed image data. The decoder 152 is a circuit for decompressing the compressed image data. When decompression of the image data is not needed, processing is not performed in the decoder 152. Alternatively, the decoder 152 can be provided between the frame memory 151 and the interface 150.

The image processing portion 160 has a function of performing various kinds of image processing on image data. For example, the image processing portion 160 includes a gamma correction circuit 161, a dimming circuit 162, a color calibration circuit 163, an EL correction circuit 164, and a data processing circuit 165.

The gamma correction circuit 161 has a function of correcting a gamma value. The gamma value represents the response characteristics of the gradation of an image to an input voltage (or an input current). Generally, when the gamma value is less than 1, an image with black floating is displayed on the display portion, whereas when the gamma value is greater than 1, an image with dark-area-gradation deterioration is displayed on the display portion. The gamma correction circuit 161 has a function of correcting the input voltage (or the input current) such that the gamma value becomes 1.

The EL correction circuit 164 is provided in the case where the source driver 182 is provided with a current detection circuit that detects current flowing through the light-emitting element 10b. The EL correction circuit 164 has a function of adjusting the luminance of the light-emitting element 10b on the basis of a signal transmitted from the current detection circuit of the source driver 182.

The image data processed in the image processing portion 160 is output to the source driver 180 through the memory 170. The memory 170 is a memory for temporarily storing image data. The source driver 181 and the source driver 182 each have a function of processing the input image data and writing the image data to a source line in the display unit 110.

The timing controller 173 has a function of generating timing signals to be used in the source driver 180, the touch sensor controller 184, and gate drivers of the display unit 110.

The touch sensor controller 184 has a function of controlling a touch sensor driver (hereinafter referred to as a TS driver) and a sensing circuit of the touch sensor unit 120. A signal including touch information read from the sensing circuit is processed in the touch sensor controller 184 and transmitted to the host 140 through the interface 150. The host 140 generates image data reflecting the touch information and transmits the image data to the controller IC 115. Note that the controller IC 115 can reflect the touch information in the image data.

The clock generation circuit 155 has a function of generating a clock signal to be used in the controller IC 115. The controller 154 has a function of processing a variety of control signals transmitted from the host 140 through the interface 150 and controlling a variety of circuits in the controller IC 115. The controller 154 also has a function of controlling power supply to the variety of circuits in the controller IC 115. Hereinafter, temporary stop of power supply to a circuit that is not used is referred to as power gating.

The register 175 stores data used for the operation of the controller IC 115. The data stored in the register 175 includes a parameter used to perform correction in the image processing portion 160, parameters used to generate waveforms of a variety of timing signals in the timing controller 173, and the like. The register 175 is provided with a scan chain register including a plurality of registers. In particular, the register 175 preferably includes a nonvolatile register. Furthermore, a transistor included in the nonvolatile register preferably has a low off-state current. The use of the transistor with a low off-state current enables suppression of current leakage between a source and a drain of the transistor when the transistor is off. Suppression of current leakage allows the register to hold charge (data). Note that the transistor is preferably an OS transistor that includes an oxide containing at least one of indium, zinc, and an element M (the element M is aluminum, gallium, yttrium, or tin) in a channel formation region. Furthermore, the oxide is preferably a CAC-OS to be described in Embodiment 14.

The sensor controller 153 is electrically connected to the optical sensor 143. The optical sensor 143 has a function of measuring the illuminance and incident angle of external light 145 and generating a sensor signal including information about the measured illuminance and incident angle. The sensor controller 153 generates a control signal on the basis of the sensor signal. The control signal is output to the controller 154, for example. Note that the optical sensor 143 can be used as the optical sensors 5225X and 5225Y of the information terminal 5200 described in Embodiment 1.

The acceleration sensor 146 is electrically connected to the sensor controller 153. The acceleration sensor 146 has a function of determining the inclination of a semiconductor device including the controller IC 115 and generating an electric signal including the information. The sensor controller 153 generates a control signal in receiving the signal of information about the inclination, for example. The control signal is output to the controller 154, for example. Note that a module that determines inclination is not limited to the acceleration sensor 146 and a gyroscope sensor may be used, for example.

Furthermore, the open/close sensor 144, which is effective in the case where the hybrid display device is foldable, is electrically connected to the sensor controller 153. When the hybrid display device is folded and the display unit 110 is not used, the open/close sensor 144 sends a signal to the sensor controller 153 so that power gating of circuits and the like in the controller IC is performed. In the case where the hybrid display device is not foldable, the hybrid display device does not necessarily include the open/close sensor 144.

In the case where the reflective element 10a and the light-emitting element 10b display the same image data, the image processing portion 160 has a function of separately generating image data that the reflective element 10a displays and image data that the light-emitting element 10b displays. In that case, the reflection intensity of the reflective element 10a and the emission intensity of the light-emitting element 10b can be adjusted in response to the brightness of the external light 145 measured using the optical sensor 143 and the sensor controller 153. Here, the adjustment can be referred to as dimming or dimming processing. Note that the processing is performed in the dimming circuit 162, for example.

In the case where the information terminal 5200 is used outside in the daytime on a sunny day, it is not necessary to make the light-emitting element 10b emit light if sufficient luminance can be obtained only with the reflective element 10a. This is because even when the light-emitting element 10b is used to perform display, favorable display cannot be obtained owing to the intensity of external light that exceeds the intensity of light emitted from the light-emitting element 10b. In contrast, in the case where the information terminal 5200 is used at night or in a dark place, display is performed by making the light-emitting element 10b emit light.

In response to the brightness of external light, the image processing portion 160 can generate image data that only the reflective element 10a displays, image data that only the light-emitting element 10b displays, or image data that the reflective element 10a and the light-emitting element 10b display in combination. The information terminal 5200 can perform favorable display even in an environment with bright external light or an environment with weak external light. Furthermore, power consumption can be reduced by making the light-emitting element 10b emit no light or reducing the luminance of the light-emitting element 10b in the environment with bright external light.

Color tone can be corrected by combining the display by the light-emitting element 10b with the display by the reflective element 10a. A function of measuring the color tone of the external light 145 may be added to the optical sensor 143 and the sensor controller 153 to perform such tone correction. For example, in the case where the information terminal 5200 is used in an environment with reddish light at twilight, a blue (B) component is not sufficient only with the display by the reflective element 10a; thus, the color tone can be corrected by making the light-emitting element 10b emit light. Here, the correction can be referred to as color calibration or color calibration processing. In addition, the processing is performed in the color calibration circuit 163.

The data processing circuit 165, which is included in the electronic device of one embodiment of the present invention, has a function of optimizing settings of the luminance and color tone of the electronic device according to the preference of a user of the electronic device. Furthermore, the data processing circuit 165 includes circuits forming a neural network to be described later and has a function of performing supervised learning. Note that the data processing circuit 165, which constitutes a neural network circuit, includes a product-sum operation circuit 165a. By using the neural network, the data processing circuit 165 performs learning with information about external light sensed by the optical sensor 143 and information about inclination determined by the acceleration sensor 146 as learning data and settings of luminance and color tone that suit user's preference as teacher data. After that, a set value corresponding to the luminance and color tone that suit user's preference can be obtained using the information about external light sensed by the optical sensor 143 and the information about inclination determined by the acceleration sensor 146 as input data.

The image processing portion 160 might include another processing circuit such as an RGB-RGBW conversion circuit depending on the specifications of the display unit 110. The RGB-RGBW conversion circuit has a function of converting image data of red, green, and blue (RGB) into image data of red, green, blue, and white (RGBW). That is, in the case where the display unit 110 includes pixels of four colors of RGBW, power consumption can be reduced by displaying a white (W) component in the image data using the white (W) pixel. Note that in the case where the display unit 110 includes pixels of four colors of RGBY, an RGB-RGBY (red, green, blue, and yellow) conversion circuit can be used, for example.

The reflective element 10a and the light-emitting element 10b can display different image data. In general, operation speed of liquid crystal, electronic paper, or the like that can be used as a reflective element is low in many cases (it takes time to display a picture). Thus, a still image to be a background can be displayed by the reflective element 10a and a moving mouse pointer or the like can be displayed by the light-emitting element 10b. In displaying a still image, the information terminal 5200 stops operation of the gate driver or the source driver to terminate rewriting of an image (hereinafter this driving is referred to as idling stop driving or IDS driving), and in displaying a moving image, makes the light-emitting element 10b emit light. This enables the information terminal 5200 to achieve display of a smooth moving image and reduction in power consumption. In that case, the frame memory 151 may be provided with regions for storing image data displayed by the reflective element 10a and image data displayed by the light-emitting element 10b. Particularly in performing IDS driving, a selection transistor of the reflective element 10a preferably has a low off-state current. Furthermore, a selection transistor of the light-emitting element 10b also preferably has a low off-state current. The use of the selection transistor with a low off-state current allows charge (image data) stored in the reflective element 10a (and the light-emitting element 10b) to be held for a long time when the selection transistor is off. This eliminates the necessity of refreshing image data when a still image is displayed, thereby reducing power consumption.

This embodiment can be combined with any of the other embodiments in this specification as appropriate.

Embodiment 3

In this embodiment, a configuration example of circuits of the neural network included in the data processing circuit 165 described in Embodiment 2 will be described.

A neural network is an information processing system modeled on a biological neural network. A computer having higher performance than a conventional Neumann computer is expected to be provided by utilizing the neural network, and in these years, a variety of researches on a neural network formed using an electronic circuit have been carried out.

In the neural network, units which resemble neurons are connected to each other through units which resemble synapses. By changing the connection strength, a variety of input patterns are learned, and pattern recognition, associative storage, or the like can be performed at high speed.

For example, a product-sum operation circuit described in this embodiment is used as a feature extraction filter for convolution or a fully connected arithmetic circuit, whereby the feature amount can be extracted using a convolutional neural network (CNN). Note that weight coefficients of the feature extraction filter can be set using random numbers. Thus, the feature amount can be extracted even in the case where data obtained by the optical sensor 143 (or the optical sensor 5225X or the optical sensor 5225Y) is not data indicating a peak of external light depending on the incident angle thereof.

<Hierarchical Neural Network>

A hierarchical neural network will be described as a kind of neural networks that can be used for the hybrid display device of one embodiment of the present invention.

Figure 3:
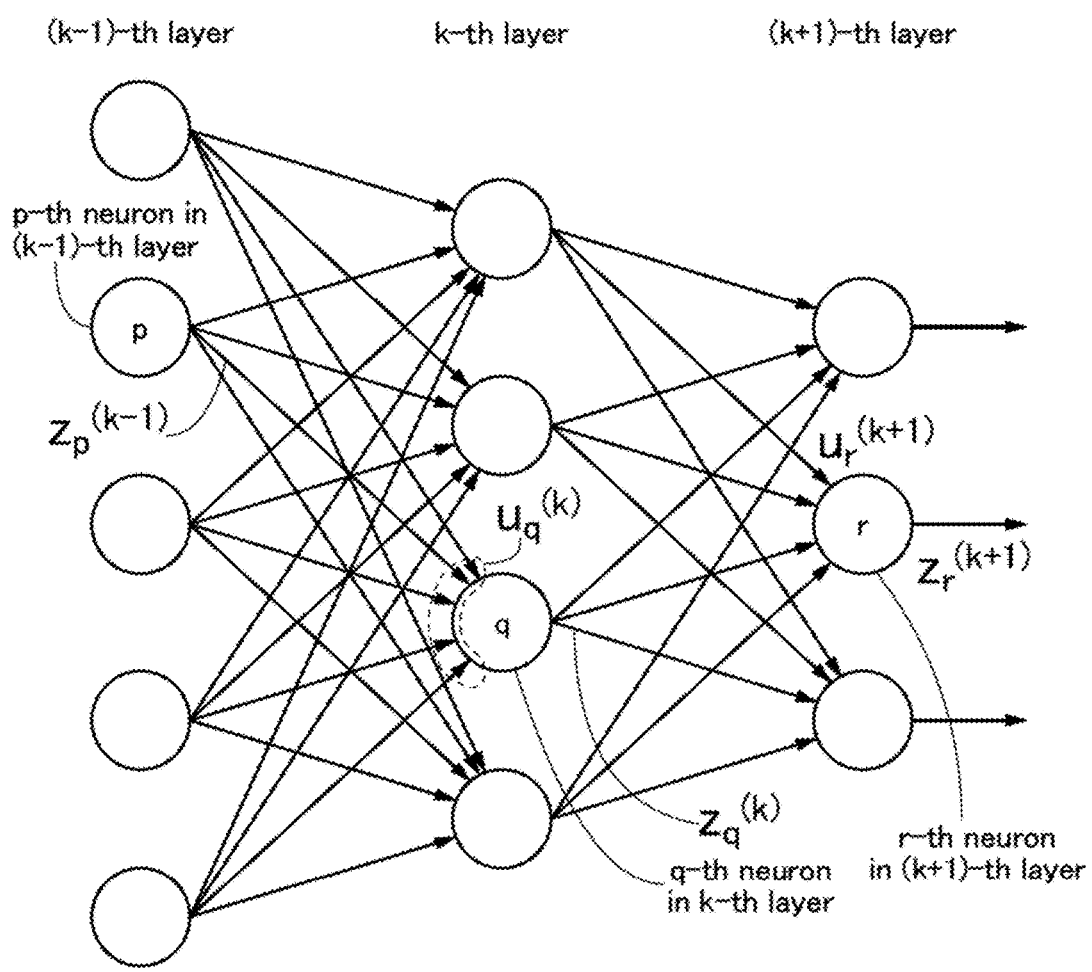
FIG. 3 illustrates an example of a hierarchical neural network.

FIG. 3 is a diagram showing an example of a hierarchical neural network. A (k−1)-th layer (here, k is an integer greater than or equal to 2) includes P neurons (here, P is an integer greater than or equal to 1). A k-th layer includes Q neurons (here, Q is an integer greater than or equal to 1). A (k+1)-th layer includes R neurons (here, R is an integer greater than or equal to 1).

The product of an output signal $z_p^{(k-1)}$ of the p-th neuron (here, p is an integer greater than or equal to 1 and less than or equal to P) in the (k−1)-th layer and a weight coefficient $w_{qp}^{(k)}$ is input to the q-th neuron (here, q is an integer greater than or equal to 1 and less than or equal to Q) in the k-th layer. The product of an output signal $z_q^{(k)}$ of the q-th neuron in the k-th layer and a weight coefficient $w_{rq}^{(k+1)}$ is input to the r-th neuron (here, r is an integer greater than or equal to 1 and less than or equal to R) in the (k+1)-th layer. The output signal of the r-th neuron in the (k+1)-th layer is $z_r^{(k+1)}$.

In this case, the summation $u_q^{(k)}$ of signals input to the q-th neuron in the k-th layer is expressed by the following formula.

[Formula 1]

$$u_q^{(k)} \Sigma w_{qp}^{(k)} z_p^{(k-1)} \quad (D1)$$

The output signal $z_q^{(k)}$ from the q-th neuron in the k-th layer is expressed by the following formula.

[Formula 2]

$$z_q^{(k)} = f(u_q^{(k)}) \quad (D2)$$

A function $f(U_q^{(k)})$ is an activation function. A step function, a linear ramp function, a sigmoid function, or the like can be used as the function $f(u_q^{(k)})$. Product-sum operation of Formula (D1) can be performed with a product-sum operation circuit (semiconductor device 700) to be described later. Formula (D2) can be calculated with a circuit 411 illustrated in FIG. 6A, for example.

Note that the activation function may be the same among all neurons or may be different among neurons. Furthermore, the activation function in one layer may be the same as or different from that in another layer.

Here, a hierarchical neural network including L layers (here, L is an integer greater than or equal to 3) in total shown in FIG. 4 will be described (that is, here, k is an integer greater than or equal to 2 and less than or equal to (L−1)). A first layer is an input layer of the hierarchical neural network, an L-th layer is an output layer of the hierarchical neural network, and second to (L−1)-th layers are hidden layers of the hierarchical neural network.

The first layer (input layer) includes P neurons, the k-th layer (hidden layer) includes Q[k] neurons (here, Q[k] is an integer greater than or equal to 1), and the L-th layer (output layer) includes R neurons.

An output signal of the s[1]-th neuron in the first layer (here, s[1] is an integer greater than or equal to 1 and less than or equal to P) is $z_{s[1]}^{(1)}$, an output signal of the s[k]-th neuron in the k-th layer (here, s[k] is an integer greater than or equal to 1 and less than or equal to Q[k]) is $z_{s[k]}^{(k)}$, and an output signal of the s[L]-th neuron in the L-th layer (here, s[L] is an integer greater than or equal to 1 and less than or equal to R) is $z_{s[L]}^{(L)}$.

The product $u_{s[k]}^{(k)}$ of an output signal $z_{s[k-1]}^{(k-1)}$ of the s[k−1]-th neuron in the (k−1)-th layer and a weight coefficient $w_{s[k]s[k-1]}^{(k)}$ (here, s[k−1] is an integer greater than or equal to 1 and less than or equal to Q[k−1]) is input to the s[k]-th neuron in the k-th layer. The product $u_{s[L]}^{(L)}$ of an output signal $z_{s[L-1]}^{(L-1)}$ of the s[L−1]-th neuron in the (L−1)-th layer and a weight coefficient $w_{s[L]s[L-1]}^{(L)}$ (here, s[L−1] is an integer greater than or equal to 1 and less than or equal to Q[L−1]) is input to the s[L]-th neuron in the L-th layer.

Next, supervised learning will be described. Supervised learning refers to operation of updating all weight coefficients of a hierarchical neural network on the basis of an output result and a desired result (also referred to as teacher data or a teacher signal in some cases) when the output result and the desired result differ from each other, in functions of the above-described hierarchical neural network.

Figure 5:
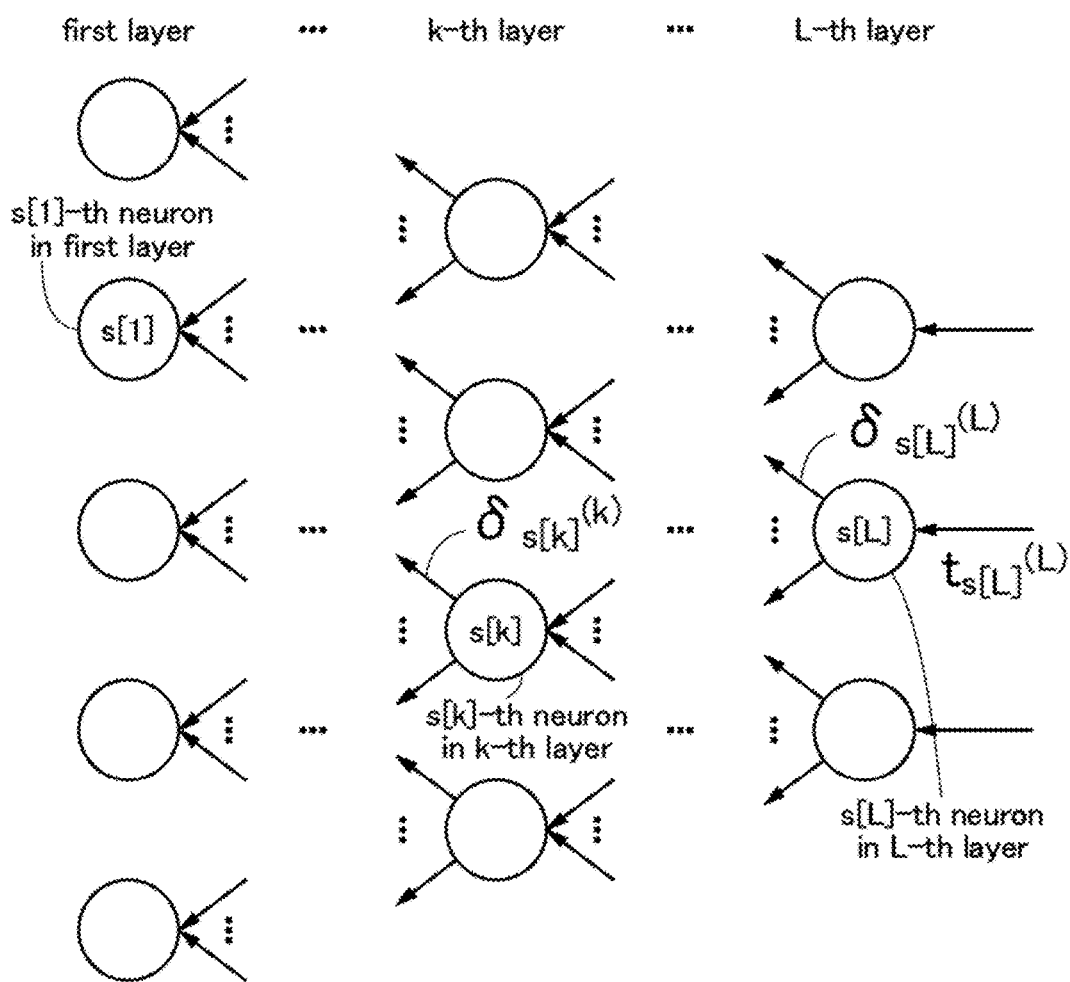
FIG. 5 illustrates an example of a hierarchical neural network.

A learning method using backpropagation will be described as a specific example of supervised learning. FIG. 5 is a diagram illustrating a learning method using backpropagation. Backpropagation is a method for changing a weight coefficient so that an error between an output of a hierarchical neural network and teacher data becomes small.

For example, assume that input data is input to the s[1]-th neuron in the first layer and output data $z_{s[L]}^{(L)}$ is output from the s[L]-th neuron in the L-th layer. Here, error energy E can be expressed using output data $z_{s[L]}^{(L)}$ and a teacher signal $t_{s[L]}^{(L)}$, when a teacher signal for the output data $z_{s[L]}^{(L)}$ is $t_{s[L]}^{(L)}$.

The update amount of a weight coefficient $w_{s[k]s[k-1]}^{(k)}$ of the s[k]-th neuron in the k-th layer with respect to the error energy E is set to $\partial E/\partial w_{s[k]s[k-1]}^{(k)}$, whereby the weight coefficient can be updated. Here, when an error $\delta_{s[k]}^{(k)}$ of the output value $z_{s[k]}^{(k)}$ of the s[k]-th neuron in the k-th layer is defined as $\partial E/\partial u_{s[k]}^{(k)}$, $\delta_{s[k]}^{(k)}$ and $\partial E/\partial w_{s[k]s[k-1]}^{(k)}$ can be expressed by the following respective formulae.

[Formula 3]

$$\delta_{s[k]}^{(k)} = \sum_{s[k+1]} \delta_{s[k+1]}^{(k+1)} \cdot w_{s[k+1]s[k]}^{(k+1)} \cdot f'(u_{s[k]}^{(k)}) \quad (D3)$$

[Formula 4]

$$\frac{\partial E}{\partial w_{s[k]s[k-1]}^{(k)}} = \delta_{s[k]}^{(k)} \cdot z_{s[k-1]}^{(k-1)} \quad (D4)$$

A function $f(u_{s[k]}^{(s)})$ is the derivative of an activation function. Formula (D3) can be calculated with a circuit 413 illustrated in FIG. 6B, for example. Formula (D4) can be calculated with a circuit 414 illustrated in FIG. 6C, for example. The derivative of an output function can be obtained by connecting an arithmetic circuit that can execute a desired derivative to an output terminal of an operational amplifier, for example.

For example, $\Sigma \delta_{s[k+1]}^{(k+1)} \cdot w_{s[k+1] \cdot s[k]}^{(k+1)}$ in Formula (D3) can be calculated with a product-sum operation circuit (semiconductor device 700) to be described later.

Here, when the (k+1)-th layer is an output layer, or the L-th layer, $\delta_{s[L]}^{(L)}$ and $\partial E/\partial w_{s[L]s[L-1]}^{(L)}$ can be expressed by the following respective formulae.

[Formula 5]

$$\delta_{s[L]}^{(L)} = (z_{s[L]}^{(L)} - t_{s[L]}) \cdot f'(u_{s[L]}^{(L)}) \quad (D5)$$

[Formula 6]

$$\frac{\partial E}{\partial w_{s[L]s[L-1]}^{(L)}} = \delta_{s[L]}^{(L)} \cdot z_{s[L-1]}^{(L-1)} \quad (D6)$$

Figure 6A:
FIGS. 6A to 6D each illustrate a configuration example of a circuit.
Figure 6B:
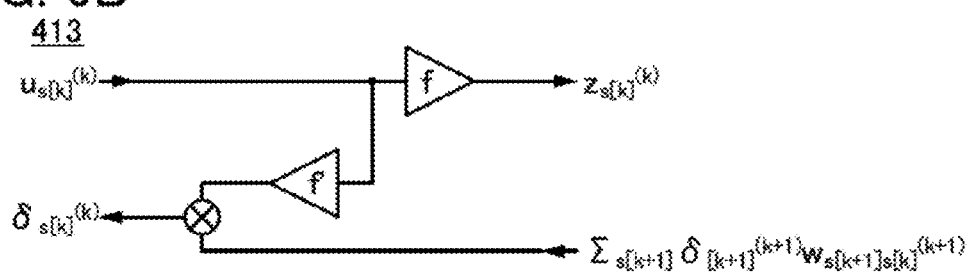
Figure 6C:
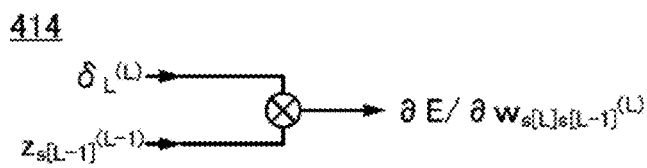
Figure 6D:
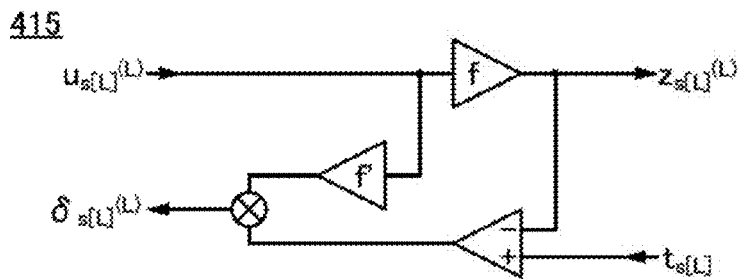

Furthermore, Formula (D5) can be calculated with a circuit 415 illustrated in FIG. 6D. Formula (D6) can be calculated with the circuit 414 illustrated in FIG. 6C.

That is to say, the errors $\delta_{s[k]}^{(k)}$ and $\delta_{s[L]}^{(L)}$ of all neuron circuits can be calculated by Formulae (D1) to (D6). Note that the update amounts of the weight coefficients are set on the basis of the errors $\delta_{s[k]}^{(k)}$ and $\delta_{s[L]}^{(L)}$, predetermined parameters, and the like.

As described above, by using the circuits illustrated in FIGS. 6A to 6D and the product-sum operation circuit (semiconductor device 700), calculation of the hierarchical neural network using supervised learning can be performed.

<Example of Circuit for Constructing Hierarchical Neural Network>

Next, a configuration example of a product-sum operation circuit for constructing the above-described hierarchical neural network will be described.

Figure 7:
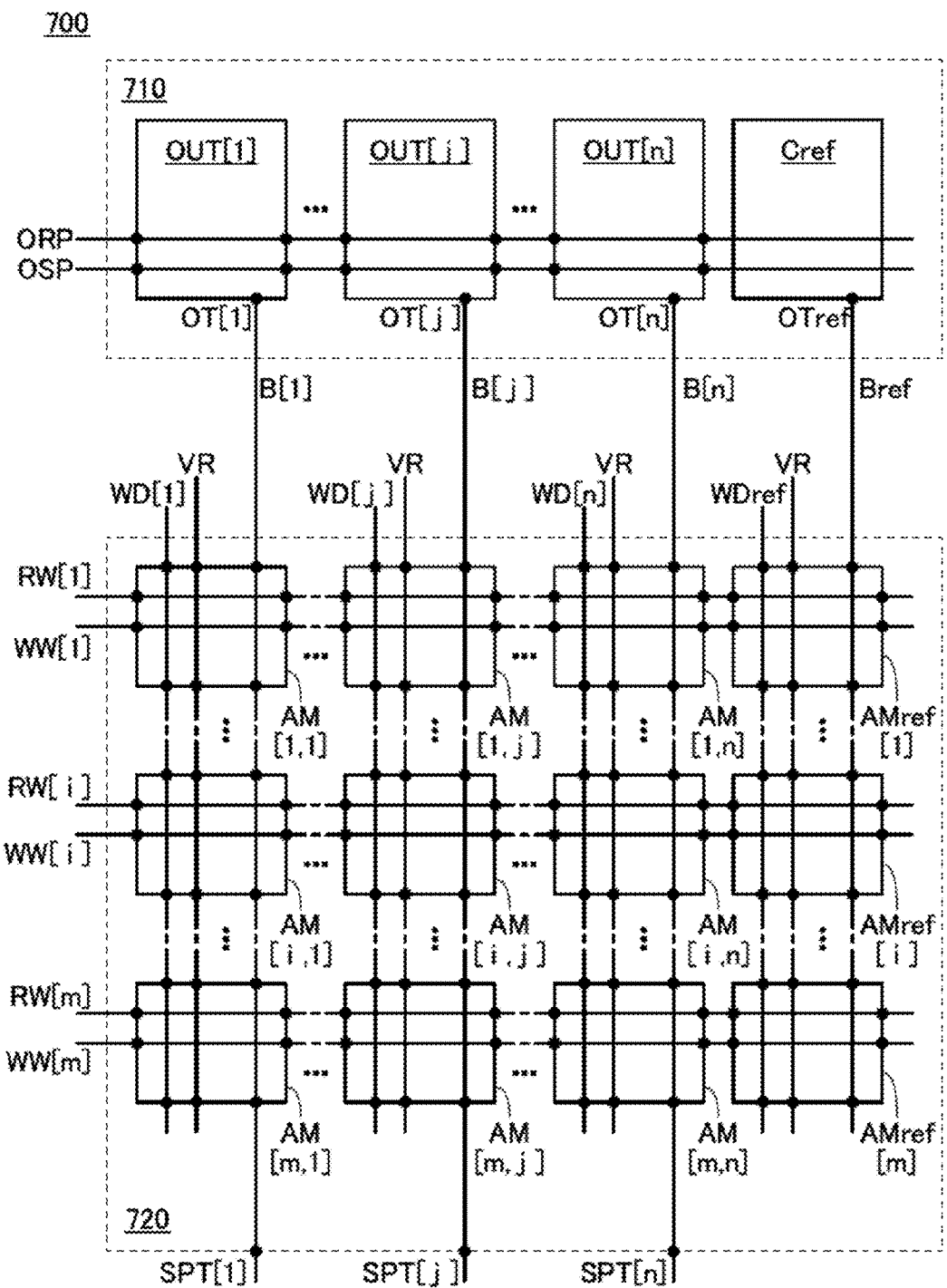
FIG. 7 illustrates an example of a semiconductor device.

FIG. 7 is a block diagram of the semiconductor device 700 that serves as a product-sum operation circuit. The semiconductor device 700 includes an offset circuit 710 and a memory cell array 720.

The offset circuit 710 includes column output circuits OUT[1] to OUT[n] (here, n is an integer greater than or equal to 1) and a reference column output circuit Cref.

In the memory cell array 720, m (here, m is an integer greater than or equal to 1) memory cells AM are arranged in the column direction and n memory cells AM are arranged in the row direction; that is, m×n memory cells AM are provided. In addition, m memory cells AMref are arranged in the column direction. The total number of the memory cells AM and the memory cells AMref arranged in a matrix in the memory cell array 720 is m×(n+1). In particular, in the memory cell array 720 in FIG. 7, the memory cell AM positioned in an i-th row and a j-th column is denoted by a memory cell AMP[i,j] (here, i is an integer greater than or equal to 1 and less than or equal to m, and j is an integer greater than or equal to 1 and less than or equal to n), and the memory cell AMref positioned in the i-th row is denoted by a memory cell AMref[i].

The memory cell AM holds a potential corresponding to first analog data, and the memory cell AMref holds a predetermined potential. Note that the predetermined potential is a potential necessary for the product-sum operation, and in this specification, data corresponding to this predetermined potential is referred to as reference analog data in some cases.

The memory cell array 720 includes output terminals SPT[1] to SPT[n].

The column output circuit OUT[j] includes an output terminal OT[j], and the reference column output circuit Cref includes an output terminal OTref.

A wiring ORP is electrically connected to the column output circuits OUT[1] to OUT[n], and a wiring OSP is electrically connected to the column output circuits OUT[1] to OUT[n]. The wiring ORP and the wiring OSP are wirings for supplying a control signal to the offset circuit 710.

An output terminal SPT[j] of the memory cell array 720 is electrically connected to a wiring B[j].

The output terminal OT[j] of the column output circuit OUT[j] is electrically connected to the wiring B[j].

The output terminal OTref of the reference column output circuit Cref is electrically connected to a wiring Bref.

The memory cell AMP[i,j] is electrically connected to a wiring RW[i], a wiring WW[i], a wiring WD[j], the wiring B[j], and a wiring VR.

The memory cell AMref[i] is electrically connected to the wiring RW[i], the wiring WW[i], a wiring WDref, the wiring Bref, and the wiring VR.

The wiring WW[i] functions as a wiring for supplying a selection signal to memory cells AM[i,1] to AM[i,n] and the memory cell AMref[i]. The wiring RW[i] functions as a wiring for supplying either a reference potential or a potential corresponding to the second analog data to the memory cells AM[i,1] to AM[i,n] and the memory cell AMref[i]. The wiring WD[j] functions as a wiring for supplying writing data to the memory cells AM in the j-th column. The wiring VR functions as a wiring for supplying a predetermined potential to the memory cells AM or the memory cells AMref when data is read out from the memory cells AM or the memory cells AMref.

The wiring B[j] functions as a wiring for supplying a signal from the column output circuit OUT[j] to the memory cells AM in the j-th column in the memory cell array 720.

The wiring Bref functions as a wiring for supplying a signal from the reference column output circuit Cref to memory cells AMref[1] to AMref[m].

In the semiconductor device 700 in FIG. 7, only the following components are shown: the offset circuit 710; the memory cell array 720; the column output circuit OUT[1]; the column output circuit OUT[j]; the column output circuit OUT[n]; the reference column output circuit Cref; an output terminal OT[1]; the output terminal OT[j]; an output terminal OT[n]; the output terminal OTref; the output terminal SPT[1]; the output terminal SPT[j]; the output terminal SPT[n]; a memory cell AM[1,1]; the memory cell AM[i,1]; a memory cell AM[m,1]; a memory cell AM[1,i]; the memory cell AM[i,j]; a memory cell AM[m,j]; a memory cell AM[1,n]; the memory cell AM[i,n]; a memory cell AM[m,n]; the memory cell AMref[1]; the memory cell AMref[i]; the memory cell AMref[m]; the wiring OSP; the wiring ORP; a wiring B[1]; the wiring B[j]; a wiring B[n]; the wiring Bref; a wiring WD[1]; the wiring WD[j]; a wiring WD[n]; the wiring WDref; the wiring VR; a wiring RW[1]; the wiring RW[i]; a wiring RW[m]; a wiring WW[1]; the wiring WW[i]; and a wiring WW[m]. Other circuits, wirings, elements, and reference numerals thereof are not shown.

Note that a configuration of one embodiment of the present invention is not limited to the configuration of the semiconductor device 700 illustrated in FIG. 7. Depending on circumstances or conditions or as needed, the configuration of the semiconductor device 700 can be changed. For example, depending on a circuit configuration of the semiconductor device 700, one wiring may be provided to serve as the wiring WD[j] and the wiring VR. Alternatively, depending on a circuit configuration of the semiconductor device 700, one wiring may be provided to serve as the wiring ORP and the wiring OSP.

<<Offset Circuit 710>>

Figure 8:
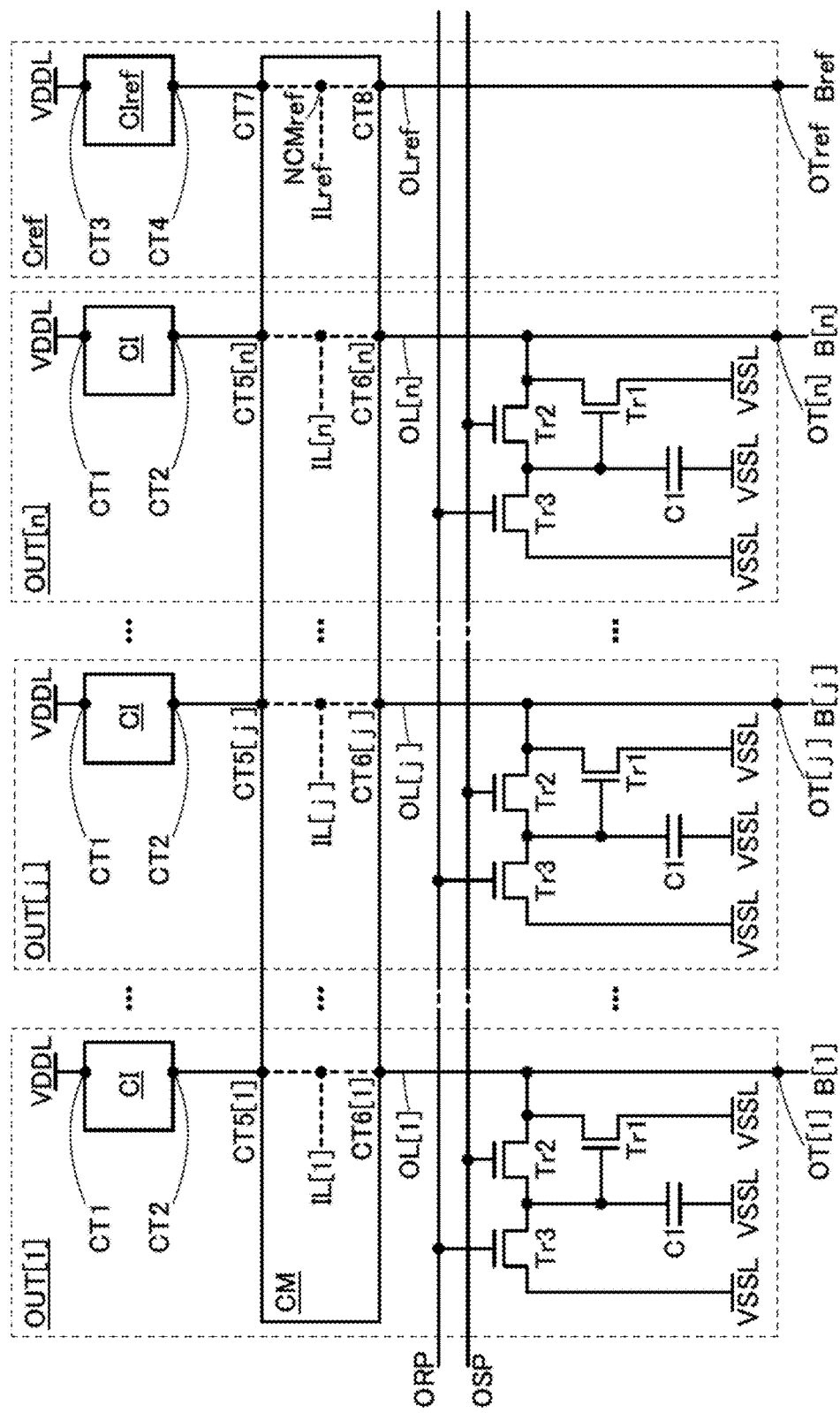
FIG. 8 is a circuit diagram illustrating an example of an offset circuit in the semiconductor device in FIG. 7.

Next, an example of a circuit configuration that can be applied to the offset circuit 710 will be described. FIG. 8 shows an offset circuit 711 as an example of the offset circuit 710.

The offset circuit 711 is electrically connected to a wiring VDDL and a wiring VSSL for supplying a power supply voltage. Specifically, each of the column output circuits OUT[1] to OUT[n] is electrically connected to the wiring VDDL and the wiring VSSL, and the reference column output circuit Cref is electrically connected to the wiring VDDL. Note that a current mirror circuit CM to be described later is electrically connected to the wiring VSSL in some cases. The wiring VDDL supplies the high-level potential. The wiring VSSL supplies the low-level potential.

The circuit configuration of the inside of the column output circuit OUT[j] will be described below. The column output circuit OUT[j] includes a constant current circuit CI, transistors Tr1 to Tr3, a capacitor C1, and a wiring OL[j].

The current mirror circuit CM is shared between the column output circuits OUT[1] to OUT[n] and the reference column output circuit Cref.

The constant current circuit CI includes a terminal CT1 and a terminal CT2. The terminal CT1 functions as an input terminal of the constant current circuit CI, and the terminal CT2 functions as an output terminal of the constant current circuit CI. The current mirror circuit CM shared between the column output circuits OUT[1] to OUT[n] and the reference column output circuit Cref includes terminals CT5[1] to CT5[n], terminals CT6[1] to CT6[n], a terminal CT7, and a terminal CT8.

The constant current circuit CI has a function of keeping the amount of current flowing from the terminal CT1 to the terminal CT2 constant.

In the column output circuit OUT[j], a first terminal of the transistor Tr1 is electrically connected to the wiring OL[j], a second terminal of the transistor Tr1 is electrically connected to the wiring VSSL, and a gate of the transistor Tr1 is electrically connected to a first terminal of the capacitor C1. A first terminal of a transistor Tr2 is electrically connected to the wiring OL[j], a second terminal of the transistor Tr2 is electrically connected to the first terminal of the capacitor C1, and a gate of the transistor Tr2 is electrically connected to the wiring OSP. A first terminal of the transistor Tr3 is electrically connected to the first terminal of the capacitor C1, a second terminal of the transistor Tr3 is electrically connected to the wiring VSSL, and a gate of the transistor Tr3 is electrically connected to the wiring ORP. A second terminal of the capacitor C1 is electrically connected to the wiring VSSL.

Note that each of the transistors Tr1 to Tr3 is preferably an OS transistor. In addition, a channel formation region in each of the transistors Tr1 to Tr3 is preferably formed using an oxide containing at least one of indium, zinc, and the element M (the element M is aluminum, gallium, yttrium, or tin). Especially, a CAC-OS which will be described in Embodiment 14 is preferably used as an oxide semiconductor in the OS transistor.

The OS transistor has a characteristic of an extremely low off-state current. Thus, when the OS transistor is in an off state, the amount of leakage current flowing between a source and a drain can be extremely small. With use of OS transistors as the transistors Tr1 to Tr3, the leakage current of each of the transistors Tr1 to Tr3 can be suppressed, which enables the product-sum operation circuit to have high calculation accuracy in some cases.

In the column output circuit OUT[j], the terminal CT1 of the constant current circuit CI is electrically connected to the wiring VDDL, and the terminal CT2 of the constant current circuit CI is electrically connected to the terminal CT5[j] of the current mirror circuit CM. The terminal CT6[j] of the current mirror circuit CM is electrically connected to the output terminal OT[j].

Note that the wiring OL[j] is a wiring for electrically connecting the terminal CT2 of the constant current circuit CI to the output terminal OT[j] through the terminal CT5[j] and the terminal CT6[j] of the current mirror circuit CM.

Next, the reference column output circuit Cref will be described. The reference column output circuit Cref includes a constant current circuit CIref and a wiring OLref. As described above, the reference column output circuit Cref includes the current mirror circuit CM that is shared with the column output circuits OUT[1] to OUT[n].

The constant current circuit CIref includes a terminal CT3 and a terminal CT4. The terminal CT3 functions as an input terminal of the constant current circuit CIref, and the terminal CT4 functions as an output terminal of the constant current circuit Chef.

The constant current circuit CIref has a function of keeping the amount of current flowing from the terminal CT3 to the terminal CT4 constant.

In the reference column output circuit Cref, the terminal CT3 of the constant current circuit CIref is electrically connected to the wiring VDDL, and the terminal CT4 of the constant current circuit CIref is electrically connected to the terminal CT7 of the current mirror circuit CM. The terminal CT8 of the current mirror circuit CM is electrically connected to the output terminal OTref.

The wiring OLref is a wiring for electrically connecting the terminal CT4 of the constant current circuit CIref to the output terminal OTref through the terminal CT7 and the terminal CT8 of the current mirror circuit CM.

In the current mirror circuit CM, the terminal CT5[j] is electrically connected to the terminal CT6[j], and the terminal CT7 is electrically connected to the terminal CT8. In addition, a wiring IL[j] is electrically connected between the terminal CT5[j] and the terminal CT6[j], and a wiring ILref is electrically connected between the terminal CT7 and the terminal CT8. Furthermore, a connection portion of the wiring ILref between the terminal CT7 and the terminal CT8 is a node NCMref. The current mirror circuit CM has a function of equalizing the amount of current flowing in the wiring ILref and the amount of current flowing in each of wirings IL[1] to IL[n] with reference to the potential at the node NCMref.

In the offset circuit 711 in FIG. 8, only the following components are shown: the column output circuit OUT[1]; the column output circuit OUT[j]; the column output circuit OUT[n]; the reference column output circuit Cref; the constant current circuit CI; the constant current circuit Chef; the current mirror circuit CM; the output terminal OT[1]; the output terminal OT[j]; the output terminal OT[n]; the output terminal OTref; the terminal CT1; the terminal CT2; the terminal CT3; the terminal CT4; the terminal CT5[1]; the terminal CT5[j]; the terminal CT5[n]; the terminal CT6[1]; the terminal CT6[j]; the terminal CT6[n]; the terminal CT7; the terminal CT8; the transistor Tr1; the transistor Tr2; the transistor Tr3; the capacitor C1; a wiring OL[1]; the wiring OL[j]; a wiring OL[n]; the wiring OLref; the wiring ORP; the wiring OSP; the wiring B[j]; the wiring B[j]; the wiring B[n]; the wiring Bref; the wiring IL[1]; the wiring IL[j]; the wiring IL[n]; the wiring ILref; the node NCMref; the wiring VDDL; and the wiring VSSL. Other circuits, wirings, elements, and reference numerals thereof are not shown.

Note that a configuration of one embodiment of the present invention is not limited to the configuration of the offset circuit 711 illustrated in FIG. 8. Depending on circumstances or conditions or as needed, the configuration of the offset circuit 711 can be changed.

[Constant Current Circuits CI and CIref]

Next, an example of internal configurations of the constant current circuit CI and the constant current circuit CIref will be described.

Figure 9:
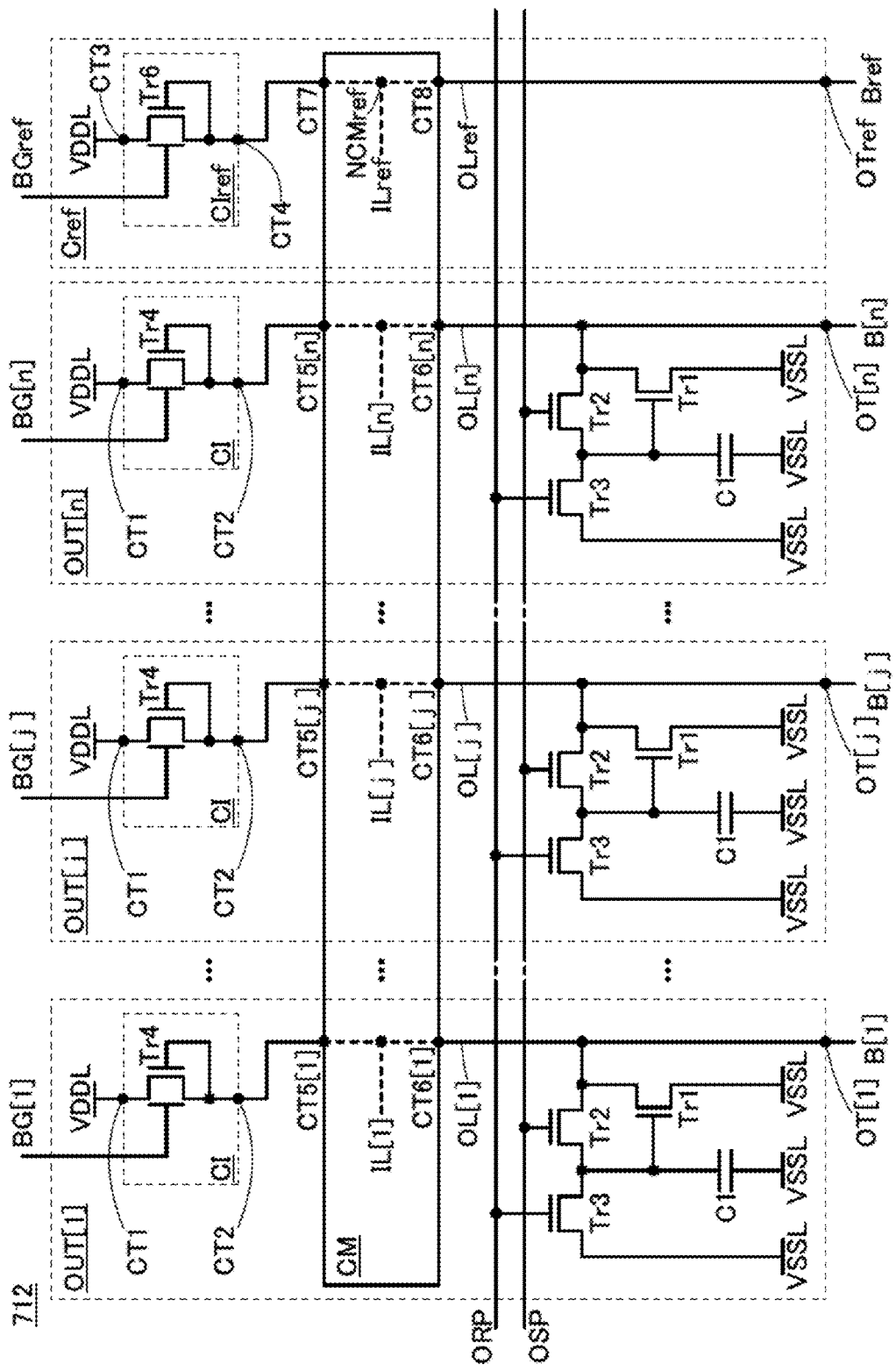
FIG. 9 is a circuit diagram illustrating an example of an offset circuit in the semiconductor device in FIG. 7.

An offset circuit 712 shown in FIG. 9 is a circuit diagram showing an example of internal configurations of the constant current circuit CI and the constant current circuit CIref included in the offset circuit 711 shown in FIG. 8.

In the column output circuit OUT[j], the constant current circuit CI includes a transistor Tr4. The transistor Tr4 has a dual-gate structure including a first gate and a second gate.

Note that in this specification, the first gate in the transistor having a dual-gate structure indicates a front gate, and a term "first gate" can be replaced with a simple term "gate". Besides, the second gate in the transistor having a dual-gate structure indicates a back gate, and a term "second gate" can be replaced with a term "back gate".

A first terminal of the transistor Tr4 is electrically connected to the terminal CT1 of the constant current circuit CI. A second terminal of the transistor Tr4 is electrically connected to the terminal CT2 of the constant current circuit CI. A gate of the transistor Tr4 is electrically connected to the terminal CT2 of the constant current circuit CI. A back gate of the transistor Tr4 is electrically connected to a wiring BG[j].

In the reference column output circuit Cref, the constant current circuit CIref includes a transistor Tr6. The transistor Tr6 has a dual-gate structure including a gate and a back gate.

A first terminal of the transistor Tr6 is electrically connected to the terminal CT3 of the constant current circuit Chef. A second terminal of the transistor Tr6 is electrically connected to the terminal CT4 of the constant current circuit Chef. The gate of the transistor Tr6 is electrically connected to the terminal CT4 of the constant current circuit CIref. The back gate of the transistor Tr6 is electrically connected to a wiring BGref.

In the above connection structure, the threshold voltages of the transistor Tr4 and the transistor Tr6 can be controlled by supplying a potential to the wiring BG[j] and the wiring BGref.

Note that each of the transistor Tr4 and the transistor Tr6 is preferably an OS transistor. In addition, a channel formation region in each of the transistors Tr4 and Tr6 is preferably formed using an oxide containing at least one of indium, zinc, and the element M (the element M is aluminum, gallium, yttrium, or tin). Especially, the CAC-OS which will be described in Embodiment 14 is preferably used as an oxide semiconductor in the OS transistor.

With use of the OS transistors as the transistors Tr4 and Tr6, the leakage current of each of the transistors Tr4 and Tr6 can be suppressed, which enables the product-sum operation circuit to have high calculation accuracy in some cases.

In the offset circuit 712 shown in FIG. 9, only the following components are shown: the column output circuit OUT[1]; the column output circuit OUT[j]; the column output circuit OUT[n]; the reference column output circuit Cref; the constant current circuit CI; the constant current circuit Chef; the current mirror circuit CM; the output terminal OT[1]; the output terminal OT[j]; the output terminal OT[n]; the output terminal OTref; the terminal CT1; the terminal CT2; the terminal CT3; the terminal CT4; the terminal CT5[1]; the terminal CT5[j]; the terminal CT5[n]; the terminal CT6[1]; the terminal CT6[j]; the terminal CT6[n]; the terminal CT7; the terminal CTB; the transistor Tr1; the transistor Tr2; the transistor Tr3; the transistor Tr4; the transistor Tr6; the capacitor C1; the wiring OL[1]; the wiring OL[j]; the wiring OL[n]; the wiring OLref; the wiring ORP; the wiring OSP; the wiring B[j]; the wiring B[j]; the wiring B[n]; the wiring Bref; a wiring BG[1]; the wiring BG[j]; a wiring BG[n]; the wiring BGref; the wiring IL[1]; the wiring IL[j]; the wiring IL[n]; the wiring ILref; the node NCMref; the wiring VDDL; and the wiring VSSL. Other circuits, wirings, elements, and reference numerals thereof are not shown.

[Current Mirror Circuit CM]

Next, an internal configuration example of the current mirror circuit CM will be described.

Figure 10:
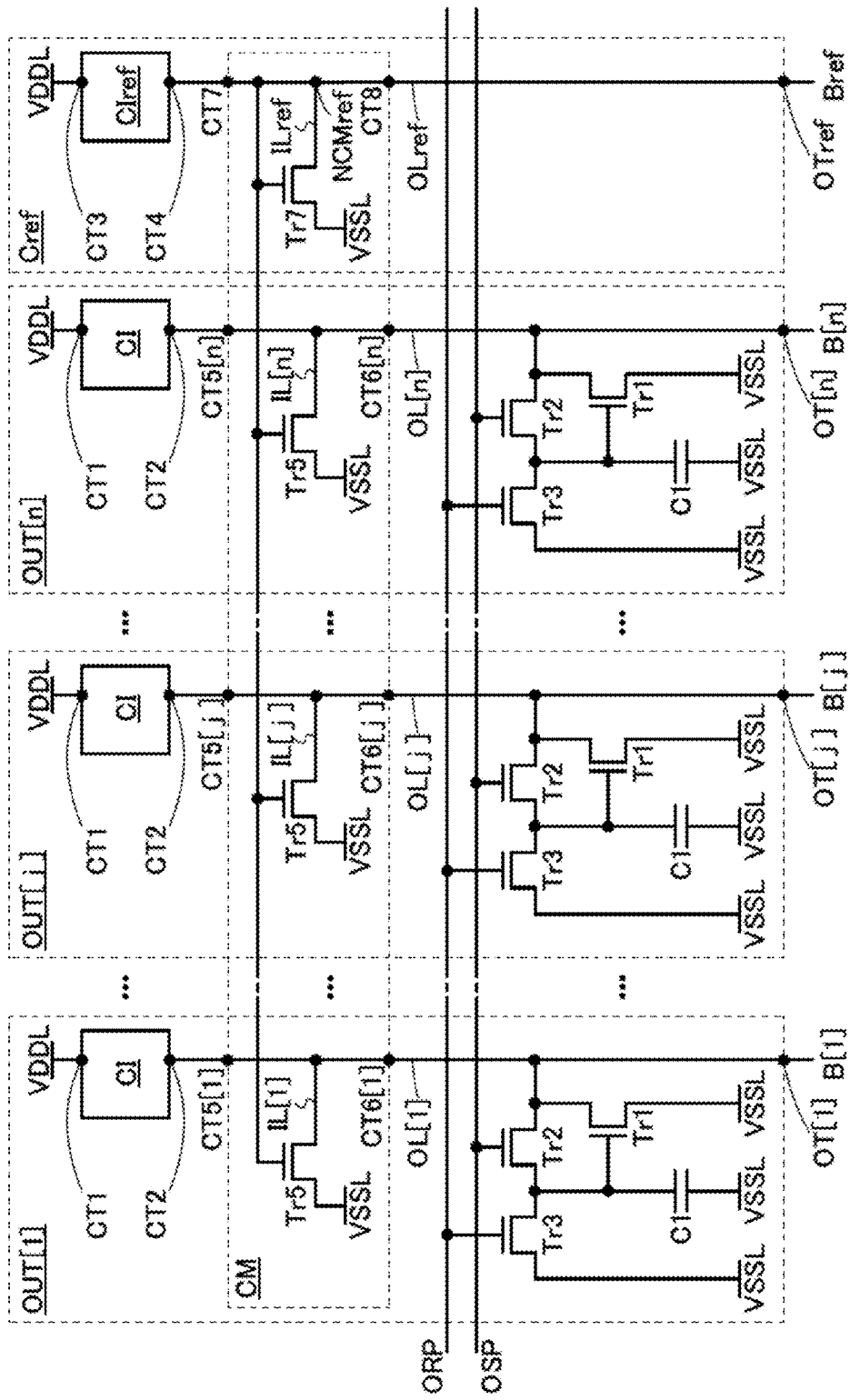
FIG. 10 is a circuit diagram illustrating an example of an offset circuit in the semiconductor device in FIG. 7.

An offset circuit 713 shown in FIG. 10 is a circuit diagram of an internal configuration example of the current mirror circuit CM included in the offset circuit 711 shown in FIG. 8.

In the current mirror circuit CM, each of the column output circuits OUT[1] to OUT[n] includes a transistor Tr5, and the reference column output circuit Cref includes a transistor Tr7.

A first terminal of the transistor Tr5 in the column output circuit OUT[j] is electrically connected to the terminal CT5[j] and the terminal CT6[j] of the current mirror circuit CM. A second terminal of the transistor Tr5 in the column output circuit OUT[j] is electrically connected to the wiring VSSL. A gate of the transistor Tr5 in the column output circuit OUT[j] is electrically connected to the terminal CT7 and the terminal CT8 in the current mirror circuit CM.

A first terminal of the transistor Tr7 in the reference column output circuit Cref is electrically connected to the terminal CT7 and the terminal CT8 of the current mirror circuit CM. A second terminal of the transistor Tr7 in the reference column output circuit Cref is electrically connected to the wiring VSSL. A gate of the transistor Tr7 in the reference column output circuit Cref is electrically connected to the terminal CT7 and the terminal CT8 of the current mirror circuit CM.

In the above connection structure, the potential of the node NCMref can be supplied to the gate of the transistor Tr5 in each of the column output circuits OUT[1] to OUT[n], and the amount of current flowing between a source and a drain of the transistor Tr7 can be equalized to the amount of current flowing between a source and a drain of the transistor Tr5 in each of the column output circuits OUT[1] to OUT[n].

Note that each of the transistor Tr5 and the transistor Tr7 is preferably an OS transistor. In addition, a channel formation region in each of the transistors Tr5 and Tr7 is preferably formed using an oxide containing at least one of indium, zinc, and the element M (the element M is aluminum, gallium, yttrium, or tin). Especially, the CAC-OS which will be described in Embodiment 14 is preferably used as an oxide semiconductor in the OS transistor.

With use of the OS transistors as the transistors Tr5 and Tr7, the leakage current of each of the transistors Tr5 and Tr7 can be suppressed, which enables the product-sum operation circuit to have high calculation accuracy in some cases.

In the offset circuit 713 shown in FIG. 10, only the following components are shown: the column output circuit OUT[1]; the column output circuit OUT[j]; the column output circuit OUT[n]; the reference column output circuit Cref; the constant current circuit CI; the constant current circuit Chef; the current mirror circuit CM; the output terminal OT[1]; the output terminal OT[j]; the output terminal OT[n]; the output terminal OTref; the terminal CT1; the terminal CT2; the terminal CT3; the terminal CT4; the terminal CT5[1]; the terminal CT5[j]; the terminal CT5[n]; the terminal CT6[1]; the terminal CT6[j]; the terminal CT6[n]; the terminal CT7; the terminal CTB; the transistor Tr1; the transistor Tr2; the transistor Tr3; the transistor Try; the transistor Tr7; the capacitor C1; the wiring OL[1]; the wiring OL[j]; the wiring OL[n]; the wiring OLref; the wiring ORP; the wiring OSP; the wiring B[j]; the wiring B[j]; the wiring B[n]; the wiring Bref; the wiring IL[1]; the wiring IL[j]; the wiring IL[n]; the wiring ILref; the node NCMref; the wiring VDDL; and the wiring VSSL. Other circuits, wirings, elements, and reference numerals thereof are not shown.

<<Memory Cell Array 720>>

Figure 11:
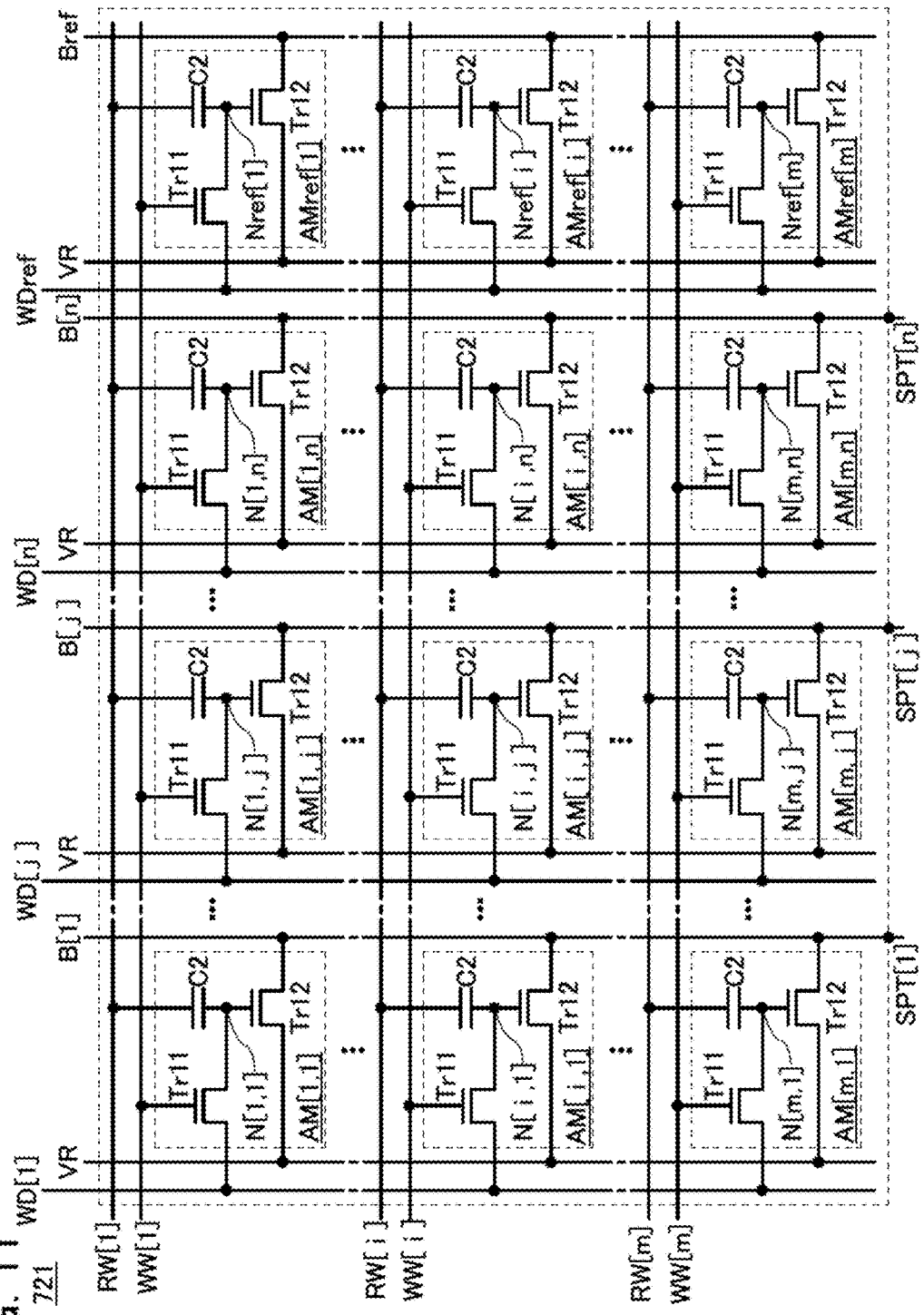
FIG. 11 is a circuit diagram illustrating an example of a memory cell array in the semiconductor device in FIG. 7.

Next, a circuit configuration example that can be employed in the memory cell array 720 will be described. FIG. 11 shows a memory cell array 721 as an example of the memory cell array 720.

The memory cell array 721 includes the memory cells AM and the memory cells AMref. Each of the memory cells AM included in the memory cell array 721 includes a transistor Tr11, a transistor Tr12, and a capacitor C2. The memory cells AMref[1] to AMref[m] each include the transistor Tr11, the transistor Tr12, and the capacitor C2.

For the connection structure in the memory cell array 721, the description will be made with a focus on the memory cell AM[i,j]. A first terminal of the transistor Tr11 is electrically connected to a gate of the transistor Tr12 and a first terminal of the capacitor C2. A second terminal of the transistor Tr11 is electrically connected to the wiring WD[j]. A gate of the transistor Tr11 is electrically connected to the wiring WW[i]. A first terminal of the transistor Tr12 is electrically connected to the wiring B[j], and a second terminal of the transistor Tr12 is electrically connected to the wiring VR. A second terminal of the capacitor C2 is electrically connected to the wiring RW[i].

In the memory cell AM[i,j], a connection portion of the first terminal of the transistor Tr11, the gate of the transistor Tr12, and the first terminal of the capacitor C2 is a node N[i,j]. In one embodiment of the present invention, a potential corresponding to the first analog data is held at the node N[i,j].

Next, the description will be made with a focus on the memory cell AMref[i]. The first terminal of the transistor Tr11 is electrically connected to the gate of the transistor Tr12 and the first terminal of the capacitor C2. A second terminal of the transistor Tr11 is electrically connected to the wiring WDref. A gate of the transistor Tr11 is electrically connected to the wiring WW[i]. A first terminal of the transistor Tr12 is electrically connected to the wiring Bref. A second terminal of the transistor Tr12 is electrically connected to the wiring VR. A second terminal of the capacitor C2 is electrically connected to the wiring RW[i].

In the memory cell AMref[i], a connection portion of the first terminal of the transistor Tr11, the gate of the transistor Tr12, and the first terminal of the capacitor C2 is a node Nref[i].

Note that each of the transistor Tr11 and the transistor Tr12 is preferably an OS transistor. In addition, a channel formation region in each of the transistors Tr11 and Tr12 is preferably formed using an oxide containing at least one of indium, zinc, and the element M (the element M is aluminum, gallium, yttrium, or tin). Especially, the CAC-OS which will be described in Embodiment 14 is preferably used as an oxide semiconductor in the OS transistor.

With use of the OS transistors as the transistors Tr11 and Tr12, the leakage current of each of the transistors Tr11 and Tr12 can be suppressed, which enables the product-sum operation circuit to have high calculation accuracy in some cases. Furthermore, with use of the OS transistor as the transistor Tr11, the amount of leakage current from a holding node to a writing word line can be extremely small when the transistor Tr11 is in an off state. In other words, frequency of refresh operation at the holding node can be reduced; thus, power consumption of a semiconductor device can be reduced.

Furthermore, when all of the above-described transistors Tr1 to Tr7, Tr11, and Tr12 are OS transistors, a manufacturing process of the semiconductor device can be shortened. Thus, time needed for manufacturing semiconductor devices can be shortened, and the number of devices manufactured in a certain time period can be increased.

Note that the transistors Tr1, Tr4 to Tr7, and Tr12 operate in a saturation region unless otherwise specified. In other words, the gate voltage, source voltage, and drain voltage of each of the transistors Tr1, Tr4 to Tr7, and Tr12 are appropriately biased so that the transistors operate in the saturation region. Note that even when the operations of the transistors Tr1, Tr4 to Tr7, and Tr12 are deviated from ideal operation in a saturation region, the gate voltage, source voltage, and drain voltage of each of the transistors are regarded as being appropriately biased as long as the accuracy of output data is within a desired range.

In the memory cell array 721 shown in FIG. 11, only the following components are shown: the memory cell AM[1,1]; the memory cell AMP[i,1]; the memory cell AM[m,1]; the memory cell AM[1,j]; the memory cell AM[i,j]; the memory cell AM[m,j]; the memory cell AM[1,n]; the memory cell AM[i,n]; the memory cell AM[m,n]; the memory cell AMref [1]; the memory cell AMref[i]; the memory cell AMref[m]; the wiring RW[1]; the wiring RW[i]; the wiring RW[m]; the wiring WW[1]; the wiring WW[i]; the wiring WW[m]; the wiring WD[1]; the wiring WD[j]; the wiring WD[n]; the wiring WDref; the wiring B[1]; the wiring B[j]; the wiring B[n]; the wiring Bref; the wiring VR; the output terminal SPT[1]; the output terminal SPT[j]; the output terminal SPT[n]; a node N[1,1]; a node N[i,1]; a node N[m,1]; a node N[1,j]; the node N[i,j]; a node N[m,j]; a node N[1,n]; a node N[i,n]; a node N[m,n]; a node Nref[1]; the node Nref[i]; a node Nref[m]; the transistor Tr11; the transistor Tr12; and the capacitor C2. Other circuits, wirings, elements, and reference numerals thereof are not shown.

Depending on circumstances or conditions or as needed, the semiconductor device of one embodiment of the present invention may have a combined structure of the above configuration examples.

<Operation Example>

An example of operation of the semiconductor device 700 of one embodiment of the present invention will be described. Note that the semiconductor device 700 described in this operation example includes an offset circuit 750 shown in FIG. 12 as the offset circuit 710 and a memory cell array 760 shown in FIG. 13 as the memory cell array 720 of the semiconductor device 700.

Figure 12:
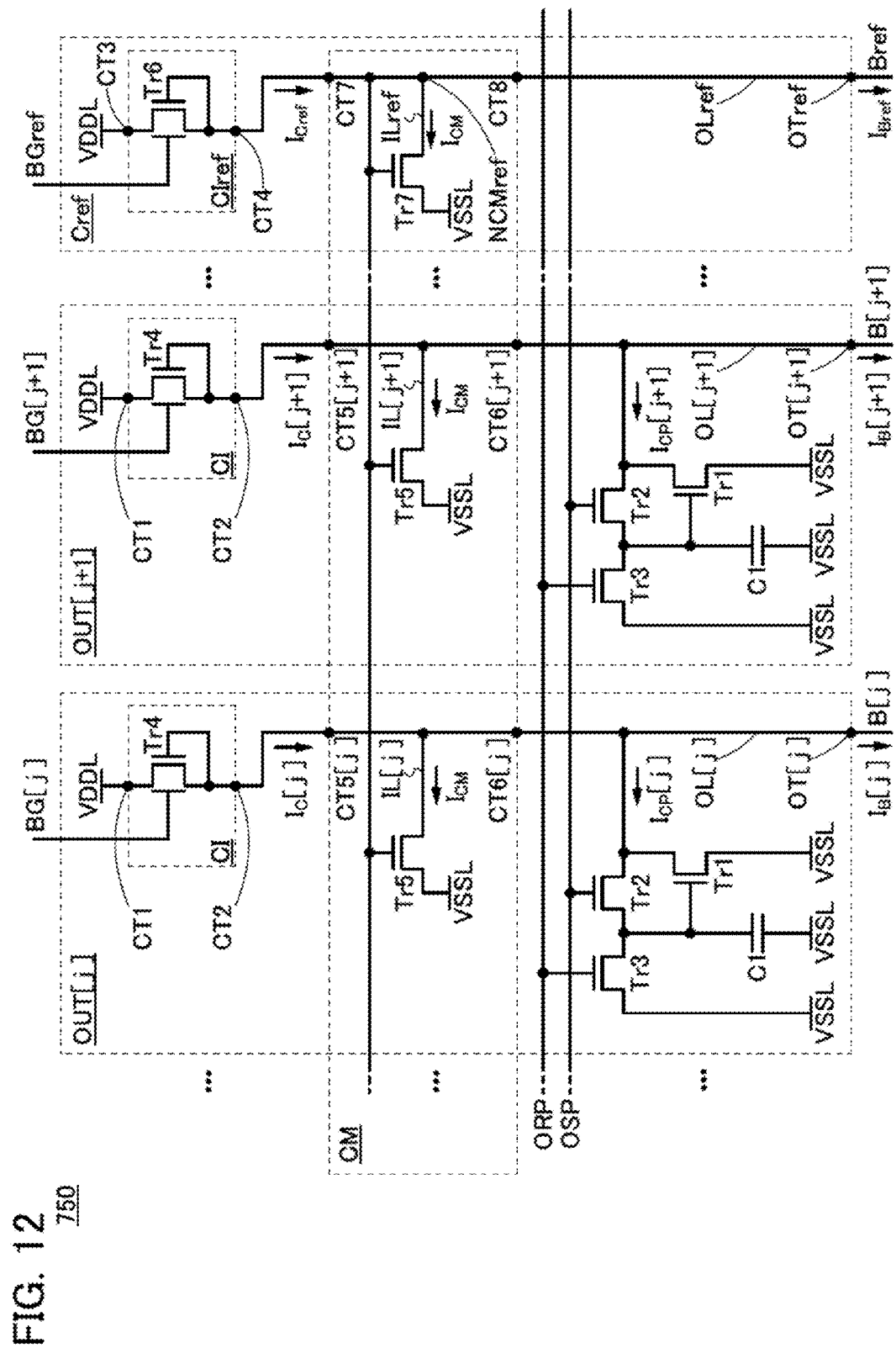
FIG. 12 is a circuit diagram illustrating an example of an offset circuit in the semiconductor device in FIG. 7.

The offset circuit 750 shown in FIG. 12 has a circuit configuration where the constant current circuit CI and the constant current circuit CIref of the offset circuit 712 in FIG. 9 and the current mirror circuit CM of the offset circuit 713 in FIG. 10 are used. With use of the configuration as shown in FIG. 12, all of the transistors in the offset circuit 750 can have the same polarity. For the description of this operation example, FIG. 12 shows the column output circuit OUT[j], a column output circuit OUT[j+1], and the reference column output circuit Cref.

In FIG. 12, current flowing from the first terminal to the second terminal of the transistor Tr4 in the constant current circuit CI of the column output circuit OUT[j] is denoted by $I_C[j]$, current flowing from the first terminal to the second terminal of the transistor Tr4 in the constant current circuit CI of the column output circuit OUT[j+1] is denoted by $I_C[j+1]$, and current flowing from the first terminal to the second terminal of the transistor Tr6 in the constant current circuit CIref of the reference column output circuit Cref is denoted by $I_{C_{ref}}$. Furthermore, in the current mirror circuit CM, current flowing to the first terminal of the transistor Tr5 through the wiring IL[j] in the column output circuit OUT[j], current flowing to the first terminal of the transistor Tr5 through a wiring IL[j+1] in the column output circuit OUT[j+1], and current flowing in the transistor Tr7 through the wiring ILref in the reference column output circuit Cref are denoted by $I_{CM}$. Furthermore, current flowing from the wiring OL[j] to the first terminal of the transistor Tr1 or Tr2 in the column output circuit OUT[j] is denoted by $I_{CP}$[j], and current flowing from a wiring OL[j+1] to the first terminal of the transistor Tr1 or Tr2 in the column output circuit OUT[j+1] is denoted by $I_{CP}$[j+1]. Current output from the output terminal OT[j] of the column output circuit OUT[j] to the wiring B[j] is denoted by $I_B$[j], current output from an output terminal OT[j+1] of the column output circuit OUT[j+1] to a wiring B[j+1] is denoted by $I_B$[j+1], and current output from the output terminal OTref of the reference column output circuit Cref to the wiring Bref is denoted by $I_{Bref}$.

Figure 13:
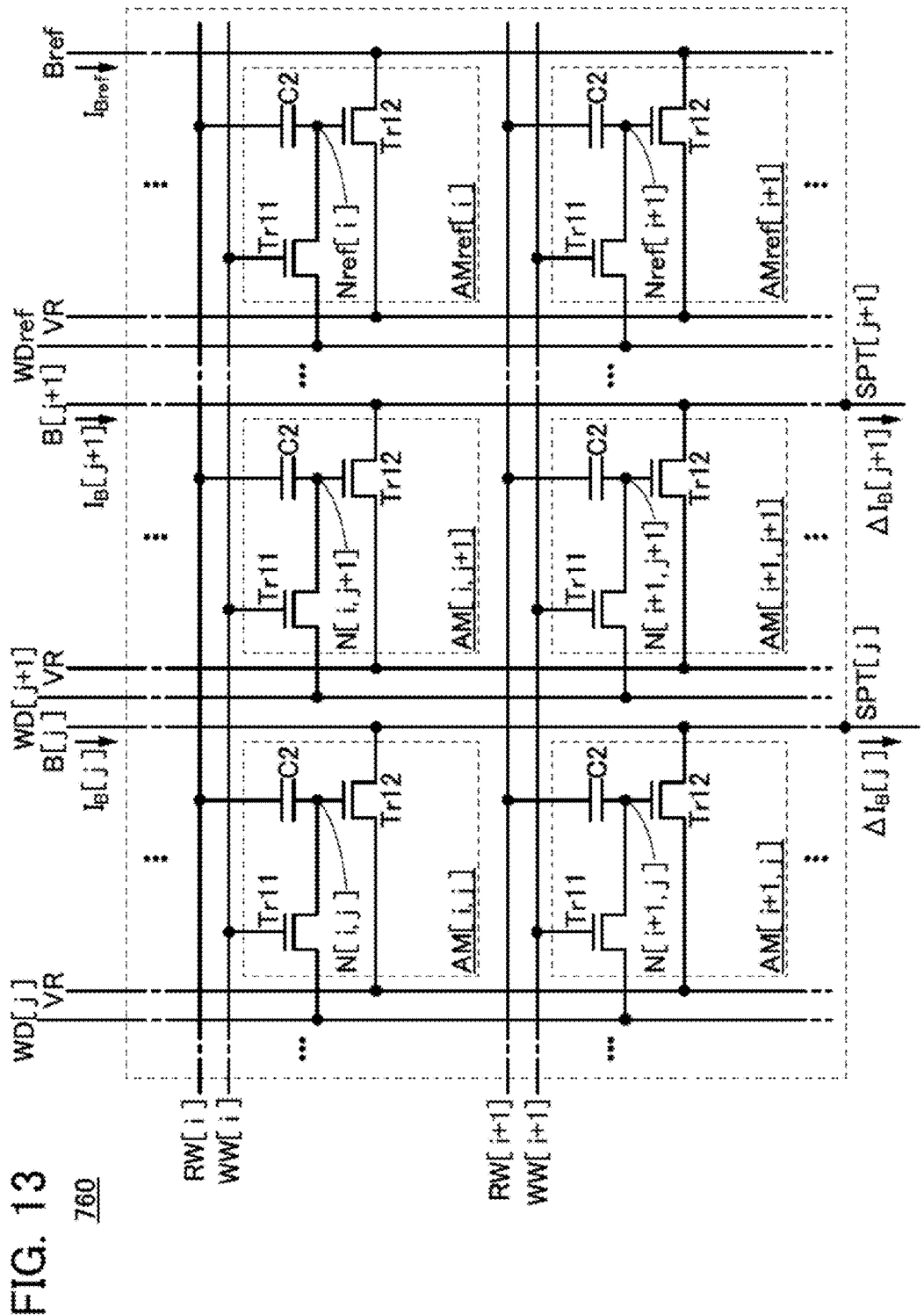
FIG. 13 is a circuit diagram illustrating an example of a memory cell array in the semiconductor device in FIG. 7.

The memory cell array 760 shown in FIG. 13 has a configuration similar to that of the memory cell array 721 shown in FIG. 11. For the description of this operation example, FIG. 13 shows the memory cell AM[i,j], a memory cell AM[i+1,j], a memory cell AM[i,j+1], a memory cell AM[i+1,j+1], the memory cell AMref[i], and a memory cell AMref[i+1].

In FIG. 13, $I_B$[j] denotes a current that is input from the wiring B[j], $I_B$[j+1] denotes a current that is input from the wiring B[j+1], and $I_{Bref}$ denotes a current that is input from the wiring Bref. In addition, $\Delta I_B$[j] denotes a current that is output from the output terminal SPT[j] that is electrically connected to the wiring B[j], and $\Delta I_B$[j+1] denotes a current that is output from an output terminal SPT[j+1] that is electrically connected to the wiring B[j+1].

Figure 14:
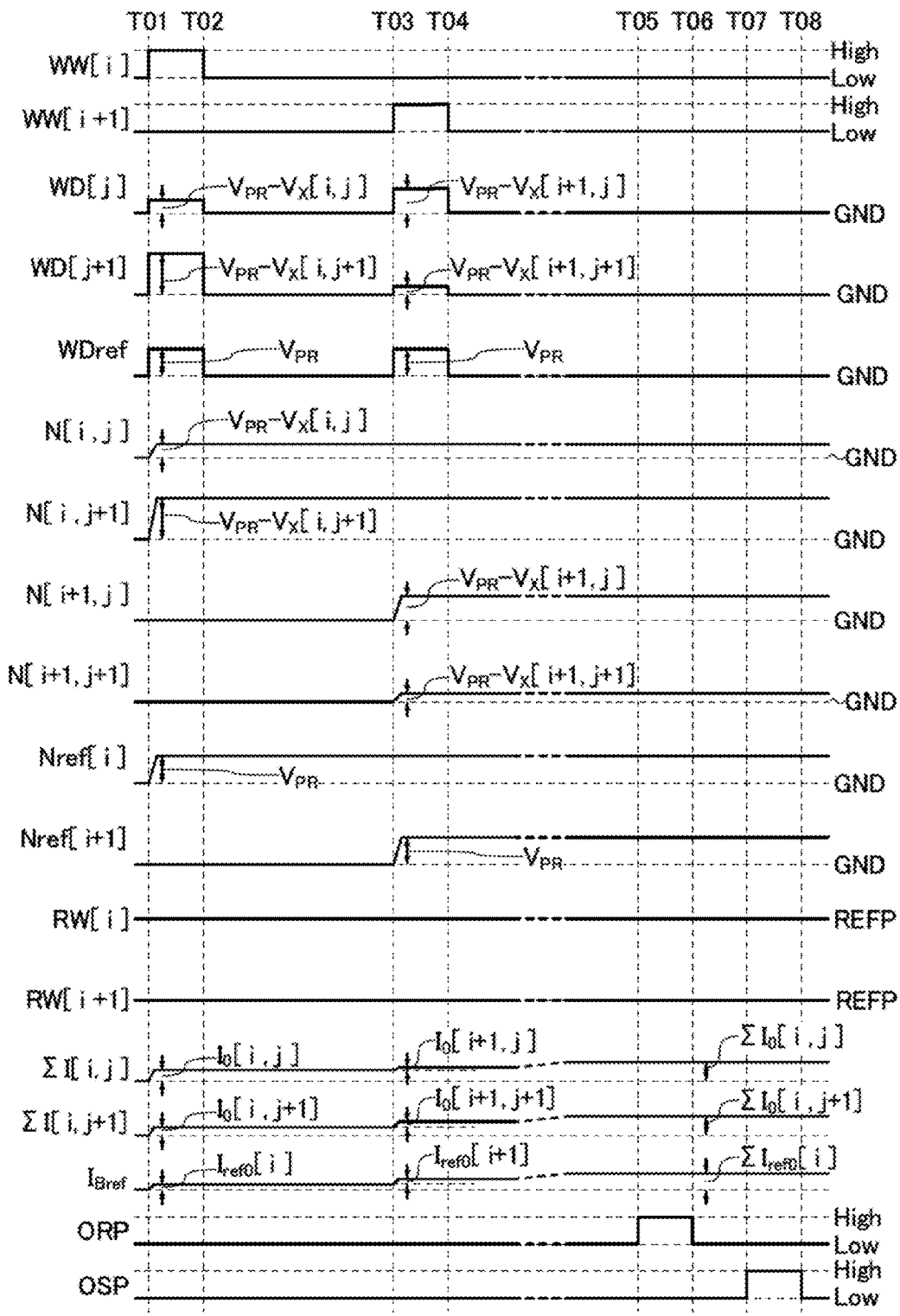
FIG. 14 is a timing chart showing an operation example of a semiconductor device.
Figure 15:
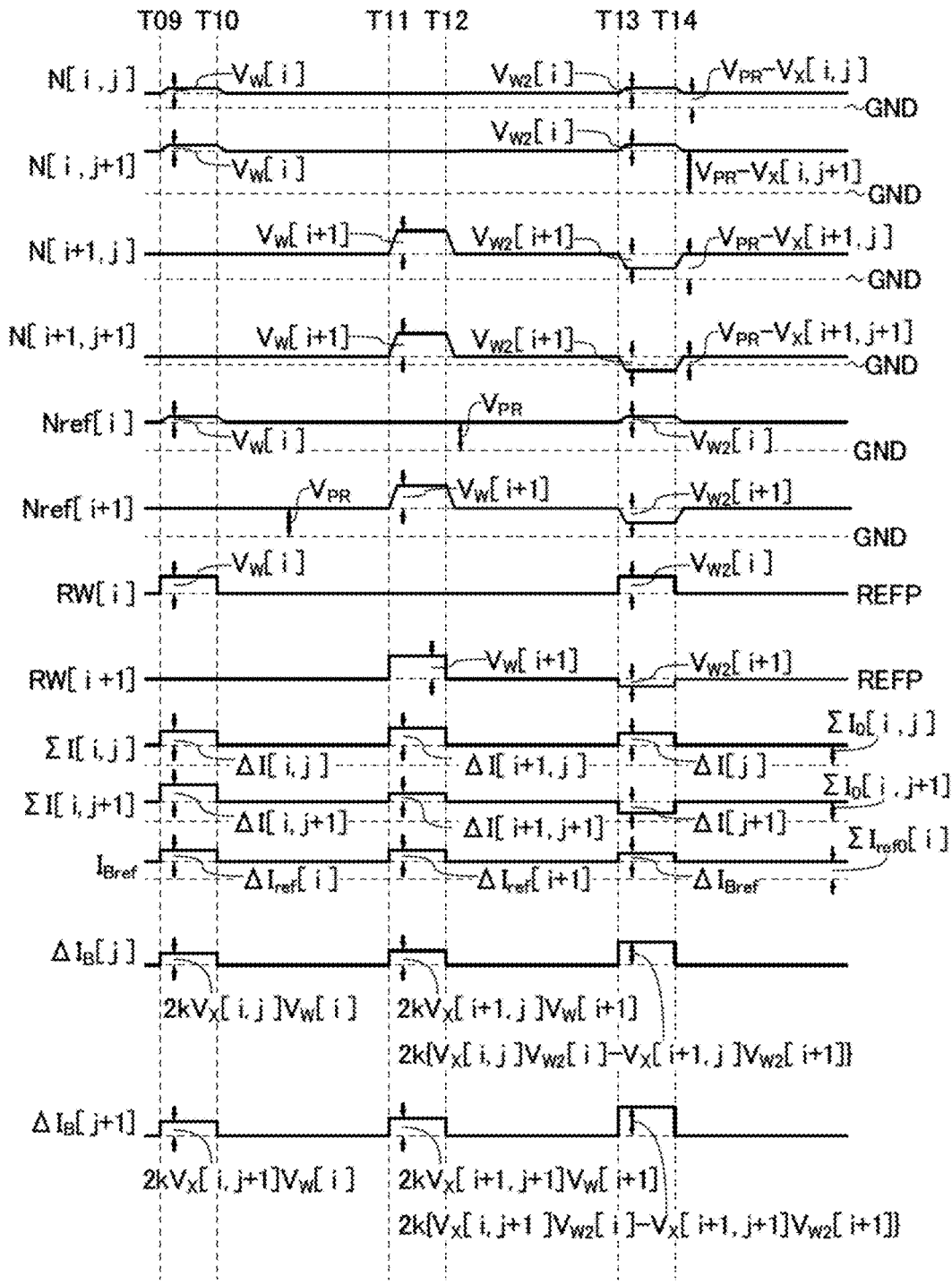
FIG. 15 is a timing chart showing an operation example of a semiconductor device.

FIG. 14 and FIG. 15 are timing charts showing the operation example of the semiconductor device 700. The timing chart in FIG. 14 shows changes in potentials during a period from Time T01 to Time T08 of the wiring WW[i], a wiring WW[i+1], the wiring WD[j], a wiring WD[j+1], the wiring WDref, the node N[i,j], a node N[i,j+1], a node N[i+1,j], a node N[i+1,j+1], the node Nref[i], a node Nref[i+1], the wiring RW[i], a wiring RW[i+1], the wiring OSP, and the wiring ORP. This timing chart also shows the amount of changes in a current ΣI[i,j], a current ΣI[i,j+1], and a current $I_{Bref}$. Note that the current ΣI[i,j] is the summation of current I[i,j] over i from 1 to m. Here, the current I[i,j] is current flowing in the transistor Tr12 in the memory cell AM[i,j]. The current ΣI[i,j+1] is the summation of current I[i,j+1] over i from 1 to m. Here, the current I[i,j+1] is current flowing in the transistor Tr12 in the memory cell AM[i,j+1]. The timing chart in FIG. 15 shows the operation during the period after Time T09, which is shown in the timing chart in FIG. 14, to Time T14. Note that each of the potentials of the wirings WW[i], WW[i+1], ORP, and OSP remains the low-level potential, and each of the potentials of the wirings WD[i], WD[j+1], and WDref remains a ground potential; thus, the potential changes in the wirings WW[i], WW[i+1], WD[j], WD[j+1], WDref, ORP, and OSP are not shown in the timing chart in FIG. 15. The timing chart in FIG. 15 also shows the changes in the current $\Delta I_B$[f] and the current $\Delta I_B$[j+1], which will be described later.

<<Period from Time T01 to Time T02>>

During a period from Time T01 to Time T02, the high-level potential (denoted by High in FIG. 14) is supplied to the wiring WW[i], and the low-level potential (denoted by Low in FIG. 14) is supplied to the wiring WW[i+1]. Furthermore, a potential higher than the ground potential (denoted by GND in FIG. 14) by $V_{PR}-V_X[i,j]$ is supplied to the wiring WD[j], the potential higher than the ground potential by $V_{PR}-V_X[i,j+1]$ is supplied to the wiring WD[j+1], and a potential higher than the ground potential by $V_{PR}$ is supplied to the wiring WDref. Moreover, a reference potential (denoted by REFP in FIG. 14) is supplied to the wiring RW[i] and the wiring RW[i+1].

The potential $V_X[i,j]$ and the potential $V_X[i,j+1]$ each correspond to the first analog data. The potential $V_{PR}$ corresponds to the reference analog data.

In this period, the high-level potential is supplied to the gates of the transistors Tr11 in the memory cell AM[i,j], the memory cell AM[i,j+1], and the memory cell AMref[i]; accordingly, the transistors Tr11 in the memory cell AM[i,j], the memory cell AM[i,j+1], and the memory cell AMref[i] are turned on. Thus, in the memory cell AM[i,j], the wiring WD[j] and the node N[i,j] are electrically connected to each other, and the potential of the node N[i,j] is $V_{PR}-V_X[i,j]$. Similarly, in the memory cell AM[i,j+1], the wiring WD[j+1] and the node N[i,j+1] are electrically connected to each other, and the potential of the node N[i,j+1] is $V_{PR}-V_X[i,j+1]$. In the memory cell AMref[j], the wiring WDref and the node Nref[i] are electrically connected to each other, and the potential of the node Nref[i] is $V_{PR}$.

A current flowing from the first terminal to the second terminal of the transistor Tr12 in each of the memory cell AM[i,j], the memory cell AM[i,j+1], and the memory cell AMref[i] will be described. The current $I_0$[i,j] flowing from the wiring B[j] to the second terminal of the transistor Tr12 in the memory cell AM[i,j] through the first terminal thereof can be expressed by the following formula.

[Formula 7]

$$I_0[i,j]=k(V_{PR}-V_X[i,j]-V_{th})^2 \qquad (E1)$$

In the formula, k is a constant determined by the channel length, the channel width, the mobility, the capacitance of a gate insulating film, and the like of the transistor Tr12. Furthermore, $V_{th}$ is the threshold voltage of the transistor Tr12.

At this time, the current flowing from the output terminal OT[j] of the column output circuit OUT[j] to the wiring B[j] is $I_0$[i,j].

Similarly, the current $I_0$[i,j+1] flowing from the wiring B[j+1] to the second terminal of the transistor Tr12 in the memory cell AM[i,j+1] through the first terminal thereof can be expressed by the following formula.

$$I_0[i,j+1]=k(V_{PR}-V_X[i,j+1]-V_{th})^2 \qquad [\text{Formula 8}]$$

At this time, the current flowing from the output terminal OT[j+1] of the column output circuit OUT[j+1] to the wiring B[j+1] is $I_0$[i,j+1].

The current $I_{ref0}$[i] flowing from the wiring Bref to the second terminal of the transistor Tr12 in the memory cell AMref[i] through the first terminal thereof can be expressed by the following formula.

[Formula 9]

$$I_{ref0}[i]=k(V_{PR}-V_{th})^2 \qquad (E2)$$

At this time, the current flowing from the output terminal OTref of the reference column output circuit Cref to the wiring Bref is $I_{ref0}$[i].

Note that since the low-level potential is supplied to the gates of the transistors Tr11 in the memory cell AM[i+1,j], the memory cell AM[i+1,j+1], and the memory cell AMref[i+1], the transistors Tr11 in the memory cell AM[i+1,j], the memory cell AM[i+1,j+1], and the memory cell AMref[i+1] are turned off. Thus, the potentials are not held at the node N[i+1,j], the node N[i+1,j+1], and the node Nref[i+1].

<<Period from Time T02 to Time T03>>

During a period from Time T02 to Time T03, the low-level potential is supplied to the wiring WW[i]. At this time, the low-level potential is supplied to the gates of the transistors Tr11 in the memory cell AM[i,j], the memory cell AM[i,j+1], and the memory cell AMref[i], and accordingly, the transistors Tr11 in the memory cells AM[i,j], AM[i,j+1], and AMref[i] are turned off.

The low-level potential has been supplied to the wiring WW[i+1] continuously since before Time T02. Thus, the transistors Tr11 in the memory cell AM[i+1,j], the memory cell AM[i+1,j+1], and the memory cell AMref[i+1] have been kept in an off state since before Time T02.

Since the transistors Tr11 in the memory cell AM[i,j], the memory cell AM[i,j+1], the memory cell AM[i+1,j], the memory cell AM[i+1,j+1], the memory cell AMref[i], and the memory cell AMref[i+1] are each in an off state as described above, the potentials at the node N[i,j], the node N[i,j+1], the node N[i+1,j], the node N[i+1,j+1], the node Nref[i], and the node Nref[i+1] are held in a period from Time T02 to Time T03.

In particular, when an OS transistor is used as each of the transistors Tr11 in the memory cell AM[i,j], the memory cell AM[i,j+1], the memory cell AM[i+1,j], the memory cell AM[i+1,j+1], the memory cell AMref[i], and the memory cell AMref[i+1] as described in the circuit configuration of the semiconductor device 700, the amount of leakage current flowing between the source and the drain of each of the transistors Tr11 can be made small, which makes it possible to hold the potentials at the nodes for a long time.

During the period from Time T02 to Time T03, the ground potential is supplied to the wiring WD[j], the wiring WD[j+1], and the wiring WDref Since the transistors Tr11 in the memory cell AM[i,j], the memory cell AM[i,j+1], the memory cell AM[i+1,j], the memory cell AM[i+1,j+1], the memory cell AMref[i], and the memory cell AMref[i+1] are each in an off state, the potentials held at the nodes in the memory cell AM[i,j], the memory cell AM[i,j+1], the memory cell AM[i+1,j], the memory cell AM[i+1,j+1], the memory cell AMref[i], and the memory cell AMref[i+1] are not rewritten by supplying potentials from the wiring WD[j], the wiring WD[j+1], and the wiring WDref.

<<Period from Time T03 to Time T04>>

During a period from Time T03 to Time T04, the low-level potential is supplied to the wiring WW[i], and the high-level potential is supplied to the wiring WW[i+1]. Furthermore, the potential higher than the ground potential by $V_{PR}-V_x[i+1,j]$ is supplied to the wiring WD[j], the potential higher than the ground potential by $V_{PR}-V_x[i+1,j+1]$ is supplied to the wiring WD[j+1], and the potential higher than the ground potential by $V_{PR}$ is supplied to the wiring WDref. Moreover, the reference potential has continuously been supplied to the wiring RW[i] and the wiring RW[i+1] since Time T02.

Note that the potential $V_x[i+1,j]$ and the potential $V_x[i+1,j+1]$ are each a potential corresponding to the first analog data.

In this period, the high-level potential is supplied to the gates of the transistors Tr11 in the memory cell AM[i+1,j], the memory cell AM[i+1,j+1], and the memory cell AMref[i+1], and accordingly, the transistors Tr11 in the memory cell AM[i+1,j], the memory cell AM[i+1,j+1], and the memory cell AMref[i+1] are each turned on. Thus, in the memory cell AM[i+1,j], the node N[i+1,j] and the wiring WD[U] are electrically connected to each other, and the potential of the node N[i+1,j] becomes $V_{PR}-V_x[i+1,j]$. Similarly, in the memory cell AM[i+1,j+1], the wiring WD[j+1] and the node N[i+1,j+1] are electrically connected to each other, and the potential of the node N[i+1,j+1] becomes $V_{PR}-V_x[i+1,j+1]$. In the memory cell AMref[i+1], the wiring WDref and the node Nref[i+1] are electrically connected to each other, and the potential of the node Nref[i+1] becomes $V_{PR}$.

The current flowing from the first terminal to the second terminal of the transistor Tr12 in each of the memory cell AM[i+1,j], the memory cell AM[i+1,j+1], and the memory cell AMref[i+1] is considered. The current $I_0[i+1,j]$ flowing from the wiring B[j] to the second terminal of the transistor Tr12 in the memory cell AM[i+1,j] through the first terminal thereof can be expressed by the following formula.

$$I_0[i+1,j]=k(V_{PR}-V_X[i+1,j]-V_{th})^2 \quad \text{[Formula 10]}$$

At this time, the current flowing from the output terminal OT[j] of the column output circuit OUT[j] to the wiring B[j] is $I_0[i,j]+I_0[i+1,j]$.

Similarly, the current $I_0[i+1,j+1]$ flowing from the wiring B[j+1] to the second terminal of the transistor Tr12 in the memory cell AM[i+1,j+1] through the first terminal thereof can be expressed by the following formula.

$$I_0[i+1,j+1]=k(V_{PR}-V_X[i+1,j+1]-V_{th})^2 \quad \text{[Formula 11]}$$

At this time, the current flowing from the output terminal OT[j+1] of the column output circuit OUT[j+1] to the wiring B[j+1] is $I_0[i,j+1]+I_0[i+1,j+1]$.

The current $I_{ref0}[i+1]$ flowing from the wiring Bref to the second terminal of the transistor Tr12 in the memory cell AMref[i+1] through the first terminal thereof can be expressed by the following formula.

$$I_{ref0}[i+1]=k(V_{PR}-V_{th})^2 \quad \text{[Formula 12]}$$

At this time, the current flowing from the output terminal OTref of the reference column output circuit Cref to the wiring Bref is $I_{ref0}[i]+I_{ref0}[i+1]$.

<<Period from Time T04 to Time T05>>

During a period from Time T04 to Time T05, the potential corresponding to the first analog data is written to the rest of the memory cells AM, and the potential $V_{PR}$ is written to the rest of memory cells AMref, in a manner similar to that of the operation during the period from Time T01 to Time T02 or that of the operation during the period from Time T03 to Time T04. Thus, the total amount of currents flowing in the transistors Tr12 in all of the memory cells AM corresponds to the amount of current flowing from the output terminal OT[j] of the column output circuit OUT[j] to the wiring B[j] that is denoted by $\Sigma I_0[i,j]$ ($\Sigma_0[i,j]$ represents the summation of the current $I_0[i,j]$ over i from 1 to m).

Here, the description will be made with a focus on the reference column output circuit Cref. The total amount of current flowing through the transistors Tr12 in the memory cells AMref[1] to AMref[m] flows into the wiring Bref of the reference column output circuit Cref. That is, the current $I_{Bref}$, which is the current $\Sigma I_{ref0}[i]$, flows into the wiring Bref (here, $\Sigma I_{ref0}[i]$ is the summation of $I_{ref0}[i]$ over i from 1 to m).

Although the current flowing through the wiring ILref is denoted by $I_{CM}$ in FIG. 12, the current flowing through the wiring ILref before Time T09 is denoted by $I_{CM0}$ in this specification.

The current $I_{Cref}$ is output from the terminal CT4 of the constant current circuit $CI_{ref}$. Thus, $I_{CM0}$ is determined by setting the potential of the gate of the transistor Tr7 (potential of the node NCMref) so that the following formula is satisfied.

[Formula 13]

$$I_{Cref} - I_{CM0} = \sum_i I_{ref0}[i] \quad (E3)$$

Note that since the potential of the gate of the transistor Tr7 (potential of the node NCMref) is used as a reference in the current mirror circuit CM, the current $I_{CM0}$ also flows in the wirings IL[1] to IL[n] of the column output circuits OUT[1] to OUT[n].

<<Period from Time T05 to Time T06>>

During a period from Time T05 to Time T06, the wiring ORP is set at the high-level potential. At this time, the high-level potential is supplied to the gates of the transistors Tr3 in the column output circuits OUT[1] to OUT[n], so that the transistors Tr3 are turned on. Thus, the low-level potential is supplied to the first terminals of the capacitors C1 in the column output circuits OUT[1] to OUT[n], and thus the potentials of the capacitors C1 are initialized. When Time T06 starts, the low-level potential is supplied to the wiring ORP, so that the transistors Tr3 in the column output circuits OUT[1] to OUT[n] are turned off.

<<Period from Time T06 to Time T07>>

During a period from Time T06 to Time T07, the wiring ORP is set at the low-level potential. In the above manner, the low-level potential is supplied to the gates of the transistors Tr3 in the column output circuits OUT[1] to OUT[n], so that the transistors Tr3 are turned off.

<<Period from Time T07 to Time T08>>

During a period from Time T07 to Time T08, the wiring OSP is set at the high-level potential. In the above manner, the high-level potential is supplied to the gates of the transistors Tr2 in the column output circuits OUT[1] to OUT[n], so that the transistors Tr2 are turned on. At this time, the current flows into the first terminals of the capacitors C1 from the first terminals of the transistors Tr2 through the second terminals of the transistors Tr2, and potentials are held in the capacitors C1. Thus, the potentials of the gates of the transistors Tr1 are held, so that the current corresponding to the potential of the gate of each of the transistors Tr1 flows between the source and the drain of the transistor Tr1.

When Time T08 starts, the low-level potential is supplied to the wiring OSP, so that the transistors Tr2 in the column output circuits OUT[1] to OUT[n] are turned off. The potentials of the gates of the transistors Tr1 are held in the capacitors C1, so that even after Time T08, the same amount of current keeps flowing between the source and the drain of each of the transistors Tr1.

Here, the description will be made with a focus on the column output circuit OUTL[j]. In the column output circuit OUTL[j], the current flowing between the source and the drain of the transistor Tr1 is denoted by $I_{CP}[j]$, and the current flowing between the source and the drain of the transistor Tr4 of the constant current circuit CI is denoted by $I_C[j]$. The current flowing between the source and the drain of the transistor Tr5 through the current mirror circuit CM is $I_{CM0}$. On the assumption that the current is not output from the output terminal SPT[j] during the period from Time T01 to Time T08, the sum of the amounts of current flowing through each of the transistors Tr12 in the memory cells AM[1] to AM[n] flows in the wiring B[j] of the column output circuit OUTL[j]. In other words, the current $\Sigma I_0[i,j]$ ($\Sigma I_0[i,j]$ is the summation of $I_{ref0}[i]$ over i from 1 to m) represents the current obtained by summing over i from 1 to m) flows in the wiring B[j]. Thus, the above satisfies the following formula.

[Formula 14]

$$I_C[j] - I_{CM0} - I_{CP}[j] = \sum_i I_0[i,j] \quad (E4)$$

<<Period from Time T09 to Time T10>>

The operation after Time T09 will be described with reference to FIG. 15. During a period from Time T09 to Time T10, a potential higher than the reference potential (denoted by REFP in FIG. 15) by $V_W[i]$ is supplied to the wiring RW[i]. At this time, the potential $V_W[i]$ is supplied to the second terminals of the capacitors C2 in the memory cells AM[i,1] to AM[i,n] and the memory cell AMref[i], so that the potentials of the gates of the transistors Tr12 increase.

Note that the potential $V_W[i]$ is a potential corresponding to the second analog data.

An increase in the potential of the gate of the transistor Tr12 corresponds to the potential obtained by multiplying a change in potential of the wiring RW[i] by a capacitive coupling coefficient determined by the memory cell configuration. The capacitive coupling coefficient is calculated on the basis of the capacitance of the capacitor C2, the gate capacitance of the transistor Tr2, and the parasitic capacitance. In this operation example, to avoid complexity of description, an increase in potential of the wiring RW[i] is equal to an increase in potential of the gate of the transistor Tr12, which corresponds to a case where the capacitive coupling coefficient in each of the memory cells AM and the memory cell AMref is set to 1.

When the potential $V_W[i]$ is supplied to the second terminals of the capacitors C2 in the memory cell AM[i,j], the memory cell AM[i,j+1], and the memory cell AMref[i] on the assumption that the capacitive coupling coefficient is 1, the potentials of the node N[i,j], the node N[i,j+1], and the node Nref[i] each increase by $V_W[i]$.

The current flowing from the first terminal to the second terminal of the transistor Tr12 in each of the memory cell AM[i,j], the memory cell AM[i,j+1], and the memory cell AMref[i] will be described. The current I[i,j] flowing from the wiring B[j] to the second terminal of the transistor Tr12 in the memory cell AM[i,j] through the first terminal thereof can be expressed by the following formula.

[Formula 15]

$$I[i,j] = k(V_{PR} - V_X[i,j] + V_W[i] - V_{th})^2 \quad (E5)$$

In other words, by supplying the potential $V_W[i]$ to the wiring RW[i], the current flowing from the wiring B[j] to the second terminal of the transistor Tr12 in the memory cell AM[i,j] through the first terminal thereof increases by I[i, j]−I$_0$[i,j] (denoted by ΔI[i,j] in FIG. 15).

Similarly, the current I[i,j+1] flowing from the wiring B[j+1] to the second terminal of the transistor Tr12 in the memory cell AM[i,j+1] through the first terminal thereof can be expressed by the following formula.

$$I[i,j+1] = k(V_{PR} - V_X[i,j+1] + V_W[i] - V_{th})^2 \quad \text{[Formula 16]}$$

In other words, by supplying the potential $V_W[i]$ to the wiring RW[i], the current flowing from the wiring B[j+1] to the second terminal of the transistor Tr12 in the memory cell AM[i,j+1] through the first terminal thereof increases by I[i,j+1]−I₀[i,j+1] (denoted by ΔI[i,j+1] in FIG. 15).

Furthermore, the current $I_{ref}[i]$ flowing from the wiring Bref to the second terminal of the transistor Tr12 in the memory cell AMref[i] through the first terminal thereof can be expressed by the following formula.

[Formula 17]

$$I_{ref}[i] = k(V_{PR} + V_W[i] - V_{th})^2 \quad (E6)$$

In other words, by supplying the potential $V_W[i]$ to the wiring RW[i], the current flowing from the wiring Bref to the second terminal of the transistor Tr12 in the memory cell AMref[i] through the first terminal thereof increases by $I_{ref}[i] - I_{ref0}[i]$ (denoted by $\Delta I_{ref}[i]$ in FIG. 15).

Here, the description will be made with a focus on the reference column output circuit Cref. The total amount of current flowing through the transistors Tr12 in the memory cells AMref[1] to AMref[m] flows into the wiring Bref of the reference column output circuit Cref. In other words, the current $I_{Bref}$, which is the current $\Sigma I_{ref}[i]$, flows through the wiring Bref.

The current $I_{Cref}$ is output from the terminal CT4 in the constant current circuit CIref. Thus, $I_{CM}$ is determined by setting the potential of the gate of the transistor Tr7 (potential of the node NCMref) so that the following formula is satisfied.

[Formula 18]

$$I_{Cref} - I_{CM} = \sum_i I_{ref}[i] \quad (E7)$$

Here, the current $\Delta I_B[j]$ that is output from the wiring B[U] will be described. During the period from Time T08 to Time T09, Formula (E4) is satisfied, and the current $\Delta I_B[j]$ is not output from the wiring B[j].

During the period from Time T09 to Time T10, a potential higher than the reference potential by $V_W[i]$ is supplied to the wiring RW[i], and the current flowing between the source and the drain of the transistor Tr12 in the memory cell AM[i,j] changes. Then, the current $\Delta I_B[j]$ is output from the output terminal SPT[j] that is electrically connected to the wiring B[j]. Specifically, in the column output circuit OUT[j], the current $I_C[i]$ is output from the terminal CT2 of the constant current circuit CI, the current $I_{CM}$ flows between the source and the drain of the transistor Tr5, and the current $I_{CP}[j]$ flows between the source and the drain of the transistor Tr1. Thus, the current $\Delta I_B[j]$ can be expressed by the following formula using $\Sigma I[i,j]$, which is the summation of current I[i,j] over i from 1 to m. Here, the current I[i,j] is current flowing between the source and the drain of the transistor Tr12 in the memory cell AM[i,j].

[Formula 19]

$$\Delta I_B[j] = (I_C[j] - I_{CM} - I_{CP}[j]) - \sum_i I[i,j] \quad (E8)$$

Formulae (E1) to (E7) are applied to Formula (E8), so that the following formula can be obtained.

[Formula 20]

$$\Delta I_B[j] = 2k \sum_i (V_X[i,j] V_W[i]) \quad (E9)$$

According to Formula (E9), the current $\Delta I_B[j]$ is a value corresponding to the sum of products of the potential $V_X[i,j]$ that is the first analog data and the potential $V_W[i]$ that is the second analog data. That is, when the current $\Delta I_B[j]$ is calculated, the value of the sum of products of the first analog data and the second analog data can be obtained.

During the period from Time T09 to Time T10, when all of the wirings RW[1] to RW[m] except the wiring RW[i] are set to have a reference potential, the relation, $V_W[g]=0$ (here, g is an integer that is greater than or equal to 1 and less than or equal to m and not i), is satisfied. Thus, according to Formula (E9), $\Delta I_B[j]=2 kV_X[i,j]V_W[i]$ is output. In other words, the data corresponding to the product of the first analog data stored in the memory cell AM[i,j] and the second analog data corresponding to a selection signal supplied to the wiring RW[i] is output from the output terminal SPT[j] that is electrically connected to the wiring B[j].

Furthermore, similarly, a differential current that is output from the output terminal SPT[j+1] electrically connected to the wiring B[j+1] is expressed as $\Delta I_B[j+1]=2kV_X[i,j+1]V_W[i]$. The data corresponding to the product of the first analog data stored in the memory cell AM[i,j+1] and the second analog data corresponding to a selection signal supplied to the wiring RW[i] is output from the output terminal SPT[j+1] that is electrically connected to the wiring B[j+1].

<<Period from Time T10 to Time T11>>

During a period from Time T10 to Time T11, the ground potential is supplied to the wiring RW[i]. The ground potential is supplied to the second terminals of the capacitors C2 in the memory cells AM[i,1] to AM[i,n] and the memory cell AMref[i]. Thus, the potentials of the nodes N[i,1] to N[i,n] and the node Nref[i] return to the potentials during the period from Time T08 to Time T09.

<<Period from Time T11 to Time T12>>

During a period from Time T11 to Time T12, the wirings RW[1] to RW[m] except the wiring RW[i+1] are set to have the reference potential, and a potential higher than the reference potential by $V_W[i+1]$ is supplied to the wiring RW[i+1]. At this time, as in the operation during the period from Time T09 to Time T10, the potential $V_W[i+1]$ is supplied to the second terminals of the capacitors C2 in the memory cells AM[i+1,1] to AM[i+1,n] and the memory cell AMref[i+1], so that the potentials of the gates of the transistors Tr12 increase.

The potential $V_W[i+1]$ corresponds to the second analog data.

As described above, the capacitive coupling coefficients of the memory cells AM and the memory cell AMref are each 1. When the potential $V_W[i+1]$ is supplied to the second terminals of the capacitors C2 in the memory cell AM[i+1,j], the memory cell AM[i+1,j+1], and the memory cell AMref[i+1], the potentials of the node N[i+1,j], the node N[i+1,j+1], and the node Nref[i+1] each increase by $V_W[i+1]$.

When the potentials of the node N[i+1,j], the node N[i+1,j+1], and the node Nref[i+1] increase by $V_W[i+1]$, the amount of current flowing in each of the transistors Tr12 in the memory cell AM[i+1,j], the memory cell AM[i+1,j+1], and the memory cell AMref[i+1] increases. When the current flowing in the transistor Tr12 in the memory cell AM[i+1,j] is denoted by I[i+1,j], the current flowing from the output terminal OT[j] of the column output circuit OUT[j] to the wiring B[j] increases by I[i+1,j]−I$_0$[i+1,j] (denoted by ΔI[i+1,j] in FIG. 15). Similarly, when the current flowing in the transistor Tr12 in the memory cell AM[i+1,j+1] is denoted by I[i+1,j+1], the current flowing from the output terminal OT[j+1] of the column output circuit OUT[j+1] to the wiring B[j+1] increases by I[i+1,j+1]−I$_0$[i+1,j+1] (denoted by ΔI[i+1,j+1] in FIG. 15). When the current flowing in the transistor Tr12 in the memory cell AMref[i+1] is denoted by I$_{ref}$[i+1], the current flowing from the output terminal OTref of the reference column output circuit Cref to the wiring Bref increases by I$_{ref}$[i+1]−I$_{ref0}$[i+1] (denoted by ΔI$_{ref}$[i+1] in FIG. 15).

The operation during the period from Time T11 to Time T12 can be similar to the operation during the period from Time T09 to Time T10. Thus, when Formula (E9) is applied to the operation during the period from Time T11 to Time T12, the differential current that is output from the wiring B[j] is expressed as ΔI$_B$[j]=2kV$_X$[i+1,j]V$_W$[i+1]. In other words, the data corresponding to the product of the first analog data stored in the memory cell AM[i+1,j] and the second analog data corresponding to a selection signal supplied to the wiring RW[i+1] is output from the output terminal SPT[j] that is electrically connected to the wiring B[j].

Furthermore, similarly, the differential current that is output from the wiring B[j+1] is expressed as ΔI$_B$[j+1]=2kV$_X$[i+1,j+1]V$_W$[i+1]. The data corresponding to the product of the first analog data stored in the memory cell AM[i+1,j+1] and the second analog data corresponding to a selection signal supplied to the wiring RW[i+1] is output from the output terminal SPT[j+1] that is electrically connected to the wiring B[j+1].

<<Period from Time T12 to Time T13>>

During a period from Time T12 to Time T13, the ground potential is supplied to the wiring RW[i+1]. In this period, the ground potential is supplied to the second terminals of the capacitors C2 in the memory cells AM[i+1,1] to AM[i+1,n] and the memory cell AMref[i+1], and the potentials of nodes N[i+1,1] to N[i+1,n] and the node Nref[i+1] return to the potentials in the period from Time T10 to Time T11.

<<Period from Time T13 to Time T14>>

During a period from Time T13 to Time T14, the wirings RW[1] to RW[m] except the wiring RW[i] and the wiring RW[i+1] are set to have the reference potential, a potential higher than the reference potential by V$_{W2}$[i] is supplied to the wiring RW[i], and a potential lower than the reference potential by V$_{W2}$[i+1] is supplied to the wiring RW[i+1]. At this time, as in the operation during the period from Time T09 to Time T10, the potential V$_{W2}$[i] is supplied to the second terminals of the capacitors C2 in the memory cells AM[i,1] to AM[i,n] and the memory cell AMref[i], so that potentials of the gates of the transistors Tr12 in the memory cells AM[i,1] to AM[i,n] and the memory cell AMref[i] increase. Concurrently, the potential −V$_{W2}$[i+1] is supplied to the second terminals of the capacitors C2 in the memory cells AM[i+1,1] to AM[i+1,n] and the memory cell AMref[i+1], so that the potentials of the gates of the transistors Tr12 in the memory cells AM[i+1,1] to AM[i+1,n] and the memory cell AMref[i+1] decrease.

The potential V$_{W2}$[i] and the potential V$_{W2}$[i+1] are potentials each corresponding to the second analog data.

Note that the capacitive coupling coefficients of the memory cell AM and the memory cell AMref are each 1. By supplying the potential V$_{W2}$[i] to the second terminals of the capacitors C2 in the memory cell AM[i,j], the memory cell AM[i,j+1], and the memory cell AMref[i], the potentials of the node N[i,j], the node N[i,j+1], and the node Nref[i] each increase by V$_{W2}$[i]. When the potential −V$_{W2}$[i+1] is supplied to the second terminals of the capacitors C2 in the memory cell AM[i+1,j], the memory cell AM[i+1,j+1], and the memory cell AMref[i+1], the potentials of the node N[i+1,j], the node N[i+1,j+1], and the node Nref[i+1] each decrease by V$_{W2}$[i+1].

When each of the potentials of the node N[i,j], the node N[i,j+1], and the node Nref[i] increases by V$_{W2}$[i], the amount of current flowing in each of the transistors Tr12 in the memory cell AM[i,j], the memory cell AM[i,j+1], and the memory cell AMref[i] increases. Here, the current flowing in the transistor Tr12 in the memory cell AM[i,j] is denoted by I[i,j], the current flowing in the transistor Tr12 in the memory cell AM[i,j+1] is denoted by I[i,j+1], and the current flowing in the transistor Tr12 in the memory cell AMref[i] is denoted by I$_{ref}$[i].

When the potentials of the node N[i+1,j], the node N[i+1,j+1], and the node Nref[i+1] each decrease by V$_{W2}$[i+1], the amount of current flowing in each of the transistors Tr12 in the memory cell AM[i+1,j], the memory cell AM[i+1,j+1], and the memory cell AMref[i+1] decreases. Here, the current flowing in the transistor Tr12 in the memory cell AM[i+1,j] is denoted by I$_2$[i,j], the current flowing in the transistor Tr12 in the memory cell AM[i+1,j+1] is denoted by I$_2$[i,j+1], and the current flowing in the transistor Tr12 in the memory cell AMref[i+1] is denoted by I$_{2ref}$[i+1].

At this time, the current flowing from the output terminal OT[j] of the column output circuit OUT[j] to the wiring B[j] increases by (I$_2$[i,j]−I$_0$[i,j])+(I$_2$[i+1,j]−I$_0$[i+1,j]) (denoted by ΔI[j] in FIG. 15). The current flowing from the output terminal OT[j+1] of the column output circuit OUT[j+1] to the wiring B[j+1] increases by (I$_2$[i,j+1]−I$_0$[i,j+1])+(I$_2$[i+1,j+1]−I$_0$[i+1,j+1]) (denoted by ΔI[j+1] in FIG. 15, which is a negative current). The current flowing from the output terminal OTref of the reference column output circuit Cref to the wiring Bref increases by (I$_{ref}$[i,j]−I$_{ref0}$[i,j])+(I$_{ref}$[i+1,j]−I$_{ref0}$[i+1,j]) (denoted by ΔI$_{Bref}$ in FIG. 15).

The operation during the period from Time T13 to Time T14 can be similar to the operation during the period from Time T09 to Time T10. When Formula (E9) is applied to the operation during the period from Time T13 to Time T14, the differential current that is output from the wiring B[j] is expressed as ΔI$_B$[j]=2k{V$_X$[i,j]V$_{W2}$[i]−V$_X$[i+1,j]V$_{W2}$[i+1]}. Thus, the data corresponding to the sum of products of the first analog data stored in each of the memory cell AM[i,j] and the memory cell AM[i+1,j] and the second analog data corresponding to a selection signal supplied to each of the wiring RW[i] and the wiring RW[i+1] is output from the output terminal SPT[j] that is electrically connected to the wiring B[U].

Furthermore, similarly, the differential current that is output from the wiring B[j+1] is expressed as ΔI$_B$[i+1]=2k{V$_X$[i,j+1]V$_{W2}$[i]−V$_X$[i+1,j+1]V$_{W2}$[i+1]}. The data corresponding to the product of the first analog data stored in each of the memory cell AM[i,j+1] and the memory cell AM[i+1,j+1] and the second analog data corresponding to a selection signal supplied to each of the wiring RW[i] and the wiring RW[i+1] is output from the output terminal SPT[j+1] that is electrically connected to the wiring B[j+1].

<<After Time T14>>

After Time T14, the ground potential is supplied to the wiring RW[i] and the wiring RW[i+1]. At this time, the ground potential is supplied to the second terminals of the capacitors C2 in the memory cells AM[i,1] to AM[i,n], the memory cells AM[i+1,1] to AM[i+1,n], the memory cell AMref[i], and the memory cell AMref[i+1]. Thus, the potentials of the nodes N[i,1] to N[i,n], the nodes N[i+1,1] to N[i+1,n], the node Nref[i], and the node Nref[i+1] return to the potentials in the period from Time T12 to Time T13.

With the circuit configuration of FIG. 7, a plurality of product-sum operations can be executed concurrently. Thus, a semiconductor device enabling high-speed product-sum operations can be provided.

Here, the first analog data serves as weight coefficients and the second analog data corresponds to neuron outputs, whereby calculation of the weighted sums of the neuron outputs can be conducted concurrently. Thus, data corresponding to results of the calculation of the weighted sums, that is, synapse inputs can be obtained as the output signals. Specifically, weight coefficients $w_{s[k]\cdot 1}^{(k)}$ to $w_{s[k]\cdot Q[k-1]}^{(k)}$ of the s[k]-th neuron in the k-th layer are stored as the first analog data in the memory cells AM[1,j] to AM[m,j] and output signals $z_{1\cdot s[k]}^{(k-1)}$ to $z_{Q[k-1]\cdot s[k]}^{(k-1)}$ of the neurons in the (k−1)-th layer are supplied as the second analog data to the wirings RW[1] to RW[m], whereby the summation $u_{s[k]}^{(k)}$ of signals input to the s[k]-th neuron in the k-th layer can be obtained. That is, the product-sum operation expressed by Formula (D1) can be performed with the semiconductor device 700.

In the case where weight coefficients are updated in supervised learning, weight coefficients $w_{1\cdot s[k]}^{(k+1)}$ to $w_{Q[k+1]s[k]}^{(k+1)}$ multiplied by when a signal is sent from the s[k]-th neuron in the k-th layer to neurons in the (k+1)-th layer are stored as the first analog data in the memory cells AM[1,j] to AM[m,j] and errors $\delta_1^{(k+1)}$ to $\delta_{Q[k+1]}^{(k+1)}$ of the neurons in the (k+1)-th layer are supplied as the second analog data to the wirings RW[1] to RW[m], whereby a value of $\Sigma w_{s[k+1]\cdot s[k]}^{(k+1)}\cdot\delta_{s[k+1]}^{(k+1)}$ in Formula (D3) can be obtained from the differential current $\Delta I_B[j]$ flowing through the wiring B[j]. That is, part of the operation expressed by Formula (D3) can be performed with the semiconductor device 700.

Here, in the information terminal 5200, information about the incident angle and illuminance of external light that is obtained by the optical sensors 5225X and 5225Y and information about the inclination of the information terminal 5200 that is obtained by the acceleration sensor 146 of the information terminal 5200 are input as input data to the neurons in the input layer (first layer), and a set value corresponding to the luminance and color tone meeting the preference of the user of the information terminal 5200 is used as teacher data. This allows the data processing circuit 165 to output the set value corresponding to the luminance and color tone meeting the preference of the user from an output layer (L-th layer) in accordance with a calculation result of the hierarchical neural network.

Note that this embodiment can be combined with any of the other embodiments in this specification as appropriate.

Embodiment 4

In this embodiment, an example of operation for adjusting the luminance and color tone (example of operation for adjusting light and color) of the hybrid display device described in Embodiment 1 will be described. As described above, the neural network described in Embodiment 3 is used to adjust the luminance and color tone.

Figure 16:
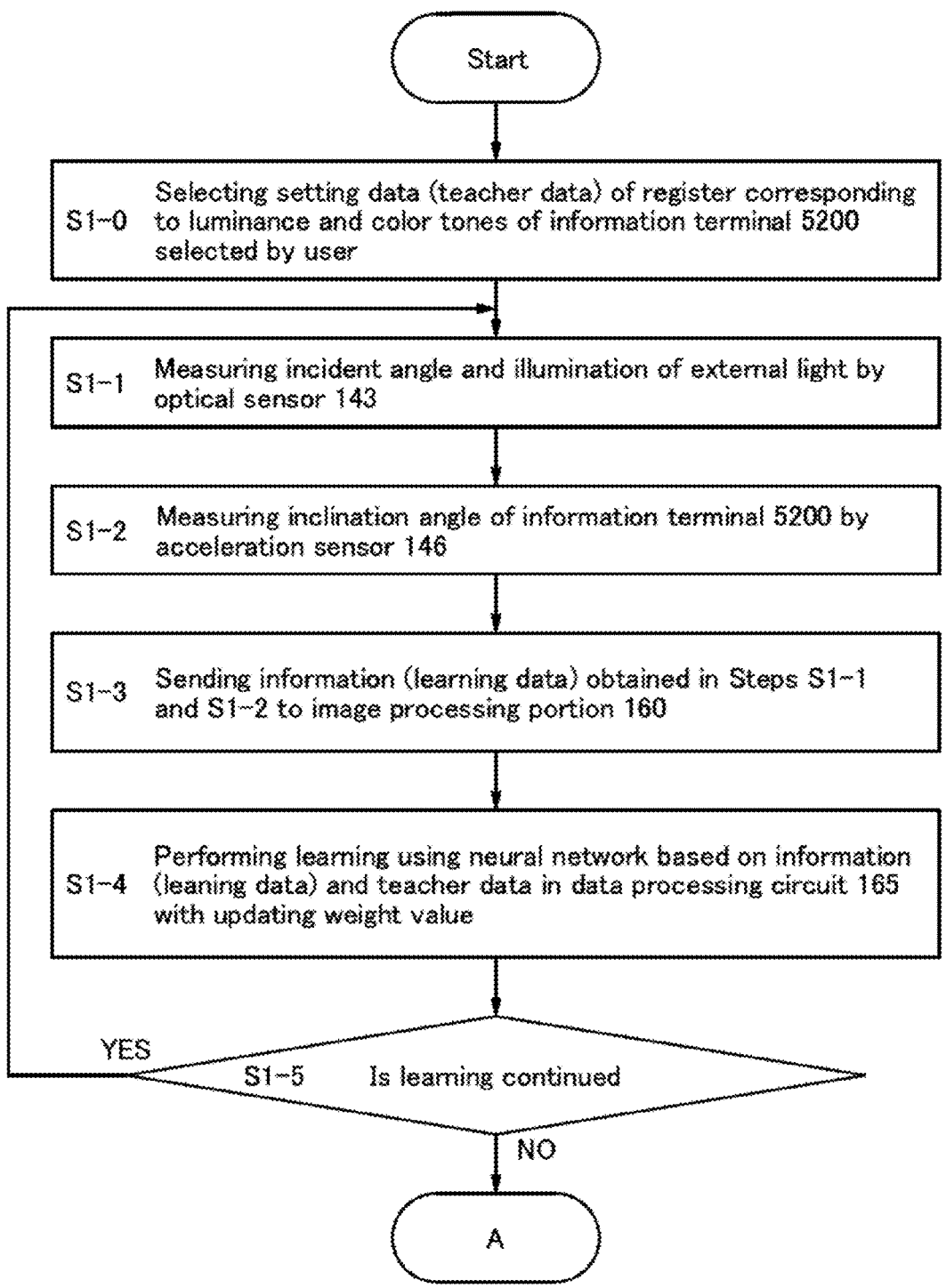
FIG. 16 is a flow chart showing an operation example of an electronic device.
Figure 17:
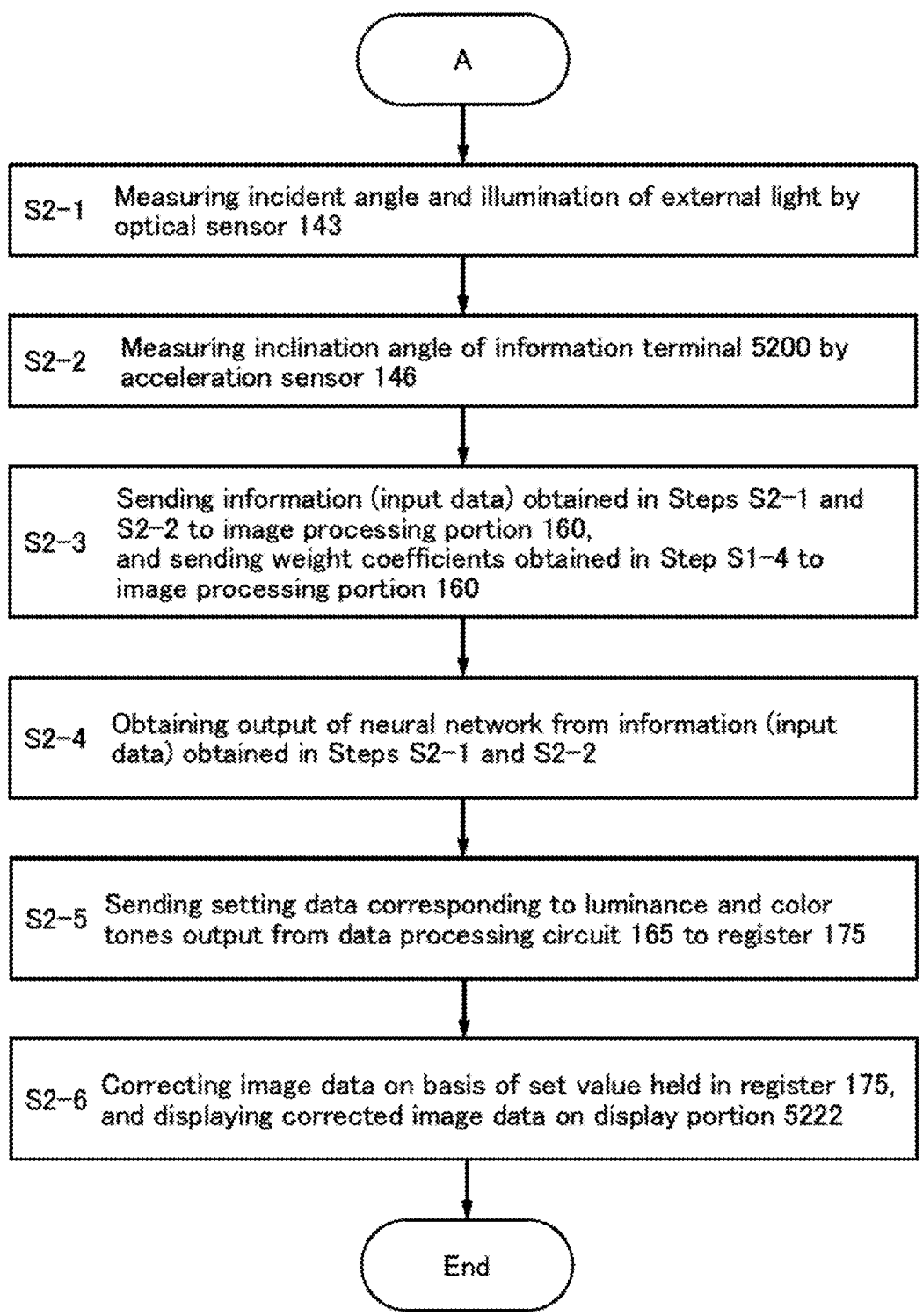
FIG. 17 is a flow chart showing an operation example of an electronic device.

FIG. 16 and FIG. 17 are flow charts showing the operation example. The luminance and color tone of the hybrid display device are adjusted through Steps S1-0 to S1-5 and Steps S2-1 to S2-6. Steps S1-0 to S1-5 are an operation process for learning in the neural network, and Steps S2-1 to S2-6 are an operation process for outputting optimal luminance and color tone through the neural network. The hybrid display device in this embodiment is the information terminal 5200 including a touch panel.

<Learning>

In Step S1-0, a user operates the information terminal 5200 to select the luminance and color tone of the display portion 5222 of the information terminal 5200 that suit his or her preference, thereby indirectly selecting setting data of a register corresponding to the luminance and color tone. The setting data of the register is handled as teacher data in an information processing system using the neural network described in Embodiment 3. The setting data includes a set value corresponding to the luminance and color tone of image data to be displayed by the reflective element 10a and a set value corresponding to the luminance and color tone of image data to be displayed by the light-emitting element 10b.

Specifically, the user selects luminance and color tone with the touch sensor unit 120 included in the display portion 5222 in accordance with his or her preference. The operation with the touch sensor unit 120 allows an instruction to read the setting data (teacher data) of the register corresponding to the selected luminance and color tone meeting his or her preference to be sent via the touch sensor controller 184 and the interface 150. The setting data (teacher data) corresponding to the selected luminance and color tone meeting his or her preference is read from a memory device included in the controller IC 115 or a memory device included in the host 140, for example.

The setting data (teacher data) of the register that is read from the memory device is sent to the image processing portion 160. In the case where the setting data (teacher data) is sent from the host 140, it may be sent to the image processing portion 160 via the interface 150 and the controller 154. In the case where the setting data (teacher data) is sent from the memory device included in the controller IC 115, it may be directly sent to the image processing portion 160. In the case where the setting data (teacher data) of the register is not used soon, it may be temporarily stored in the register 175 or the memory 170, for example.

In Step S1-1, the optical sensor 143 measures the incident angle and illuminance of external light.

In Step S1-2, the acceleration sensor 146 measures the inclination angle of the information terminal 5200.

In Step S1-3, the incident angle and illuminance of external light obtained in Step S1-1 and the inclination angle obtained in Step S1-2 are sent, as learning data to be input to an input layer of the neural network, to the image processing portion 160. Specifically, information about the incident angle and illuminance of external light is sent as a sensor signal from the optical sensor 143 to the sensor controller 153 and then sent to the image processing portion 160 via the controller 154.

The information about the inclination angle of the information terminal 5200 is sent as an electric signal from the acceleration sensor 146 to the sensor controller 153 and then sent to the image processing portion 160 via the controller 154.

In Step S1-4, the incident angle and illuminance of external light obtained in Step S1-1 and the inclination angle obtained in Step S1-2 are input to the data processing circuit 165. Specifically, the incident angle and illuminance of external light and the inclination angle are handled as learning data to be input to neurons of the input layer (first layer) of the neural network in the data processing circuit 165. In this manner, learning using the neural network is performed.

Note that in initial calculation, the initial values of weights of the neural network may be random numbers. However, when the values of weights are the same, all of the weights change in the same manner; therefore, the values of weights are preferably different from each other.

When input data is input to the neurons of the input layer (first layer) of the neural network in the data processing circuit 165, output data is output as a calculation result from the output layer (L-th layer) of the neural network in the data processing circuit 165. In the case where a difference between the output data and the teacher data is out of the allowable range, weight values are updated using the teacher data. Note that for example, backpropagation described in Embodiment 3 can be used to update the weight values.

After the weight values are updated, the incident angle and illuminance of external light and the inclination angle are input to the neurons of the input layer (first layer) of the neural network in the data processing circuit 165 and calculation is performed again. Update of the weight values and calculation using the neural network are repeated until the error between the calculation result (the output data output from the output layer (L-th layer) of the neural network) and the teacher data falls within the allowable range. Note that the allowable range of an error with which calculation is finished does not need to be narrow and may be wide within the allowable range for the user of the information terminal 5200.

Calculation using the neural network is repeatedly performed in this manner, and finally output data having no difference or a small difference from the teacher data is output from the output layer (L-th layer). The weight coefficients included in the neural network at this time are stored in a predetermined memory device so that they can be associated with the set value corresponding to luminance and color tone meeting the user's preference (teacher data), the incident angle and illuminance of external light, and the inclination angle (learning data). Note that the predetermined memory device refers to, for example, the memory device included in the controller IC 115 or the memory device included in the host 140.

Steps S1-0 to S1-4 are performed in the above manner and weight coefficients when no difference or a small difference exists between the teacher data and the output data are obtained, whereby learning using the neural network is completed.

In Step S1-5, whether learning is continued is determined. For example, in the case where the usage environment of the information terminal 5200 changes, learning is preferably performed again in accordance with the environment. In that case, operation is performed from Step S1-1 again; the incident angle and illuminance of external light and the inclination angle of the information terminal 5200 are obtained through Steps S1-1 to S1-3 and learning is performed in Step S1-4. In the case where the setting data of the register corresponding to the luminance and color tone that meet the user's preference (teacher data) is desired to be changed, operation is performed from Step S1-0 again to change the setting data (teacher data) and Step S1-1 and the following steps are performed.

In the case where learning does not need to be continued in Step S1-5, the process proceeds to Step A in FIG. 16. In that case, the process moves on to Step A in the flow chart of FIG. 17 and the processing is continued.

<Acquisition of Luminance and Color Tone>

As in Step S1-1, in Step S2-1, the optical sensor 143 measures the incident angle and illuminance of external light.

As in Step S1-2, in Step S2-2, the acceleration sensor 146 measures the inclination angle of the information terminal 5200.

As in Step S1-3, in Step S2-3, the incident angle and illuminance of external light obtained in Step S2-1 and the inclination angle obtained in Step S2-2 are sent, as data to be input to an input layer of the neural network, to the image processing portion 160.

In Step S2-3, weight coefficients corresponding to the incident angle and illuminance of external light and the inclination angle of the information terminal 5200 that are obtained through Steps S2-1 and S2-2 are read from the predetermined memory device. Specifically, the incident angle and illuminance of external light and the inclination angle of the information terminal 5200 obtained through Steps S2-1 and S2-2 that are coincident with the learning data obtained through Steps S1-1 and S1-2 and stored in the predetermined memory device are searched. After that, the weight coefficients obtained in Step S1-4 that are associated with the learning data obtained through Steps S1-1 and S1-2 are read from the predetermined memory device and sent to the image processing portion 160.

In Step S2-4, the incident angle and illuminance of external light obtained in Step S2-1 and the inclination angle obtained in Step S2-2 are input to the data processing circuit 165. Specifically, the incident angle and illuminance of external light and the inclination angle are handled as input data to be input to neurons of the input layer (first layer) of the neural network in the data processing circuit 165.

Then, the weight coefficients read in the previous step are input to the data processing circuit 165. Specifically, the weight coefficients are set as weights included in the neural network of the data processing circuit 165.

By the above operation, calculation using the neural network is performed, and setting data corresponding to luminance and color tones that meet the user's preference is output from the output layer (L-th layer) of the neural network. Consequently, the setting data meeting the preference of the user of the information terminal 5200 can be acquired. Specifically, the following set values included in the setting data can be acquired: a set value corresponding to luminance and color tones that are reflected on an image to be displayed by the reflective element 10*a* (hereinafter referred to as a set value A); and a set value corresponding to luminance and color tones that are reflected on an image to be displayed by the light-emitting element 10*b* (hereinafter referred to as a set value B).

In Step S2-5, the setting data acquired in Step S2-4 is sent to the register 175 to be held therein.

In Step S2-6, the setting data held in the register 175 is sent to the dimming circuit 162 and the color calibration circuit 163, so that the image data are corrected on the basis of the set values. Since the image data are displayed by the reflective element 10*a* and the light-emitting element 10*b*, correction is performed for each of the image data to be displayed by the elements. That is to say, the image data to be displayed by the reflective element 10*a* is corrected by the set value A, and the image data to be displayed by the light-emitting element 10*b* is corrected by the set value B. The corrected image data are sent to the source driver 180, and subjected to, for example, serial-parallel conversion or digital-analog conversion by the source driver 180. The image data processed by the source driver 180 are sent to the reflective element 10*a* and the light-emitting element 10*b* of the display portion 5222 (display unit 110), and an image is displayed on the display portion 5222 (display unit 110).

Through Steps S1-0 to S1-5 and S2-1 to S2-6, the hybrid display device can display an image whose luminance and color tone are set according to the user's preference.

Note that the operation method of one embodiment of the present invention is not limited to Steps S1-0 to S1-5 and S2-1 to S2-6 described above. In this specification and the like, processings shown in the flow chart are classified into individual steps according to functions. However, it is difficult to classify actual processings or the like shown in the flow chart according to functions; a plurality of steps can relate to one step or one step can relate to a plurality of steps. Thus, the processings shown in the flow chart are not limited to the steps described in this specification and the order of the processings can be changed as appropriate according to circumstances. Specifically, the order of the steps can be changed, another step can be added, or one or more of the steps can be eliminated, according to circumstances or conditions or as needed.

For example, the order of the step of obtaining the incident angle of external light by the optical sensor 143 and the step of obtaining the inclination angle of the information terminal 5200 by the acceleration sensor 146 is not limited to that in the flow chart of FIG. 16. Thus, Step S1-1 and Step S1-2 may be interchanged in the flow chart of FIG. 16.

Furthermore, the information terminal 5200 may store the incident angle and illuminance of external light obtained in Step S2-1, the inclination angle obtained in Step S2-2, and the set values obtained as a result of calculation in Step S2-4 in the predetermined memory device and may read the set values obtained as the result of calculation on the basis of the incident angle, the illuminance, and the inclination angle. With such a configuration, when the incident angle and illuminance of external light obtained in Step S2-1 and the inclination angle obtained in Step S2-2 are coincident with data acquired in the past, the corresponding past set values can be read from the memory device. This can omit calculation using the neural network.

Note that this embodiment can be combined with any of the other embodiments in this specification as appropriate.

Embodiment 5

Figure 18:
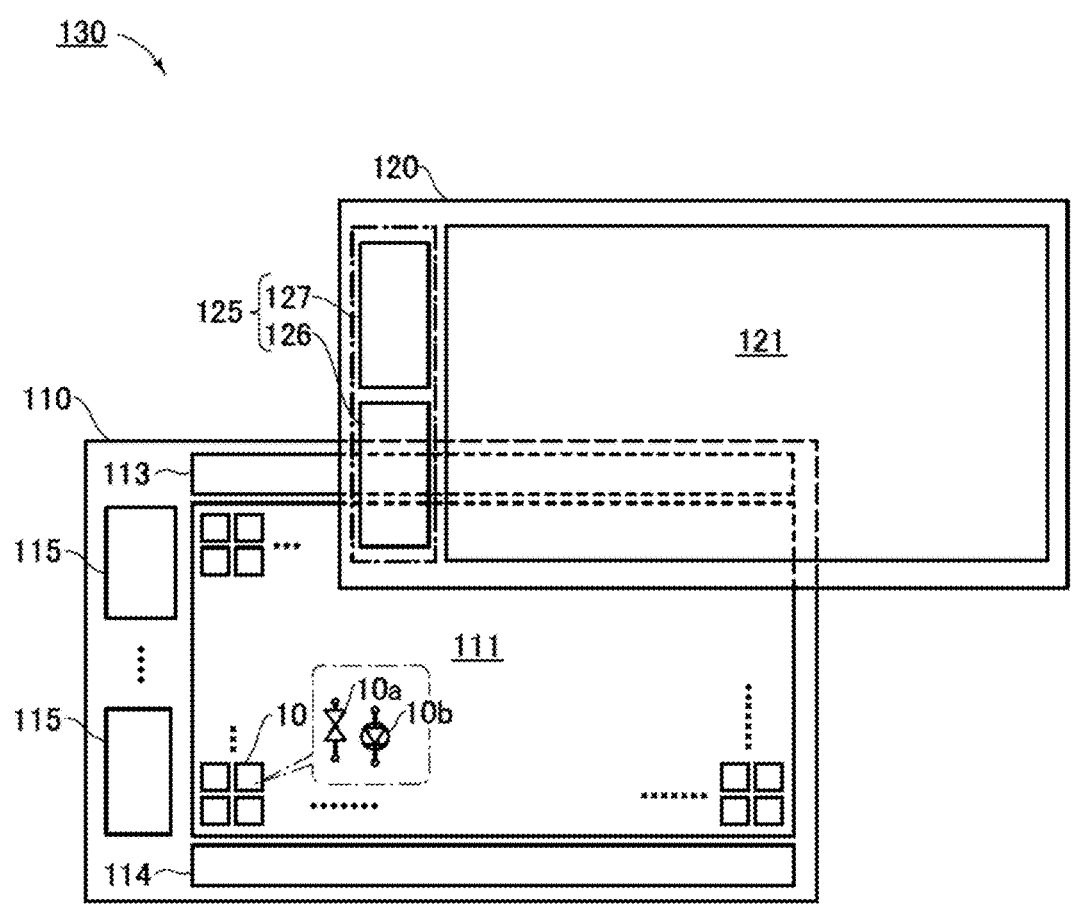
FIG. 18 is a block diagram illustrating a configuration example of a display device.

In this embodiment, the display portion of the hybrid display device described in Embodiment 1 will be described.
<Display Device>
FIG. 18 is a block diagram illustrating a configuration example of the display device. A display device 130 includes the display unit 110 and the touch sensor unit 120. The display device 130 can be used as a component of the display portion 5222 of the information terminal 5200 described in Embodiment 1.
<Display Unit>
The display unit 110 includes a pixel array 111, a gate driver 113, a gate driver 114, and the controller ICs 115 described in Embodiment 2.

The pixel array 111 includes a plurality of pixels 10, and each pixel 10 is an active element driven by a transistor. The pixel 10 includes the reflective element 10a and the light-emitting element 10b. A more specific structure example of the pixel 10 will be described in Embodiment 7.

The gate driver 113 has a function of driving a gate line for selecting the reflective element 10a, and the gate driver 114 has a function of driving a gate line for selecting the light-emitting element 10b. The controller IC 115 is provided with a source driver for driving a source line that supplies a data signal to the reflective element 10a and a source driver for driving a source line that supplies a data signal to the light-emitting element 10b. The controller IC 115 has a function of collectively controlling the operation of the display device 130. The number of controller ICs 115 is determined in accordance with the number of pixels of the pixel array.

Although FIG. 18 illustrates an example in which the gate driver 113 and the gate driver 114 are integrated together with the pixel array 111 over the same substrate, the gate driver 113 and the gate driver 114 can be dedicated ICs. Alternatively, the gate driver 113 or the gate driver 114 may be incorporated in the controller ICs 115.

Although the controller IC 115 is mounted by a chip on glass (COG) method here, there is no particular limitation on the mounting method, and a chip on film (COF) method, a tape automated bonding (TAB) method, or the like may be employed. The same applies to a method for mounting an IC on the touch sensor unit 120.

Note that the transistor used for the pixel 10 is a transistor including an oxide semiconductor in a channel formation region, which has a lower off-state current than a Si transistor. The off-state current of an OS transistor can be extremely low by reducing the concentration of impurities in an oxide semiconductor to make the oxide semiconductor intrinsic or substantially intrinsic. In particular, an oxide semiconductor included in a channel formation region is preferably a CAC-OS which will be described in Embodiment 14.

Note that a transistor used for the pixel 10 does not necessarily include an oxide semiconductor as long as the off-state current of the transistor is low. For example, a transistor including a wide-bandgap semiconductor may be used. The wide-bandgap semiconductor is a semiconductor whose bandgap is 2.2 eV or greater. Examples of the wide-bandgap semiconductor include silicon carbide, gallium nitride, and diamond.

By using the transistor having a low off-state current for the pixel 10, the gate driver 113, the gate driver 114, and the source driver can be temporarily stopped (hereinafter the temporary stop is referred to as "idling stop" or "IDS driving") in the case where rewriting of a display screen is not necessary, that is, a still image is displayed. Power consumption of the display device 130 can be reduced by IDS driving.
<Touch Sensor Unit>
The touch sensor unit 120 in FIG. 18 includes a sensor array 121 and a peripheral circuit 125. The peripheral circuit 125 includes a TS driver 126 and a sensing circuit 127. The peripheral circuit 125 can be composed of a dedicated IC.

Figure 19:
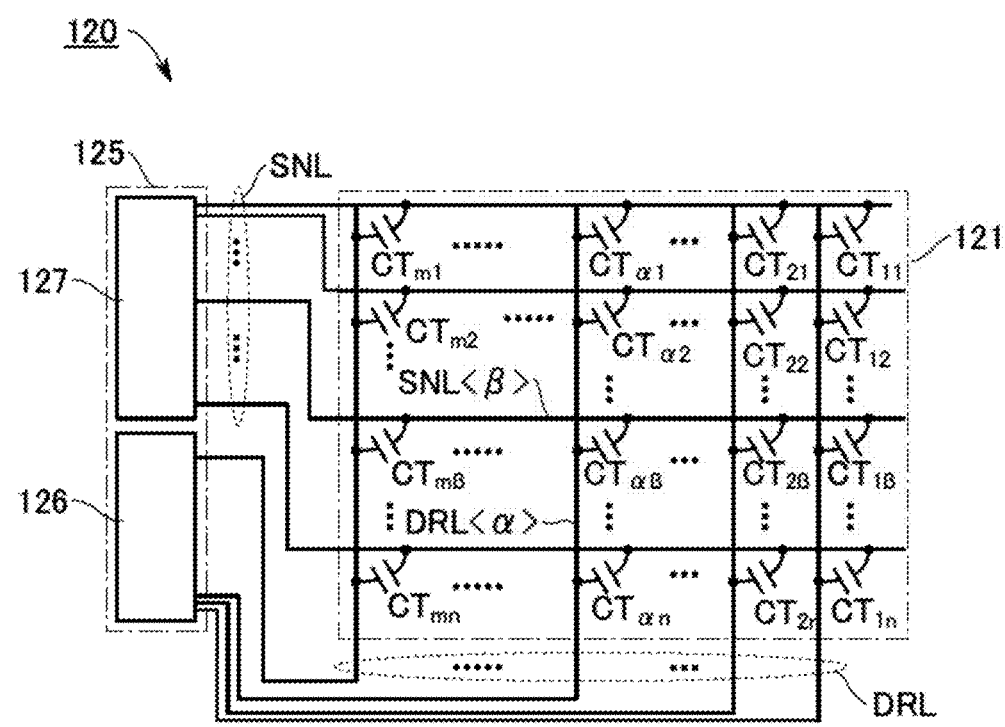
FIG. 19 is a circuit diagram illustrating a configuration example of a touch sensor unit.

FIG. 19 illustrates a configuration example of the touch sensor unit 120. Here, the touch sensor unit 120 is a mutual capacitive touch sensor unit as an example. The sensor array 121 includes m wirings DRL and n wirings SNL, where m is an integer greater than or equal to 1 and n is an integer greater than or equal to 1. The wiring DRL is a driving line, and the wiring SNL is a sensing line. Here, the a-th wiring DRL is referred to as a wiring DRL<$\alpha$>, and the $\beta$-th wiring SNL is referred to as a wiring SNL<$\beta$>. A capacitor $CT_{\alpha\beta}$ refers to a capacitor formed between the wiring DRL<$\alpha$> and the wiring SNL<$\beta$>.

The m wirings DRL are electrically connected to the TS driver 126. The TS driver 126 has a function of driving each wiring DRL. The n wirings SNL are electrically connected to the sensing circuit 127. The sensing circuit 127 has a function of sensing signals of wirings SNL. A signal of the wiring SNL<$\beta$> at the time when the wiring DRL<$\alpha$> is driven by the TS driver 126 has information about the change amount of capacitance of the capacitor $CT_{\alpha\beta}$. By analysis of signals of n wirings SNL, information about whether touch operation is performed or not, touch position, and the like can be obtained.

This embodiment can be combined with any of the other embodiments in this specification as appropriate.

Embodiment 6

In this embodiment, a structure example of a display device including a reflective element and a light-emitting element is described. Note that a structure example of a display device including a liquid crystal element as the reflective element and including a light-emitting element with an EL material as the light-emitting element is described in this embodiment.

Figure 20A:
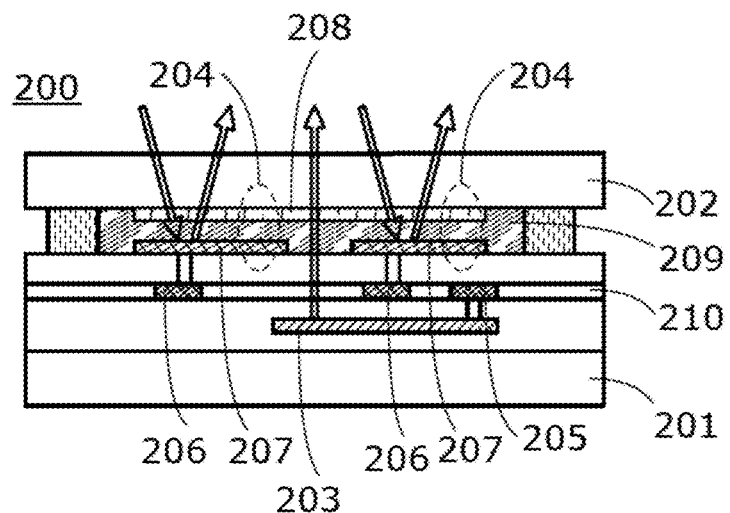
FIGS. 20A and 20B are cross-sectional views each illustrating an example of a display device.

FIG. 20A illustrates an example of a cross-sectional structure of a display device 200 in one embodiment of the present invention. The display device 200 in FIG. 20A includes a light-emitting element 203, a liquid crystal element 204, a transistor 205 having a function of controlling a current supply to the light-emitting element 203, and a transistor 206 having a function of controlling a voltage supply to the liquid crystal element 204. The light-emitting element 203, the liquid crystal element 204, the transistor 205, and the transistor 206 are positioned between a substrate 201 and a substrate 202.

In the display device 200, the liquid crystal element 204 includes a pixel electrode 207, a common electrode 208, and a liquid crystal layer 209. The pixel electrode 207 is electrically connected to the transistor 206. The alignment of the liquid crystal layer 209 is controlled with a voltage supplied between the pixel electrode 207 and the common electrode 208. Note that FIG. 20A illustrates an example where the pixel electrode 207 has a function of reflecting visible light and the common electrode 208 has a function of transmitting visible light. Light entering through the substrate 202 is reflected by the pixel electrode 207 and exits through the substrate 202 again, as indicated by white arrows.

The light-emitting element 203 is electrically connected to the transistor 205. The light-emitting element 203 emits light to the substrate 202 side. Note that since FIG. 20A illustrates the example where the pixel electrode 207 has a function of reflecting visible light and the common electrode 208 has a function of transmitting visible light, light emitted from the light-emitting element 203 passes through a region which does not overlap with the pixel electrode 207, passes through a region where the common electrode 208 is located, and then exits through the substrate 202, as indicated by a white arrow.

In the display device 200 illustrated in FIG. 20A, the transistor 205 and the transistor 206 are located in the same layer 210, and the layer 210 including the transistor 205 and the transistor 206 includes a region positioned between the liquid crystal element 204 and the light-emitting element 203. In the case where at least a semiconductor layer of the transistor 205 and a semiconductor layer of the transistor 206 are located on the same insulating surface, it can be said that the transistor 205 and the transistor 206 are included in the same layer 210.

Owing to the above structure, the transistor 205 and the transistor 206 can be manufactured through a common manufacturing process.

Figure 20B:
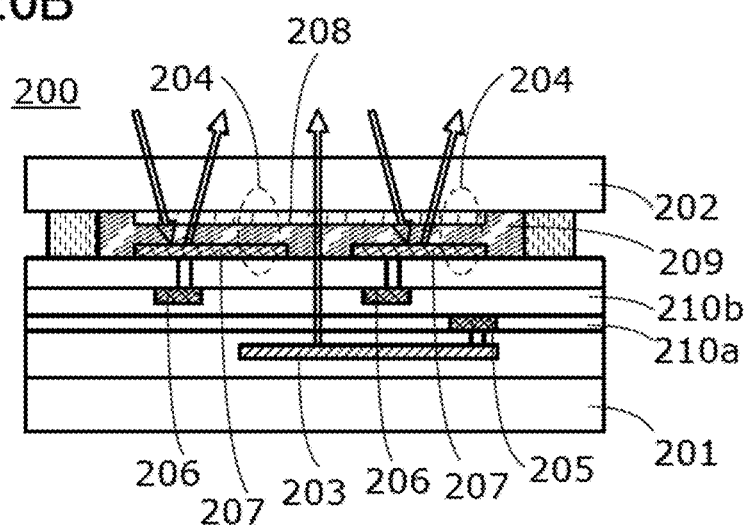

FIG. 20B illustrates an example of a cross-sectional structure of another display device 200 in one embodiment of the present invention. The structure of the display device 200 in FIG. 20B differs from that of the display device 200 in FIG. 20A in that the transistor 205 and the transistor 206 are included in different layers.

Specifically, the display device 200 in FIG. 20B includes a layer 210a which includes the transistor 205 and a layer 210b which includes the transistor 206, and the layer 210a and the layer 210b each include a region positioned between the liquid crystal element 204 and the light-emitting element 203. In the display device 200 illustrated in FIG. 20B, the layer 210a is closer to the light-emitting element 203 than the layer 210b is. In the case where at least a semiconductor layer of the transistor 205 and a semiconductor layer of the transistor 206 are located on different insulating surfaces, it can be said that the transistor 205 and the transistor 206 are included in different layers.

Owing to the above structure, the transistor 205 and a variety of wirings electrically connected to the transistor 205 can partly overlap with the transistor 206 and a variety of wirings electrically connected to the transistor 206. Thus, the size of the pixel can be decreased, and the resolution of the display device 200 can be increased.

Figure 21A:
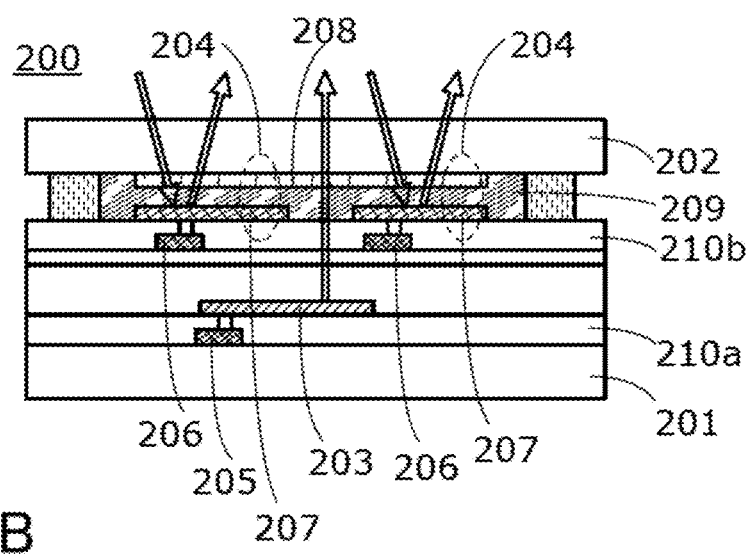
FIGS. 21A and 21B are cross-sectional views each illustrating an example of a display device.

FIG. 21A illustrates an example of a cross-sectional structure of another display device 200 in one embodiment of the present invention. The structure of the display device 200 in FIG. 21A differs from that of the display device 200 in FIG. 20A in that the transistor 205 and the transistor 206 are included in different layers. In addition, the structure of the display device 200 illustrated in FIG. 21A differs from that of the display device 200 in FIG. 20B in that the layer 210a including the transistor 205 is closer to the substrate 201 than the light-emitting element 203 is.

Specifically, the display device 200 in FIG. 21A includes the layer 210a which includes the transistor 205 and the layer 210b which includes the transistor 206. The layer 210a includes a region positioned between the light-emitting element 203 and the substrate 201. The layer 210b includes a region positioned between the liquid crystal element 204 and the light-emitting element 203.

Owing to the above structure, the transistor 205 and a variety of wirings electrically connected to the transistor 205 can overlap with the transistor 206 and a variety of wirings electrically connected to the transistor 206, to a larger extent than in the case of FIG. 20B. Thus, the size of the pixel can be decreased, and the resolution of the display device 200 can be increased.

Figure 21B:
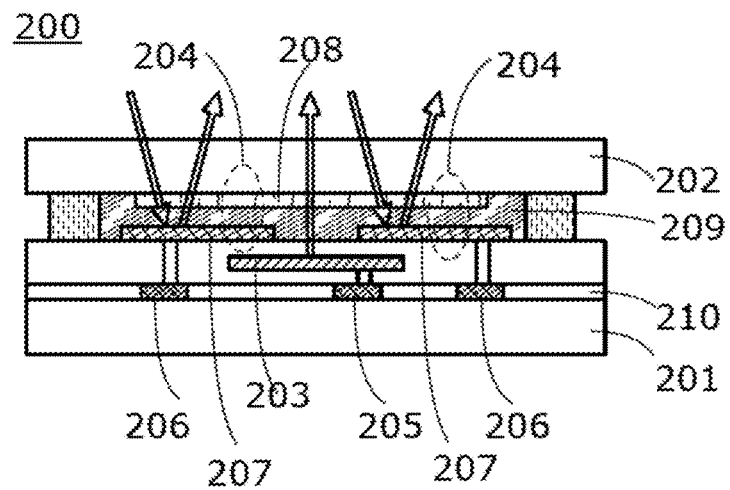

FIG. 21B illustrates an example of a cross-sectional structure of another display device 200 in one embodiment of the present invention. The structure of the display device 200 in FIG. 21B is the same as that of the display device 200 in FIG. 20A in that the transistor 205 and the transistor 206 are included in the same layer. However, the structure of the display device 200 illustrated in FIG. 21B differs from that of the display device 200 in FIG. 20A in that the layer including the transistor 205 and the transistor 206 is closer to the substrate 201 than the light-emitting element 203 is.

Specifically, the display device 200 in FIG. 21B includes the layer 210 which includes the transistor 205 and the transistor 206. The layer 210 includes a region positioned between the light-emitting element 203 and the substrate 201. The liquid crystal element 204 is closer to the substrate 202 than the light-emitting element 203 is.

Owing to the above structure, the transistor 205 and the transistor 206 can be manufactured through a common manufacturing process. A wiring which electrically connects the liquid crystal element 204 and the transistor 206 and a wiring which electrically connects the light-emitting element 203 and the transistor 205 can be provided on the same side of the layer 210. Specifically, the wiring which electrically connects the liquid crystal element 204 and the transistor 206 can be formed over the semiconductor layer of the transistor 206, and the wiring which electrically connects the light-emitting element 203 and the transistor 205 can be formed over the semiconductor layer of the transistor 205. Thus, the manufacturing process can be simpler than that of the display device 200 illustrated in FIG. 20A.

Note that FIGS. 20A and 20B and FIGS. 21A and 21B each illustrate the cross-sectional structure in which one light-emitting element 203 is provided with respect to two liquid crystal elements 204. However, the display device in one embodiment of the present invention may have a cross-sectional structure in which one light-emitting element 203 is provided with respect to one liquid crystal element 204, or may have a cross-sectional structure in which a plurality of light-emitting elements 203 are provided with respect to one liquid crystal element 204.

Although FIGS. 20A and 20B and FIGS. 21A and 21B each illustrate the example where the pixel electrode 207 of the liquid crystal element 204 has a function of reflecting visible light, the pixel electrode 207 may have a function of transmitting visible light. In that case, a light source such as a backlight or a frontlight may be provided in the display device 200, or the light-emitting element 203 may be used as a light source when an image is displayed using the liquid crystal element 204.

This embodiment can be implemented in appropriate combinations with any of the other embodiments.

Embodiment 7

In this embodiment, a configuration example of a pixel of a display device including a reflective element and a light-emitting element is described. Note that a configuration example of a pixel 300 of one embodiment of the present invention in the case of including a liquid crystal element as the reflective element and including a light-emitting element with an EL material as the light-emitting element is described in this embodiment.

Figure 22A:
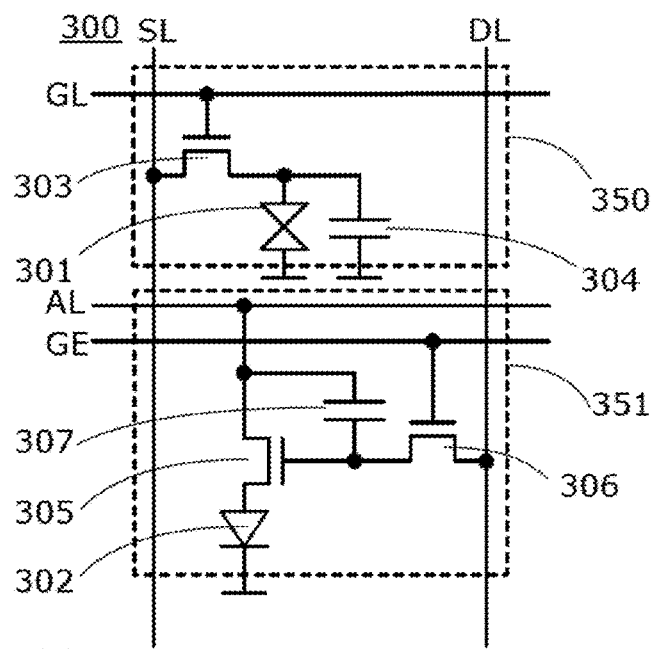
FIGS. 22A and 22B are circuit diagrams each illustrating a configuration example of a pixel circuit.

The pixel 300 illustrated in FIG. 22A includes a pixel 350 and a pixel 351. The pixel 350 includes a liquid crystal element 301, and the pixel 351 includes a light-emitting element 302.

Specifically, the pixel 350 includes the liquid crystal element 301, a transistor 303 having a function of controlling a voltage to be supplied to the liquid crystal element 301, and a capacitor 304. A gate of the transistor 303 is electrically connected to a wiring GL, one of a source and a drain thereof is electrically connected to a wiring SL, and the other of the source and the drain thereof is electrically connected to a pixel electrode of the liquid crystal element 301. A common electrode of the liquid crystal element 301 is electrically connected to a wiring or an electrode to which a predetermined potential is supplied. One electrode of the capacitor 304 is electrically connected to the pixel electrode of the liquid crystal element 301, and the other electrode thereof is electrically connected to a wiring or an electrode to which a predetermined potential is supplied.

Specifically, the pixel 351 includes the light-emitting element 302, a transistor 305 having a function of controlling a current to be supplied to the light-emitting element 302, a transistor 306 having a function of controlling a potential supply to a gate of the transistor 305, and a capacitor 307. A gate of the transistor 306 is electrically connected to a wiring GE, one of a source and a drain thereof is electrically connected to a wiring DL, and the other of the source and the drain thereof is electrically connected to the gate of the transistor 305. One of a source and a drain of the transistor 305 is electrically connected to a wiring AL, and the other of the source and the drain thereof is electrically connected to the light-emitting element 302. One electrode of the capacitor 307 is electrically connected to the wiring AL, and the other electrode thereof is electrically connected to the gate of the transistor 305.

In the pixel 300 illustrated in FIG. 22A, when an image signal for the liquid crystal element 301 is supplied to the wiring SL and an image signal for the light-emitting element 302 is supplied to the wiring DL, the luminance of an image displayed by the liquid crystal element 301 and the luminance of an image displayed by the light-emitting element 302 can be controlled separately.

Although FIG. 22A illustrates a configuration example of the pixel 300 which includes one pixel 350 with the liquid crystal element 301 and one pixel 351 with the light-emitting element 302, the pixel 300 may include a plurality of pixels 350 or a plurality of pixels 351.

Figure 22B:
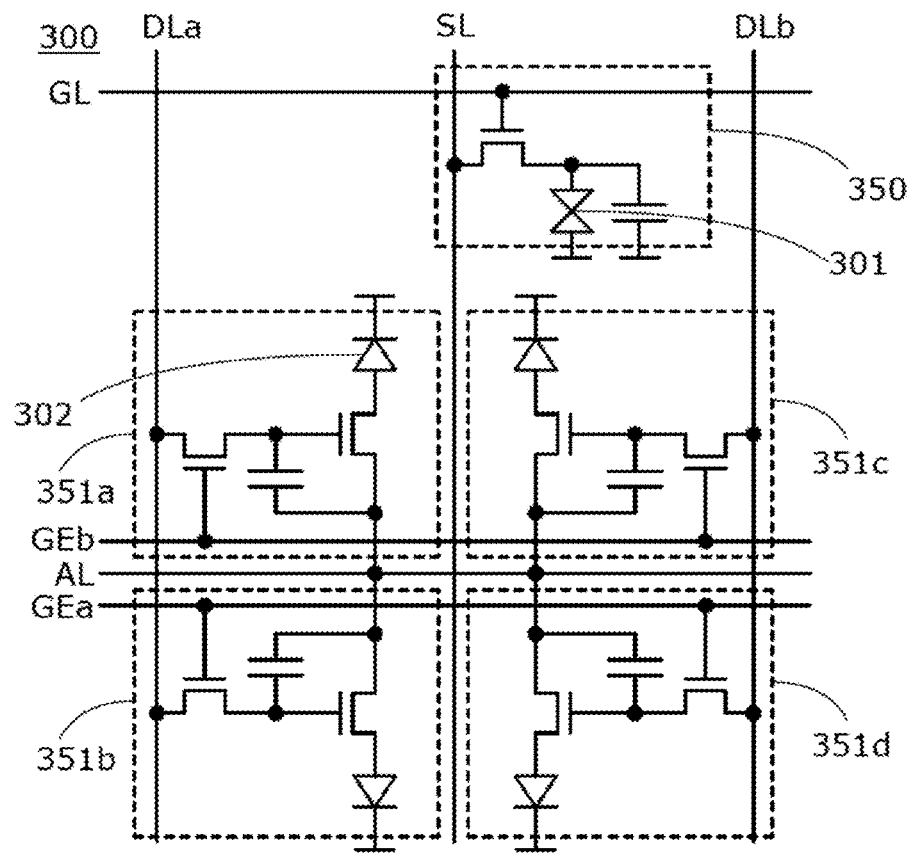

FIG. 22B illustrates a configuration example of the pixel 300 which includes one pixel 350 and four pixels 351.

Specifically, the pixel 300 illustrated in FIG. 22B includes the pixel 350 with the liquid crystal element 301 and pixels 351a to 351d each with the light-emitting element 302.

For the configuration of the pixel 350 in FIG. 22B, the configuration of the pixel 350 in FIG. 22A can be referred to.

Like the pixel 351 in FIG. 22A, the pixels 351a to 351d in FIG. 22B each include the light-emitting element 302, the transistor 305 having a function of controlling a current to be supplied to the light-emitting element 302, the transistor 306 having a function of controlling a potential supply to the gate of the transistor 305, and the capacitor 307. The light-emitting elements 302 of the pixels 351a to 351d emit light having wavelengths in different ranges; thus, the display device can display a color image.

In the pixels 351a to 351d in FIG. 22B, a gate of the transistor 306 included in the pixel 351a and a gate of the transistor 306 included in the pixel 351c are electrically connected to a wiring GEb. A gate of the transistor 306 included in the pixel 351b and a gate of the transistor 306 included in the pixel 351d are electrically connected to a wiring GEa.

In the pixels 351a to 351d in FIG. 22B, one of a source and a drain of the transistor 306 included in the pixel 351a and one of a source and a drain of the transistor 306 included in the pixel 351b are electrically connected to a wiring DLa. One of a source and a drain of the transistor 306 included in the pixel 351c and one of a source and a drain of the transistor 306 included in the pixel 351d are electrically connected to a wiring DLb.

In the pixels 351a to 351d in FIG. 22B, one of a source and a drain of each of the transistors 305 is electrically connected to the wiring AL.

As described above, among the pixels 351a to 351d in FIG. 22B, the pixel 351a and the pixel 351c share the wiring GEb and the pixel 351b and the pixel 351d share the wiring GEa; however, all the pixels 351a to 351d may share one wiring GE. In that case, it is desired that the pixels 351a to 351d are electrically connected to four respective wirings DL.

Figure 23A:
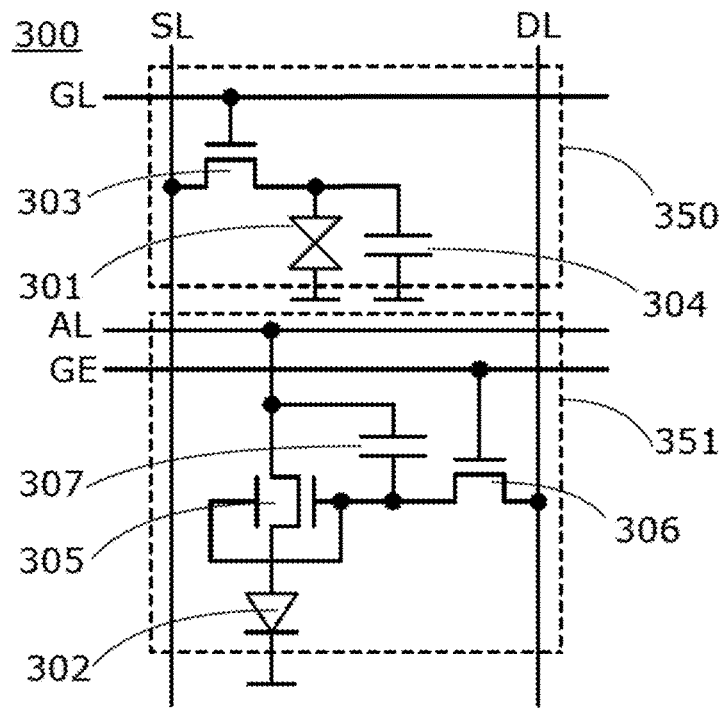
FIGS. 23A and 23B are circuit diagrams each illustrating a configuration example of a pixel circuit.

FIG. 23A illustrates a configuration example of the pixel 300 which is different from that in FIG. 22A. The configuration of the pixel 300 in FIG. 23A differs from that of the pixel 300 in FIG. 22A in that the transistor 305 included in the pixel 351 includes a back gate.

Specifically, in the pixel 300 illustrated in FIG. 23A, the back gate of the transistor 305 is electrically connected to the gate (front gate) thereof. In the pixel 300 in FIG. 23A with the above configuration, a shift of the threshold voltage of the transistor 305 can be reduced, and the reliability of the transistor 305 can be improved. In addition, in the pixel 300 in FIG. 23A with the above configuration, the size of the transistor 305 can be reduced, and the on-state current of the transistor 305 can be increased.

Note that in the display device of one embodiment of the present invention, the pixel 300 may include a plurality of pixels 350 illustrated in FIG. 23A or a plurality of pixels 351 illustrated in FIG. 23A. Specifically, like the pixel 300 in FIG. 22B, the pixel 300 may include one pixel 350 and four pixels 351 illustrated in FIG. 23A. In that case, for connections of a variety of wirings and the four pixels 351, the pixel 300 in FIG. 22B can be referred to.

Figure 23B:
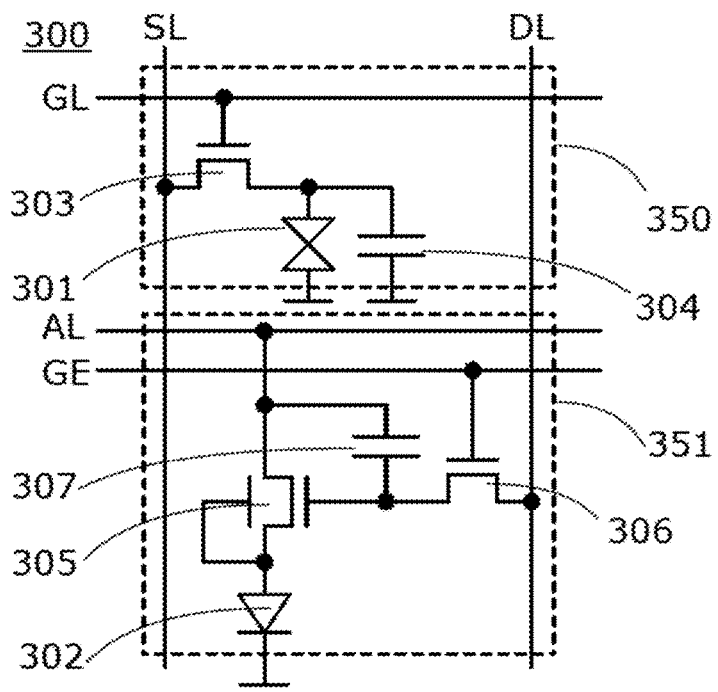

FIG. 23B illustrates a configuration example of the pixel 300 which is different from that in FIG. 22A. The configuration of the pixel 300 in FIG. 23B differs from that of the pixel 300 in FIG. 22A in that the transistor 305 included in the pixel 351 includes a back gate. In addition, the configuration of the pixel 300 in FIG. 23B differs from that of the pixel 300 in FIG. 23A in that the back gate of the transistor 305 is electrically connected to not the gate thereof but the light-emitting element 302.

In the pixel 300 in FIG. 23B with the above configuration, a shift of the threshold voltage of the transistor 305 can be reduced, and the reliability of the transistor 305 can be improved.

Note that in the display device of one embodiment of the present invention, the pixel 300 may include a plurality of pixels 350 illustrated in FIG. 23B or a plurality of pixels 351 illustrated in FIG. 23B. Specifically, like the pixel 300 in FIG. 22B, the pixel 300 may include one pixel 350 and four pixels 351 illustrated in FIG. 23B. In that case, for connections of a variety of wirings and the four pixels 351, the pixel 300 in FIG. 22B can be referred to.

Figure 24:
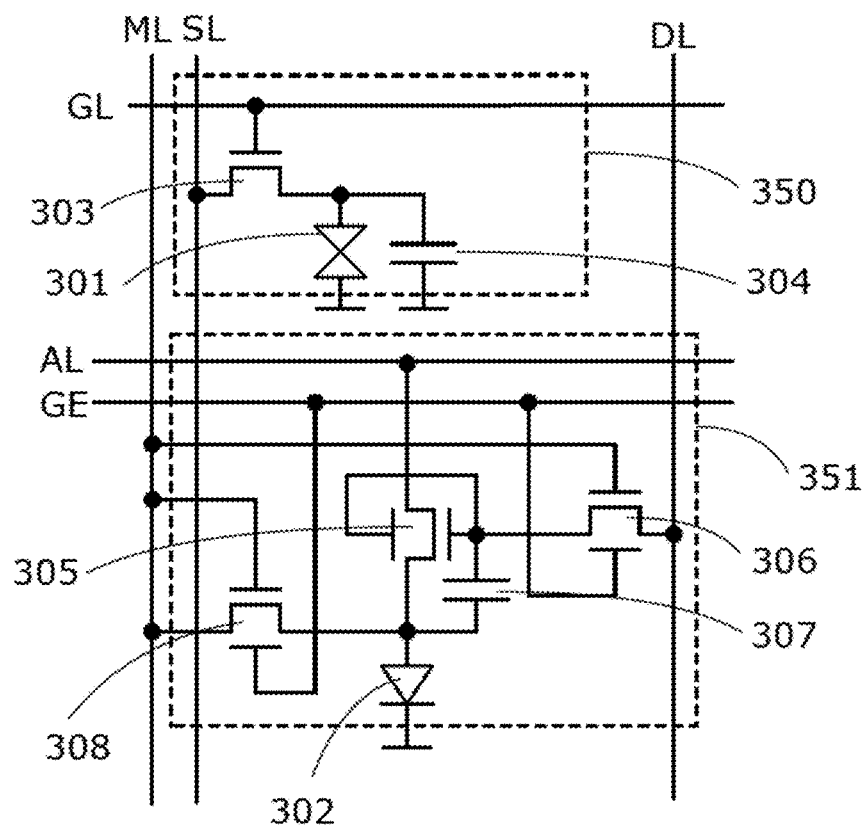
FIG. 24 is a circuit diagram illustrating a configuration example of a pixel circuit.

FIG. 24 illustrates a configuration example of the pixel 300 which is different from that in FIG. 22A. The pixel 300 in FIG. 24 includes the pixel 350 and the pixel 351, and the configuration of the pixel 351 differs from that in FIG. 22A.

Specifically, the pixel 351 in FIG. 24 includes the light-emitting element 302, the transistor 305 having a function of controlling a current to be supplied to the light-emitting element 302, the transistor 306 having a function of controlling a potential supply to the gate of the transistor 305, a transistor 308 having a function of supplying a predetermined potential to the pixel electrode of the light-emitting element 302, and the capacitor 307. The transistor 305, the transistor 306, and the transistor 308 each include a back gate.

A gate (front gate) of the transistor 306 is electrically connected to a wiring ML, the back gate thereof is electrically connected to the wiring GE, one of a source and a drain thereof is electrically connected to the wiring DL, and the other of the source and the drain thereof is electrically connected to the gate and the back gate of the transistor 305. One of a source and a drain of the transistor 305 is electrically connected to the wiring AL, and the other of the source and the drain thereof is electrically connected to the light-emitting element 302.

A gate (front gate) of the transistor 308 is electrically connected to the wiring ML, the back gate thereof is electrically connected to the wiring GE, one of a source and a drain thereof is electrically connected to the wiring ML, and the other of the source and the drain thereof is electrically connected to the light-emitting element 302. One electrode of the capacitor 307 is electrically connected to the light-emitting element 302, and the other electrode thereof is electrically connected to the gate of the transistor 305.

Although FIG. 24 illustrates a configuration example of the pixel 300 which includes one pixel 350 with the liquid crystal element 301 and one pixel 351 with the light-emitting element 302, the pixel 300 may include a plurality of pixels 350 or a plurality of pixels 351.

Figure 25:
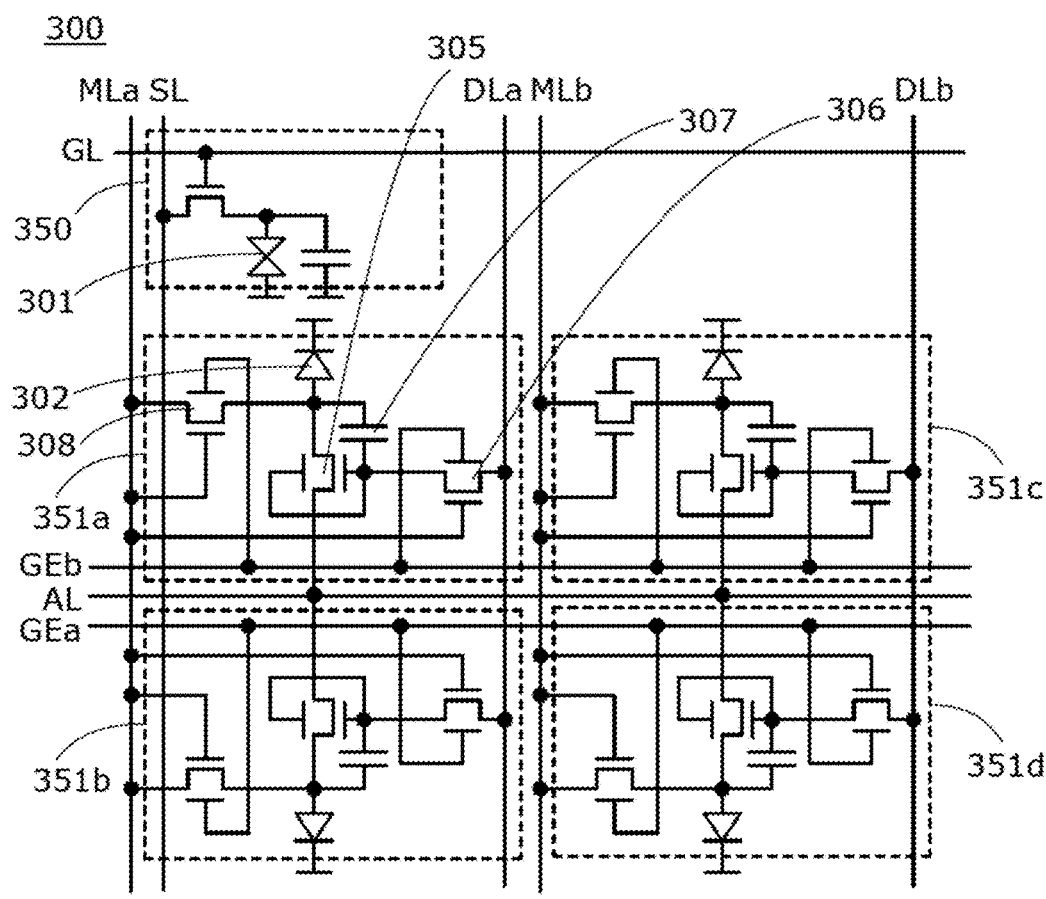
FIG. 25 is a circuit diagram illustrating a configuration example of a pixel circuit.

FIG. 25 illustrates a configuration example of the pixel 300 which includes one pixel 350 and four pixels 351.

Specifically, the pixel 300 illustrated in FIG. 25 includes the pixel 350 with the liquid crystal element 301 and pixels 351a to 351d each with the light-emitting element 302.

For the configuration of the pixel 350 in FIG. 25, the configuration of the pixel 350 in FIG. 24 can be referred to.

Like the pixel 351 in FIG. 24, the pixels 351a to 351d in FIG. 25 each include the light-emitting element 302, the transistor 305 having a function of controlling a current supply to the light-emitting element 302, the transistor 306 having a function of controlling a potential supply to the gate of the transistor 305, the transistor 308 having a function of supplying a predetermined potential to the pixel electrode of the light-emitting element 302, and the capacitor 307. The light-emitting elements 302 of the pixels 351a to 351d emit light having wavelengths in different ranges; thus, the display device can display a color image.

In the pixels 351a to 351d in FIG. 25, a gate of the transistor 306 included in the pixel 351a and a gate of the transistor 306 included in the pixel 351b are electrically connected to a wiring MLa. A gate of the transistor 306 included in the pixel 351c and a gate of the transistor 306 included in the pixel 351d are electrically connected to a wiring MLb.

In the pixels 351a to 351d in FIG. 25, a back gate of the transistor 306 included in the pixel 351a and a back gate of the transistor 306 included in the pixel 351c are electrically connected to the wiring GEb. A back gate of the transistor 306 included in the pixel 351b and a back gate of the transistor 306 included in the pixel 351d are electrically connected to the wiring GEa.

In the pixels 351a to 351d in FIG. 25, one of a source and a drain of the transistor 306 included in the pixel 351a and one of a source and a drain of the transistor 306 included in the pixel 351b are electrically connected to the wiring DLa. One of a source and a drain of the transistor 306 included in the pixel 351c and one of a source and a drain of the transistor 306 included in the pixel 351d are electrically connected to the wiring DLb.

In the pixels 351a to 351d in FIG. 25, a back gate of the transistor 308 included in the pixel 351a and a back gate of the transistor 308 included in the pixel 351c are electrically connected to the wiring GEb. A back gate of the transistor 308 included in the pixel 351b and a back gate of the transistor 308 included in the pixel 351d are electrically connected to the wiring GEa.

In the pixels 351a to 351d in FIG. 25, a gate (front gate) and one of a source and a drain of the transistor 308 included in the pixel 351a are electrically connected to the wiring MLa, and a gate (front gate) and one of a source and a drain of the transistor 308 included in the pixel 351b are electrically connected to the wiring MLa. A gate (front gate) and one of a source and a drain of the transistor 308 included in the pixel 351c are electrically connected to the wiring MLb, and a gate (front gate) and one of a source and a drain of the transistor 308 included in the pixel 351d are electrically connected to the wiring MLb.

In the pixels 351a to 351d in FIG. 25, one of a source and a drain of each of the transistors 305 is electrically connected to the wiring AL.

As described above, among the pixels 351a to 351d in FIG. 25, the pixel 351a and the pixel 351c share the wiring GEb and the pixel 351b and the pixel 351d share the wiring GEa; however, all the pixels 351a to 351d may share one wiring GE. In that case, it is desired that the pixels 351a to 351d are electrically connected to four respective wirings DL.

Note that in the case where a transistor with a low off-state current is used in the pixel 350 and thus there is no need to rewrite the display screen (i.e., in the case of displaying a still image), a driver circuit can be temporarily stopped (this driving is hereinafter referred to as "idling stop" or "IDS driving"). By IDS driving, the power consumption of the display device 200 can be reduced.

This embodiment can be implemented in appropriate combinations with any of the other embodiments.

Embodiment 8

In this embodiment, using the display device 200 illustrated in FIG. 21A as an example, a specific structure example of the display device 200 including a reflective element and a light-emitting element will be described.

Figure 26:
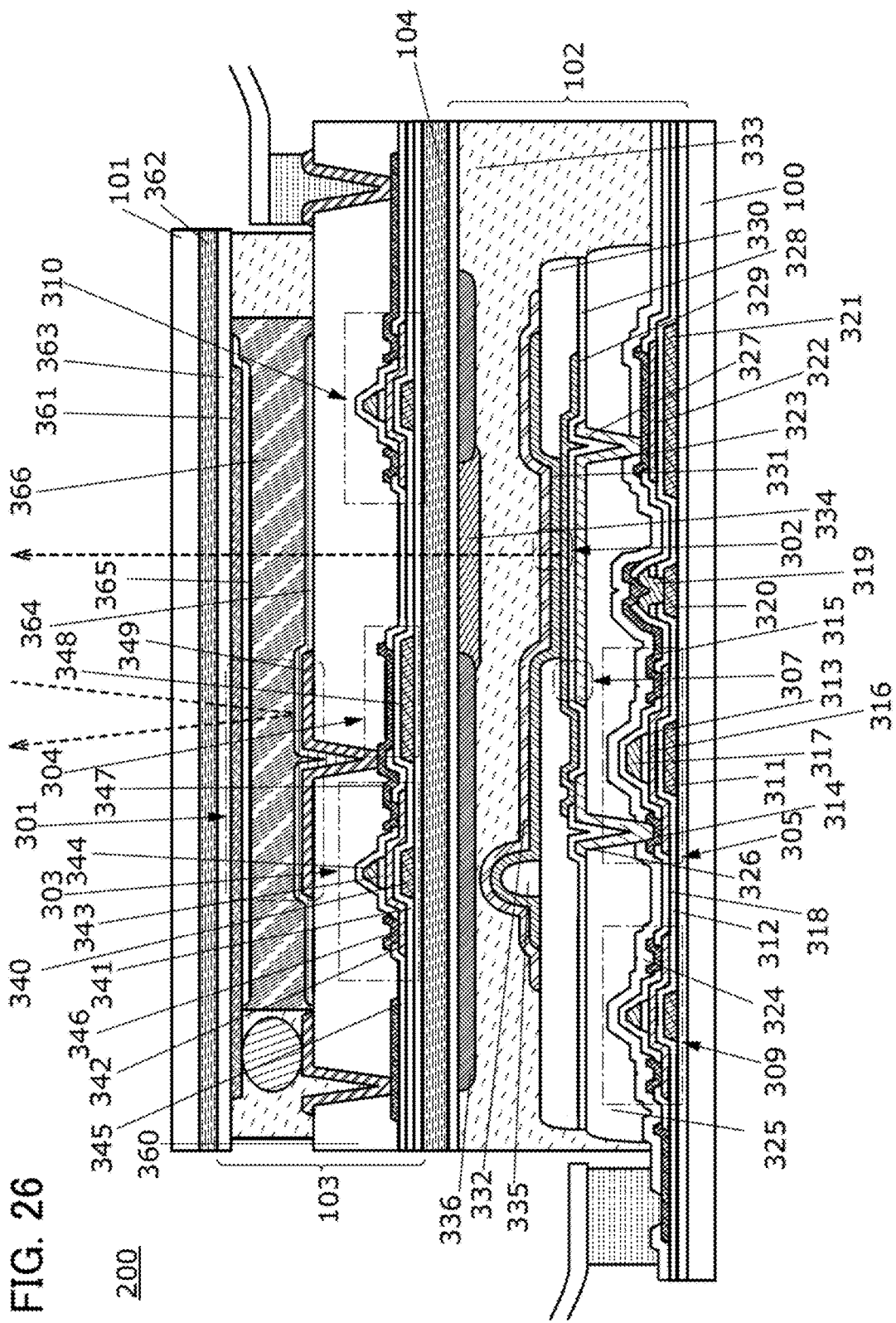
FIG. 26 is a cross-sectional view illustrating an example of a display device.

FIG. 26 illustrates an example of a cross-sectional structure of the display device 200.

The display device 200 illustrated in FIG. 26 has a structure in which a display portion 102 and a display portion 103 are stacked between a substrate 100 and a substrate 101. Specifically, the display portion 102 and the display portion 103 are bonded to each other with a bonding layer 104 in FIG. 26.

In addition, the light-emitting element 302, the transistor 305, and the capacitor 307 included in the pixel of the display portion 102, and a transistor 309 included in a driver circuit of the display portion 102 are illustrated in FIG. 26. Furthermore, the liquid crystal element 301, the transistor 303, and the capacitor 304 included in the pixel of the display portion 103, and a transistor 310 included in a driver circuit of the display portion 103 are illustrated in FIG. 26.

The transistor 305 includes a conductive layer 311 functioning as a back gate, an insulating layer 312 over the conductive layer 311, a semiconductor layer 313 which is provided over the insulating layer 312 to overlap with the conductive layer 311, an insulating layer 316 over the semiconductor layer 313, a conductive layer 317 which functions as a gate and is positioned over the insulating layer 316, and conductive layers 314 and 315 which are positioned over an insulating layer 318 over the conductive layer 317 and electrically connected to the semiconductor layer 313.

The conductive layer 315 is electrically connected to a conductive layer 319. The conductive layer 319 is electrically connected to a conductive layer 320. The conductive layer 319 is formed in the same layer as the conductive layer 317. The conductive layer 320 is formed in the same layer as the conductive layer 311.

A conductive layer 321 which functions as a back gate of the transistor 306 (not illustrated) is positioned in the same layer as the conductive layers 311 and 320. The insulating layer 312 is positioned over the conductive layer 321. A semiconductor layer 322 which includes a region overlapping with the conductive layer 321 is positioned over the insulating layer 312. The semiconductor layer 322 includes a channel formation region of the transistor 306 (not illustrated). The insulating layer 318 is positioned over the semiconductor layer 322. A conductive layer 323 is positioned over the insulating layer 318. The conductive layer 323 is electrically connected to the semiconductor layer 322. The conductive layer 323 functions as a source or a drain of the transistor 306 (not illustrated).

Since the transistor 309 has a structure similar to that of the transistor 305, detailed description thereof is omitted.

An insulating layer 324 is positioned over the transistor 305, the conductive layer 323, and the transistor 309. An insulating layer 325 is positioned over the insulating layer 324. A conductive layer 326 and a conductive layer 327 are positioned over the insulating layer 325. The conductive layer 326 is electrically connected to the conductive layer 314. The conductive layer 327 is electrically connected to the conductive layer 323. An insulating layer 328 is positioned over the conductive layer 326 and the conductive layer 327. A conductive layer 329 is positioned over the insulating layer 328. The conductive layer 329 is electrically connected to the conductive layer 326 and functions as a pixel electrode of the light-emitting element 302.

A region where the conductive layer 327, the insulating layer 328, and the conductive layer 329 overlap with one another functions as the capacitor 307.

An insulating layer 330 is positioned over the conductive layer 329. An EL layer 331 is positioned over the insulating layer 330. A conductive layer 332 functioning as a counter electrode is positioned over the EL layer 331. The conductive layer 329, the EL layer 331, and the conductive layer 332 are electrically connected to one another in an opening of the insulating layer 330. A region where the conductive layer 329, the EL layer 331, and the conductive layer 332 are electrically connected to one another functions as the light-emitting element 302. The light-emitting element 302 has a top emission structure in which light is emitted from the conductive layer 332 side toward a direction shown by an arrow of a broken line.

One of the conductive layer 329 and the conductive layer 332 functions as an anode, and the other thereof functions as a cathode. When a voltage higher than the threshold voltage of the light-emitting element 302 is supplied between the conductive layer 329 and the conductive layer 332, holes are injected to the EL layer 331 from the anode side and electrons are injected to the EL layer 331 from the cathode side. The injected electrons and holes are recombined in the EL layer 331 and a light-emitting substance contained in the EL layer 331 emits light.

Note that when an oxide semiconductor is used for each of the semiconductor layers 313 and 322, it is preferable that an insulating material containing oxygen be used for the insulating layer 318 and that a material in which an impurity such as water or hydrogen is less likely to diffuse be used for the insulating layer 324 in order to increase the reliability of the display device.

In the case where an organic material is used for the insulating layer 325 or the insulating layer 330, when the insulating layer 325 or the insulating layer 330 is exposed at an end portion of the display device, an impurity such as moisture might enter the light-emitting element 302 or the like from the outside of the display device through the insulating layer 325 or the insulating layer 330. Deterioration of the light-emitting element 302 due to the entry of an impurities can lead to deterioration of the display device. Thus, as illustrated in FIG. 26, it is preferable that neither the insulating layer 325 nor the insulating layer 330 be positioned at the end portion of the display device.

The light-emitting element 302 overlaps with a coloring layer 334 with a bonding layer 333 positioned therebetween. A spacer 335 and a light-blocking layer 336 overlap with each other with the bonding layer 333 positioned therebetween. Although FIG. 26 illustrates the case where a space is provided between the conductive layer 332 and the light-blocking layer 336, the conductive layer 332 and the light-blocking layer 336 may be in contact with each other.

The coloring layer 334 is a colored layer that transmits light in a specific wavelength range. For example, a color filter that transmits light in a specific wavelength range, such as red, green, blue, or yellow light, can be used.

Note that one embodiment of the present invention is not limited to a color filter method, and a separate coloring method, a color conversion method, a quantum dot method, and the like may be employed.

The transistor 303 in the display portion 103 includes a conductive layer 340 functioning as a back gate, an insulating layer 341 over the conductive layer 340, a semiconductor layer 342 which is provided over the insulating layer 341 to overlap with the conductive layer 340, an insulating layer 343 over the semiconductor layer 342, a conductive layer 344 which functions as a gate and is positioned over the insulating layer 343, and conductive layers 346 and 347 which are positioned over an insulating layer 345 over the conductive layer 344 and electrically connected to the semiconductor layer 342.

A conductive layer 348 is positioned in the same layer as the conductive layer 340. The insulating layer 341 is positioned over the conductive layer 348. The conductive layer 347 is positioned over the insulating layer 341 to overlap with the conductive layer 348. A region where the conductive layer 347, the insulating layer 341, and the conductive layer 348 overlap with one another functions as the capacitor 304.

Since the transistor 310 has a structure similar to that of the transistor 303, detailed description thereof is omitted.

An insulating layer 360 is positioned over the transistor 303, the capacitor 304, and the transistor 310. A conductive layer 349 is positioned over the insulating layer 360. The conductive layer 349 is electrically connected to the conductive layer 347 and functions as a pixel electrode of the liquid crystal element 301. An alignment film 364 is positioned over the conductive layer 349.

A conductive layer 361 functioning as a common electrode is provided over the substrate 101. Specifically, in FIG. 26, an insulating layer 363 is attached so as to be positioned over the substrate 101 with a bonding layer 362 positioned therebetween, and the conductive layer 361 is positioned on the insulating layer 363. Furthermore, an alignment film 365 is positioned on the conductive layer 361, and a liquid crystal layer 366 is positioned between the alignment film 364 and the alignment film 365.

In FIG. 26, the conductive layer 349 has a function of reflecting visible light, and the conductive layer 361 has a function of transmitting visible light; accordingly, light entering through the substrate 101 can be reflected by the conductive layer 349 and then exits through the substrate 101, as shown by an arrow of a broken line.

For example, a material containing one of indium (In), zinc (Zn), and tin (Sn) is preferably used for the conductive material that transmits visible light. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, and zinc oxide containing gallium are given, for example. Note that a film including graphene can be used as well. The film including graphene can be formed, for example, by reducing a film containing graphene oxide.

Examples of a conductive material that reflects visible light include aluminum, silver, and an alloy including any of these metal elements. Furthermore, a metal material such as gold, platinum, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (also referred to as Ag—Pd—Cu or APC), or an alloy of silver and magnesium may be used.

Although the structure of the display device including a top-gate transistor with a back gate is illustrated in FIG. 26, the display device of one embodiment of the present invention may include a transistor without a back gate or a transistor including a back gate.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

As the semiconductor material used for the transistor, an oxide semiconductor can be used. Typically, an oxide semiconductor containing indium can be used. Especially, the oxide semiconductor used for the transistor is preferably a CAC-OS which will be described in Embodiment 14.

In particular, a semiconductor material having a wider band gap and a lower carrier density than silicon is preferably used because the off-state current of the transistor can be reduced.

The semiconductor layer preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistors including the oxide semiconductor, the oxide semiconductor preferably contains a stabilizer in addition to In, Zn and M.

Examples of the stabilizer, including the metals that can be used as M, are gallium, tin, hafnium, aluminum, and zirconium. Other examples of the stabilizer are lanthanoid such as lanthanum, cerium, praseodymium, neodymium, samarium, europium, gadolinium, terbium, dysprosium, holmium, erbium, thulium, ytterbium, and lutetium.

As an oxide semiconductor included in the semiconductor layer, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no limitation on the ratio of In:Ga:Zn. The In—Ga—Zn-based oxide may contain another metal element in addition to In, Ga, and Zn.

Note that although the structure of the display device in which a liquid crystal element is used as a reflective element is exemplified in this embodiment, a microelectromechanical systems (MEMS) shutter element, an optical interference type MEMS element, a display element using a microcapsule method, an electrophoretic method, an electrowetting method, an Electronic Liquid Powder (registered trademark) method, or the like can also be used as a reflective element, other than a liquid crystal element.

As the light-emitting element, a self-luminous light-emitting element such as an organic light-emitting diode (OLED), a light-emitting diode (LED), and a quantum-dot light-emitting diode (QLED) can be used.

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes; for example, other than the VA mode, a twisted nematic (TN) mode, an in-plane switching (IPS) mode, a fringe field switching (FFS) mode, an axially symmetric aligned microcell (ASM) mode, an optically compensated birefringence (OCB) mode, a ferroelectric liquid crystal (FLC) mode, or an antiferroelectric liquid crystal (AFLC) mode can be used.

As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either a positive liquid crystal or a negative liquid crystal may be used, and an appropriate liquid crystal material can be used depending on the mode or design to be used.

An alignment film can be provided to adjust the alignment of liquid crystal. In the case where a horizontal electric field mode is employed, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and has optical isotropy. In addition, the liquid crystal composition which includes liquid crystal exhibiting a blue phase and a chiral material does not need alignment treatment and has small viewing angle dependence. An alignment film is not necessarily provided and rubbing treatment is thus not necessary; accordingly, electrostatic discharge damage caused by the rubbing treatment can be prevented and defects and damage of the liquid crystal display device in the manufacturing process can be reduced.

This embodiment can be implemented in appropriate combinations with any of the other embodiments.

Embodiment 9

Figure 27A:
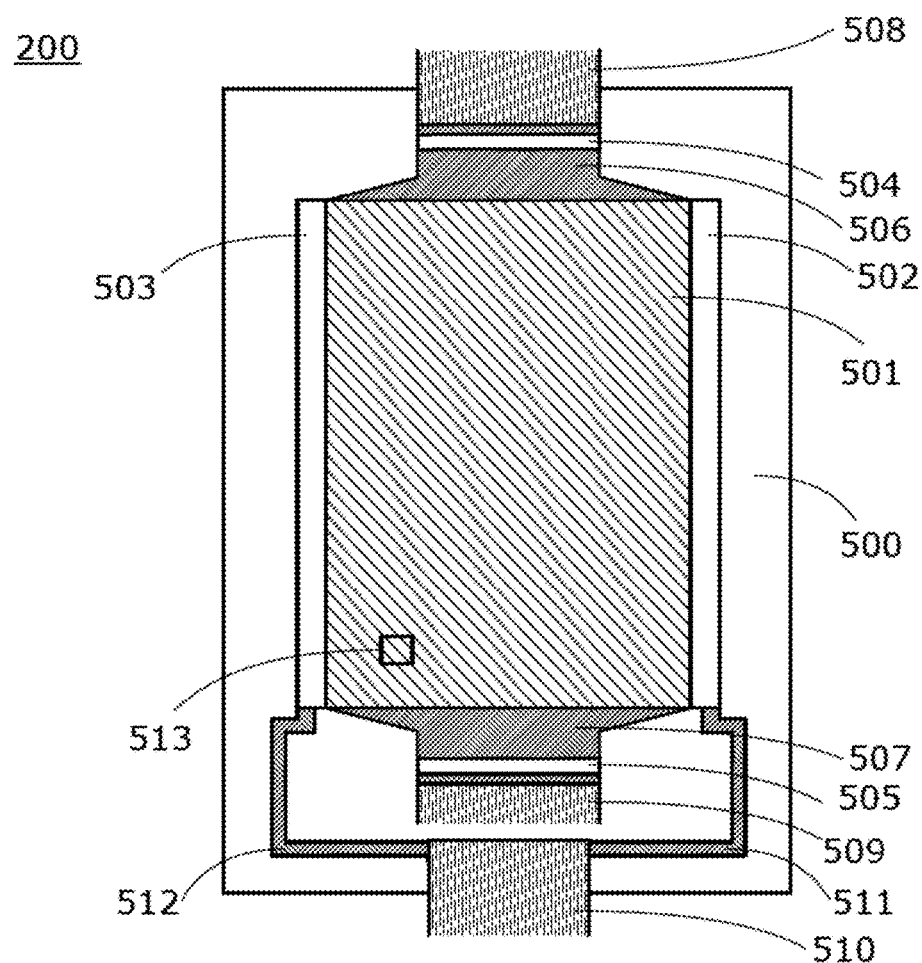
FIG. 27A is a top view of a display device.

FIG. 27A illustrates an example of the appearance of a display device 200 of one embodiment of the present invention. The display device 200 in FIG. 27A includes a pixel portion 501 over a substrate 500, a scan line driver circuit 502 for pixels including reflective elements, and a scan line driver circuit 503 for pixels including light-emitting elements. An IC 504 includes a signal line driver circuit for the pixels including reflective elements, and is electrically connected to the pixel portion 501 through a wiring 506. An IC 505 includes a signal line driver circuit for the pixels including light-emitting elements, and is electrically connected to the pixel portion 501 through a wiring 507.

An FPC 508 is electrically connected to the IC 504, and an FPC 509 is electrically connected to the IC 505. An FPC 510 is electrically connected to the scan line driver circuit 502 through a wiring 511. The FPC 510 is also electrically connected to the scan line driver circuit 503 through a wiring 512.

Figure 27B:
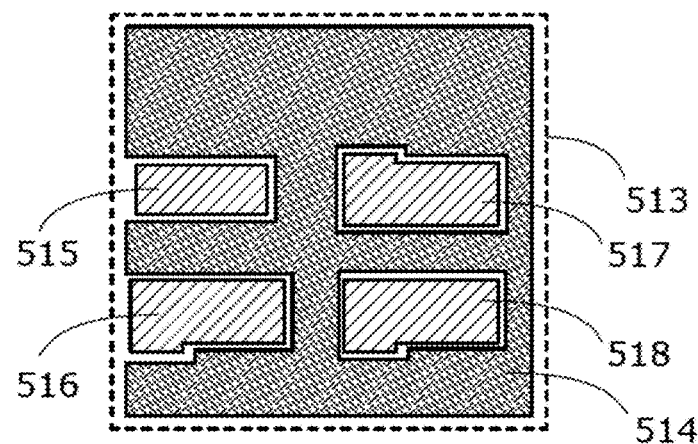
FIG. 27B is a top view of a pixel.

FIG. 27B illustrates a layout of a display region of a liquid crystal element and a layout of a display region of a light-emitting element in a pixel 513 included in the pixel portion 501 in the case where a liquid crystal element is used as the reflective element and an element such as an organic EL element is used as the light-emitting element, for example.

Specifically, the pixel 513 in FIG. 27B includes a display region 514 of the liquid crystal element, a display region 515 of a light-emitting element corresponding to yellow, a display region 516 of a light-emitting element corresponding to green, a display region 517 of a light-emitting element corresponding to red, and a display region 518 of a light-emitting element corresponding to blue.

Note that in order to display black with high color reproducibility by using the light-emitting elements corresponding to green, blue, red, and yellow, the amount of current flowing to the light-emitting element corresponding to yellow per unit area needs to be the smallest among those flowing to the light-emitting elements. In FIG. 27B, the display region 516 of the light-emitting element corresponding to green, the display region 517 of the light-emitting element corresponding to red, and the display region 518 of the light-emitting element corresponding to blue have substantially the same area, and the display region 515 of the light-emitting element corresponding to yellow has a slightly smaller area than the other display regions. Therefore, black can be displayed with high color reproducibility.

This embodiment can be implemented in appropriate combinations with any of the other embodiments.

Embodiment 10

In this embodiment, a structure example of an optical sensor for sensing the angle of light incident on a display device will be described.

Figure 28:
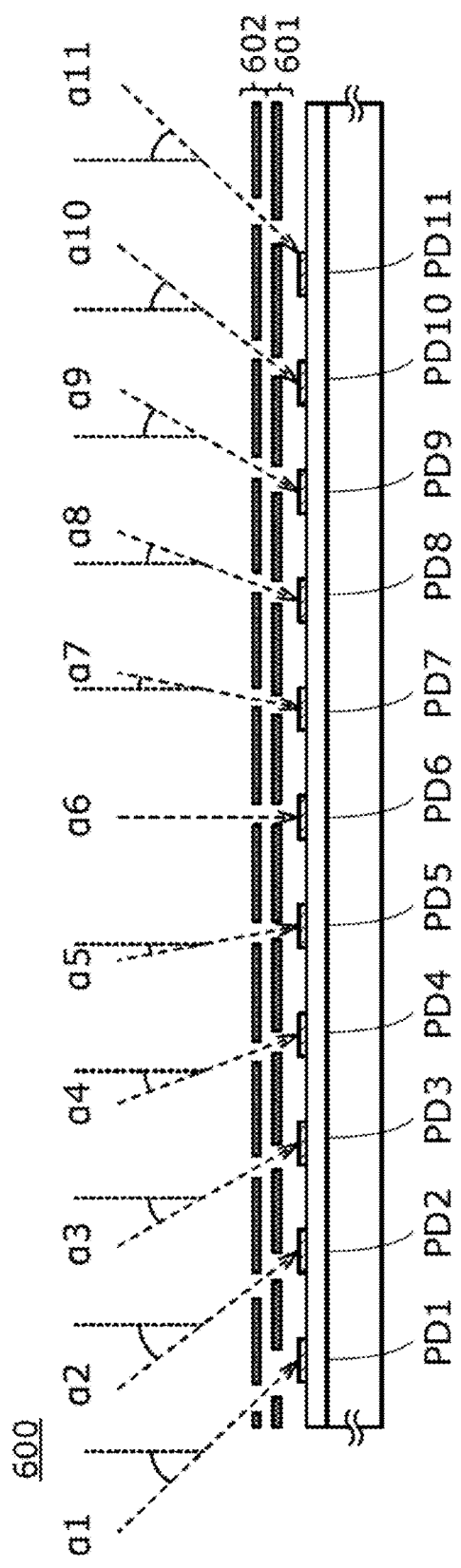
FIG. 28 is a cross-sectional view illustrating an example of an optical sensor.

The optical sensor may be formed over a substrate included in the display device or over a substrate prepared separately from the display device. FIG. 28 shows an example of a cross-sectional structure of the optical sensor.

An optical sensor 600 illustrated in FIG. 28 includes a plurality of photodiodes PD arranged in one direction on the same plane. In FIG. 28, photodiodes PD1 to PD11 are arranged in one direction as the plurality of photodiodes PD.

Over the photodiodes PD1 to PD11, a light-blocking film 601 including openings is positioned, and a light-blocking film 602 including openings is positioned over the light-blocking film 601. The distance between the openings of the light-blocking film 602 is longer than the distance between the openings of the light-blocking film 601, and the light-blocking films 601 and 602 including such openings are overlapped with each other; thus, the incident angles $\alpha 1$ to $\alpha 11$ of light of the respective photodiodes PD1 to PD11 can be controlled.

Although the light-blocking film 601 and the light-blocking film 602 are stacked in this embodiment, one or more light-blocking films may be provided over the light-blocking film 601 and the light-blocking film 602. When one or more light-blocking films are provided over the light-blocking film 601 and the light-blocking film 602, the ranges of the incident angles of light which can be sensed by the respective photodiodes PD can be narrowed and thus, the accuracy of the incident angles of light which can be sensed by the optical sensor 600 can be increased.

FIG. 28 shows a structure example of the optical sensor 600 which includes the plurality of photodiodes PD arranged in one direction and the light-blocking films 601 and 602 including openings corresponding to the photodiodes PD. In one embodiment of the present invention, instead of the above structure, the optical sensor 600 may include, for example, a plurality of first photodiodes PD arranged in a first direction, a plurality of second photodiodes PD arranged in a second direction, and the light-blocking films 601 and 602 including openings corresponding to the first photodiode PD and openings corresponding to the second photodiodes PD.

This embodiment can be implemented in appropriate combinations with any of the other embodiments.

Embodiment 11

In this embodiment, an example of a configuration of a neural network will be described. In particular, how to add a learning function (also referred to as a learning means) to a device will be described.

Figure 29A:
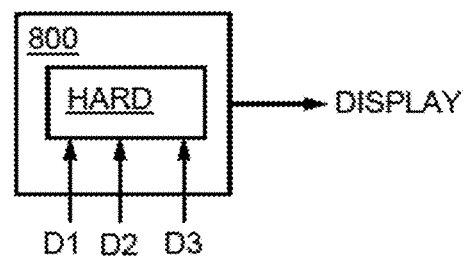
FIGS. 29A and 29B are block diagrams each illustrating a configuration example of a neural network.

FIG. 29A shows an example in which a learning function is added to an image processing portion 800. Specifically, as hardware HARD, a product-sum operation circuit (the product-sum operation circuit 165a in FIG. 2, the semiconductor device in FIG. 7, or the like) and the circuits illustrated in FIGS. 6A to 6D are added to the image processing portion 800.

Note that the configuration of the image processing portion 160 illustrated in FIG. 2 can be employed as the configuration of the image processing portion 800 as appropriate. Furthermore, the circuits illustrated in FIGS. 6A to 6D may be provided in the product-sum operation circuit.
<Learning Method in FIG. 29A>

In learning, learning data D1 (e.g., data on external light intensity or the like) and teacher data D2 (e.g., data on color, luminance, and the like selected by a user) are input to the image processing portion 800. Learning data and teacher data are also referred to as a learning signal and a teacher signal, respectively.

A specific learning method is as follows: calculation (product-sum operation) with a neural network is performed as described in Embodiment 3 and the like, and weight coefficients are changed so that an error between an output and the teacher data D2 becomes small. As a method for changing weight coefficients, backpropagation or the like can be used. When the learning is completed, the obtained weight coefficients are stored in the product-sum operation circuit 165a of the image processing portion 800.
<Method of Image Processing in FIG. 29A>

When image processing (image correction) is performed after the learning, that is, in normal operation, newly obtained input data D3 (e.g., data on external light intensity and the like) is input to the image processing portion 800, calculation with a neural network is performed using the input data D3 and the weight coefficients, and parameters suitable for image processing are obtained. The calculation is performed with the product-sum operation circuit in FIG. 7 and the circuit in FIG. 6A as described with reference to FIG. 3 and FIG. 4.

The parameters obtained by the calculation with the neural network after the learning are expected to be values close to data on color, luminance, and the like that suit user's preference. In other words, by performing image processing using the parameters, a display image which suits the user's preference can be produced.

With the configuration illustrated in FIG. 29A, a circuit having the learning function can be provided as hardware HARD in the image processing portion 800. Accordingly, a learning means (hardware or software) does not need to be additionally provided, which enables simplification or high-speed operation of the neural network.

Figure 29B:
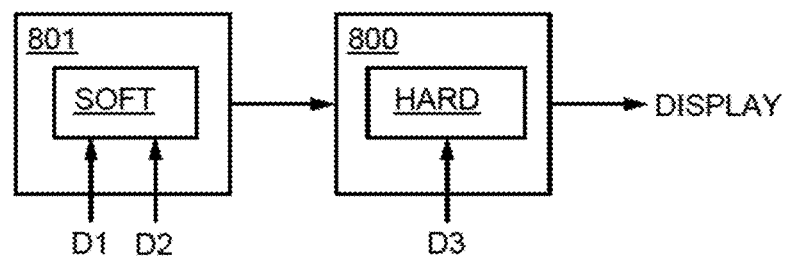

FIG. 29B shows an example in which a learning function is added to a host 801. Here, the learning function is added as software SOFT in the host 801. A function of obtaining parameters suitable for image processing is added as hardware HARD in the image processing portion 800. Note that the configuration of the host 140 illustrated in FIG. 2 can be used as the configuration of the host 801 as appropriate.
<Configuration of Host in FIG. 29B>

A program for performing the learning is stored as the software SOFT (also referred to as a learning program) in the host 801.

The program for performing the learning is preferably formed such that the calculation using a neural network described in Embodiment 3 and the like can be performed. Specifically, the arithmetic operation for inputting/outputting in/from neurons in FIG. 3 and FIG. 4 and the arithmetic operation for changing weight coefficients in FIG. 5 are programmed.

Figure 4:
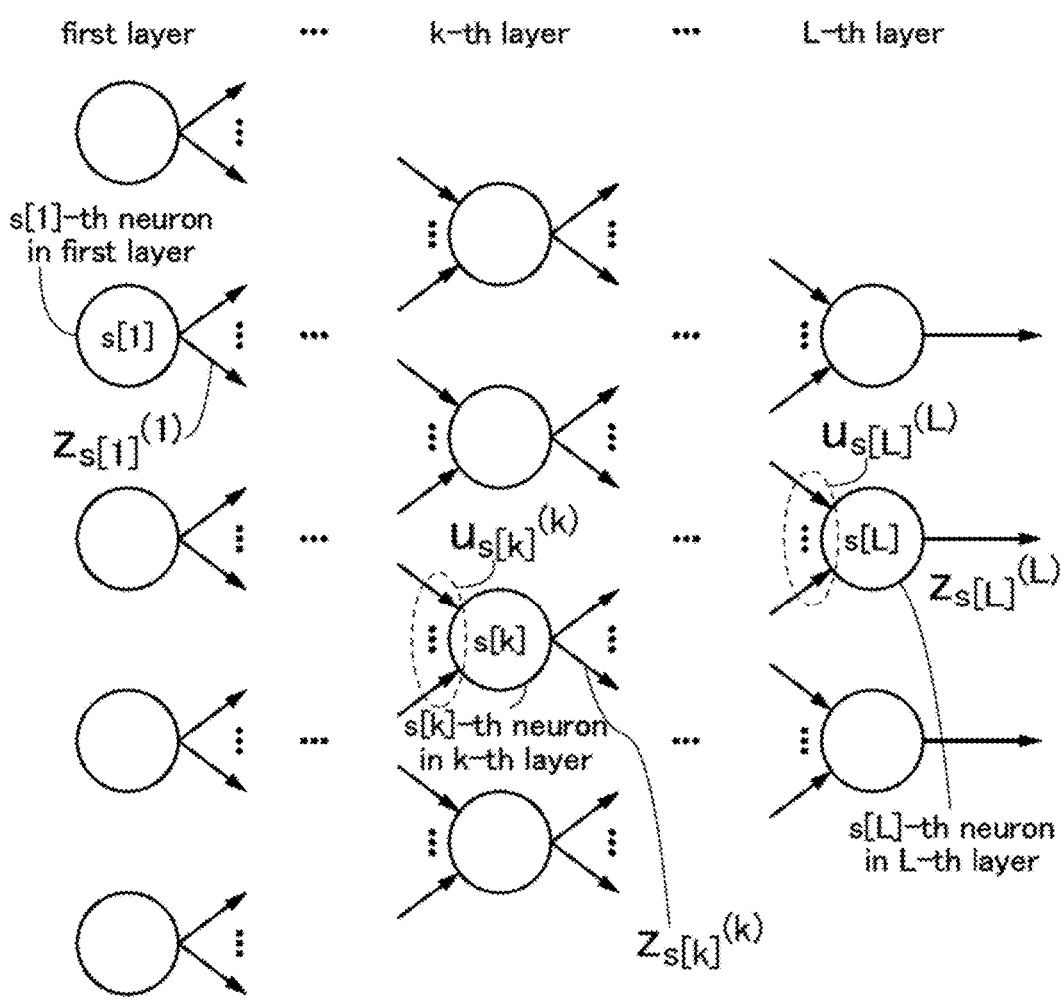
FIG. 4 illustrates an example of a hierarchical neural network.

The arithmetic operation for inputting/outputting in/from neurons can be conducted by calculating a plurality of formulae relating to FIG. 3 and FIG. 4. Specifically, the arithmetic operation can be performed with the product-sum operation circuit in FIG. 7 and the circuit illustrated in FIG. 6A. Therefore, the programs are formed to conduct the arithmetic operation relating to the plurality of formulae and the arithmetic operation relating to these circuits.

The arithmetic operation for changing weight coefficients can be conducted by calculating a plurality of formulae relating to FIG. 5. Specifically, the arithmetic operation can be performed with the product-sum operation circuit in FIG. 7 and the circuits illustrated in FIGS. 6B to 6D. Therefore, the programs are formed to conduct the arithmetic operation relating to the plurality of formulae and the arithmetic operation relating to these circuits.

<Configuration of Image Processing Portion in FIG. 29B>

A circuit for obtaining parameters suitable for image processing is provided as the hardware HARD in the image processing portion 800. Specifically, the product-sum operation circuit 165*a* and the circuit illustrated in FIG. 6A are provided. FIG. 29B is different from FIG. 29A in that a learning function is not added to the image processing portion 800.

It is preferable that calculation results of a neural network in the hardware HARD correspond to calculation results of a neural network in the software SOFT. Specifically, both of them are formed so that the same output is obtained using the same input or the outputs are obtained in the desired range of margin of error. More specifically, an input (voltage) to the hardware HARD corresponds to an input (digital data) to the software SOFT, and an output (voltage or current) from the hardware HARD corresponds to an output (digital data) from the software SOFT.

<Learning Method in FIG. 29B>

In the learning in FIG. 29B, unlike that in FIG. 29A, learning data D1 (e.g., data on external light intensity or the like) and teacher data D2 (e.g., data on color, luminance, and the like selected by a user) are input to the host 801.

A specific learning method is as follows: the calculation (product-sum operation) by the neural network described in Embodiment 3 or the like is performed with a learning program using the software SOFT, and weight coefficients are changed. As a method for changing weight coefficients, backpropagation or the like can be used. When the learning is completed, the obtained weight coefficients are output from the host 801 and stored in the product-sum operation circuit 165*a* of the image processing portion 800. FIG. 29B is different from FIG. 29A in that the learning is performed using the software SOFT.

<Method of Image Processing in FIG. 29B>

Image processing after the learning (normal operation) can be performed in a manner similar to that of the configuration in FIG. 29A. In other words, parameters suitable for the image processing are obtained by neural network calculation using newly obtained input data D3 and weight coefficients with the hardware HARD (the product-sum operation circuit 165*a* and the circuit illustrated in FIG. 6A) in the image processing portion 800. Since not the software SOFT but the hardware HARD is used in the image processing portion 800, the arithmetic operation can be efficiently conducted.

As described above, in the configuration illustrated in FIG. 29B, the learning function which is not necessary in the normal operation is separated from the hardware HARD and is added to the software SOFT as a program; thus, the arithmetic operation can be efficiently conducted in the normal operation.

With the configuration illustrated in FIG. 29B, the hardware HARD and the software SOFT can have separate functions; the function of image processing is added to the hardware HARD and the learning function is added to the software SOFT. Thus, the efficiency of the neural network or low power consumption of the image processing portion 800 can be achieved.

Note that the learning function is not necessarily added to the host 801. For example, the learning function may be added to another circuit illustrated in FIG. 2 or a circuit not illustrated in FIG. 2. The learning function may be added to hardware or both of software and hardware.

The configuration in this embodiment can be applied to a variety of fields as well as the image processing.

For example, when a variety of devices are adjusted, e.g., the temperature or air volume of an air conditioner is adjusted, the brightness or color tone of a lighting device is adjusted, or the height or angle of furniture such as a chair and a desk is adjusted, the learning function of one embodiment of the present invention or the configuration in this embodiment can be employed.

This embodiment can be implemented in appropriate combinations with any of the other embodiments.

Embodiment 12

The display device of one embodiment of the present invention can be mounted on a variety of electronic devices as well as the above devices. In the case where the display device is mounted on a building or a moving vehicle (e.g., a car or an airplane), the building or the moving vehicle may be used as a housing in which a sensor is provided.

In this embodiment, as an example of an electronic device including the display device of one embodiment of the present invention, an electronic device in which learning data input to an arithmetic circuit is obtained by a plurality of optical sensors arranged in the housing of the display device will be described with reference to FIGS. 30A to 30C, FIG. 31, FIG. 32, FIG. 33, FIGS. 34A and 34B, FIGS. 35A to 35D, and FIG. 36. The display device of one embodiment of the present invention can be mounted on a variety of electronic devices. As for application examples of an electronic device, the display device of one embodiment of the present invention can be mounted on a building, a moving vehicle, or the like.

In the case where the display device of one embodiment of the present invention is used for a moving vehicle, the moving vehicle often moves outside; thus, the surrounding environment is significantly changed as compared with the indoors. Meanwhile, when a display portion for displaying information which should be viewed by a user is hardly viewed due to a change in the surrounding environment, a safety problem occurs. Therefore, it is very important to display an image which is easily viewed by a user even when the surrounding environment changes. In particular, the visibility of a monitor is extremely important for a so-called mirrorless car employing a camera monitoring system (a system using a camera and a monitor instead of side mirrors or a rear-view mirror) which is expected to be widely used.

By using the display device of one embodiment of the present invention for a moving vehicle, the moving vehicle can include the display device with high display quality. The moving vehicle can include the display portion which is easily viewed by a user even when the surrounding environment changes. The environment of the outdoors is suddenly changed more frequently. If the display setting of the display device is changed every time a temporary change occurs, a user hardly views an image in some cases. The display device of one embodiment of the present invention learns environmental changes using the above-described neural network, and thus reduces an influence of a sudden change and can display an image which is easily viewed by a user. For example, by learning changes in external light, including changes in the direction and wavelength, a change with time, and the like, the display setting of the display device is not excessively changed in response to unexpected light, so that an influence of unexpected light can be reduced.

FIGS. 30A to 30C, FIG. 31, FIG. 32, FIG. 33, FIGS. 34A and 34B, and FIG. 36 show examples in each of which the display device of one embodiment of the present invention is mounted on an automobile as application examples of an electronic device.

Figure 30A:
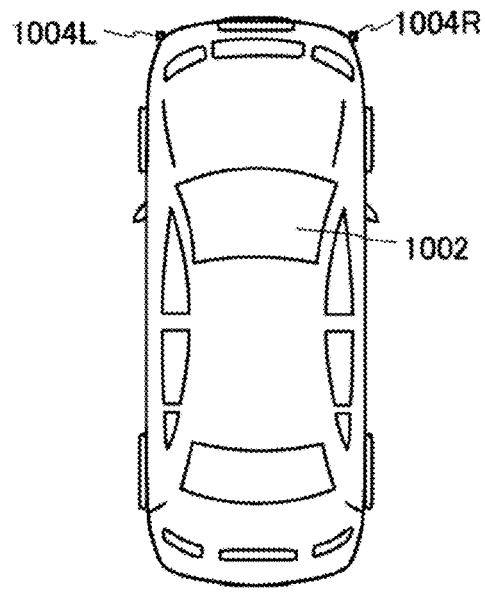
FIGS. 30A to 30C each illustrate an example of a moving vehicle.
Figure 30B:
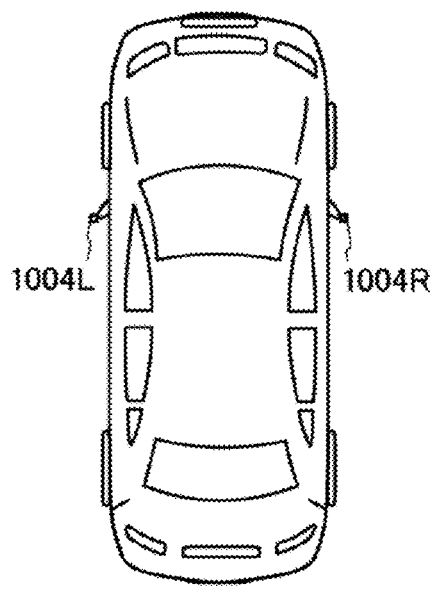
Figure 30C:
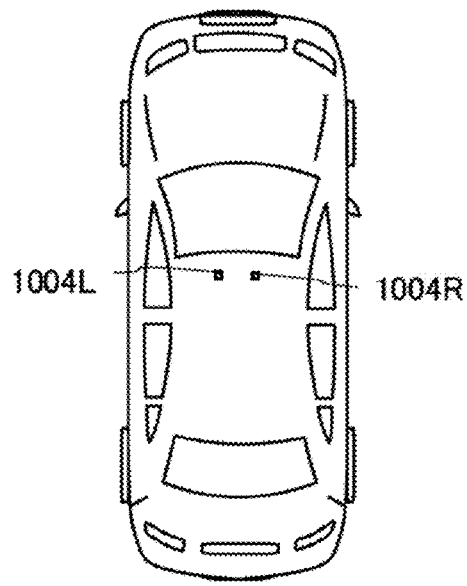

FIGS. 30A to 30C are views of a car body 1000 seen from above. The car body 1000 includes optical sensors. Each of the optical sensors has a function of obtaining information such as the wavelength of light, the intensity of light, and the light intensity of light with each wavelength, and the information is input, as learning data, to the arithmetic circuit of one embodiment of the present invention. As the optical sensor, a phototransistor, a photosensor, an image sensor, or the like can be used, for example. The optical sensor illustrated in FIG. 28 can be used, for example. The optical sensor illustrated in FIG. 28 can sense the incident angle, illuminance, or the like of light.

For example, as illustrated in FIG. 30A, an optical sensor 1004L and an optical sensor 1004R can be provided on a front bumper. For example, as illustrated in FIG. 30B, the optical sensor 1004L and the optical sensor 1004R can be provided on side mirrors. In the case of a car body without side mirrors, such as a so-called mirrorless car, the optical sensor 1004L and the optical sensor 1004R can be provided in a position in which a camera for side mirrors is provided. For example, as illustrated in FIG. 30C, the optical sensor 1004L and the optical sensor 1004R can be provided on a roof.

The optical sensor 1004L and the optical sensor 1004R are preferably provided outside the car body 1000 because they have a function of sensing external light, for example; however, one or more optical sensors may be provided inside the car body 1000 instead of the optical sensors 1004L and 1004R. In the case where the optical sensor is provided inside the car body 1000, the optical sensor can be provided on a window 1002 or the like. In the case where the optical sensor is provided on the window 1002, the window 1002 in a region of the front and its vicinity of the optical sensor preferably has sufficient light transmittance so that the sensing accuracy of the optical sensor is not decreased.

For example, the optical sensors 1004L and 1004R can be provided on a front bumper, and another optical sensor can be provided on the window 1002. For example, the optical sensors 1004L and 1004R can be provided on a roof, and another optical sensor can be provided on a front bumper.

It is preferable to provide a plurality of optical sensors. By providing a plurality of optical sensors, the sensing accuracy can be improved; for example, the position, incident direction, and the like of a light source can be accurately determined. Furthermore, in the case where a plurality of optical sensors are provided, the optical sensors are provided in symmetrical positions, which can increase a region sensed by the optical sensors and improve safety.

Note that the positions, number, or shapes of optical sensors are not limited to those in FIGS. 30A to 30C. In order to accurately measure an external light environment, optical sensors are preferably provided on two or more surfaces of the car body 1000, and as the number of surfaces on which the optical sensors are provided is larger, more information about the external light environment can be obtained. A plurality of optical sensors are preferably provided on a large-area surface among surfaces of the car body 1000, such as a side surface. On the other hand, when the number of optical sensors is reduced, components such as power source wirings for the sensors and signal wirings can be reduced, so that the weight and cost of the car body can be reduced.

Furthermore, a plurality of kinds of optical sensors capable of sensing the intensities of light with different wavelengths are preferably provided as the optical sensors 1004L and 1004R. In the case where the automobile is used under sunlight, the sun, which is a light source, has different spectra of light which are specific to morning, daytime, and evening. In the case where the automobile is used indoors or outdoors without sunlight, such as in a tunnel, light from a streetlamp, headlights of a car, or the like which is used as a light source has a wavelength different from that of the spectra of sunlight. By providing a plurality of kinds of optical sensors capable of sensing light with different wavelengths as the optical sensors 1004L and 1004R, more detailed information about the light source can be obtained. The obtained information about the light source including a change in the environment with time is learned as learning data with the above-described neural network; thus, an influence of a sudden change can be reduced and an image which can be easily viewed by a user can be displayed.

When the car body 1000 in this embodiment includes optical sensors arranged on two or more surfaces of the car body 1000, the external light environment of the car body can be measured accurately. In using the car body, the user can see not only a display surface but also the surrounding of the display portion. Therefore, by accurately measuring the external light environment of the surrounding of the car body, the visibility of the user and the display quality can be improved, and thus, display suitable for the user can be achieved. Consequently, unnecessary display of an image with high luminance is not performed, for example, whereby power consumption can be reduced.

A display portion which displays a corrected image using information obtained by a sensor or the like in this manner as learning data will be described.

Figure 31:
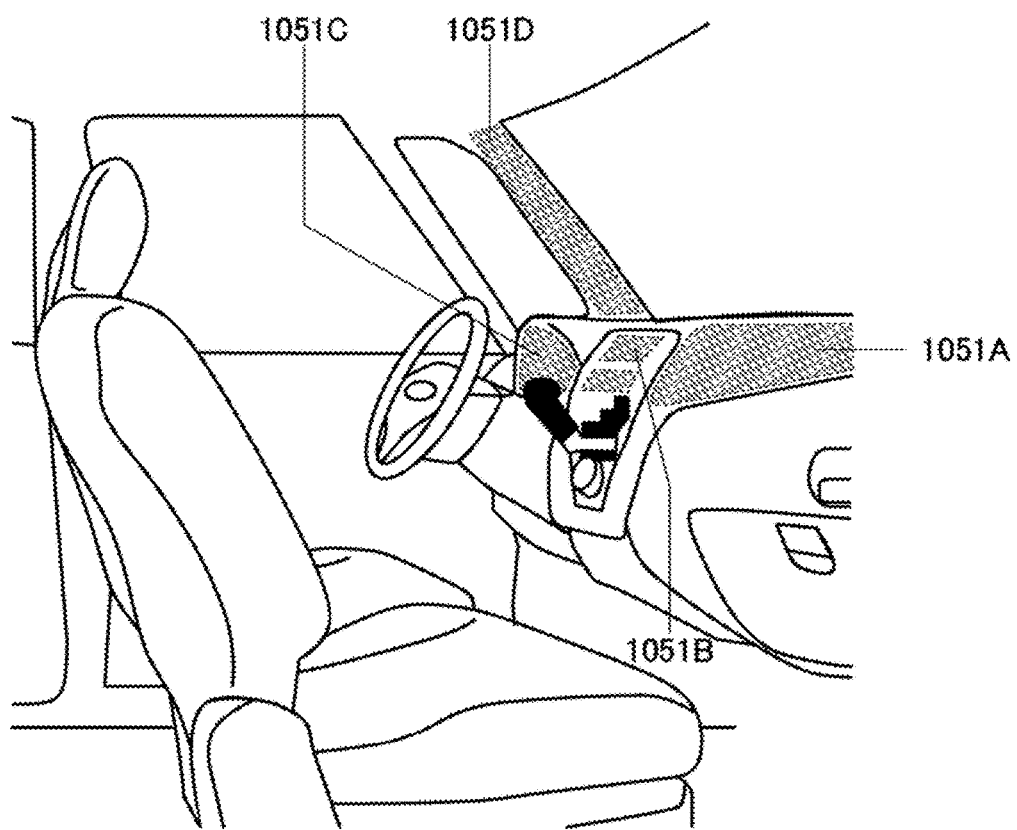
FIG. 31 illustrates an example of a moving vehicle.

FIG. 31 illustrates a front glass and its vicinity inside the automobile, for example. FIG. 31 illustrates a display portion 1051A, a display portion 1051B, and a display portion 1051C which are attached to a dashboard, and a display portion 1051D attached to a pillar.

The display portions 1051A to 1051C can provide display images including a variety of kinds of information such as navigation information, a speedometer, a tachometer, a mileage, a fuel meter, a gearshift indicator, air-condition setting, and the like. Since these display images are corrected based on the information obtained by a sensor or the like as described above, free arrangement with more sophisticated design of the automobile is enabled and the images are easily viewed by the user regardless of an influence of a surrounding environment such as external light. The display content, layout, or the like on the display portions can be changed as appropriate in accordance with his or her preference, so that more sophisticated design can be obtained. The display portions 1051A to 1051C can also be used as lighting devices.

The display portion 1051D can compensate for the view obstructed by the pillar (blind areas) by showing an image taken by a camera or the like provided for the car body. That is, displaying an image taken by the camera or the like provided on the outside of the car body can eliminate blind spots and improve safety. Displaying an image to compensate for the area which a driver cannot see, makes it possible for the driver to confirm safety easily and comfortably. The display portion 1051D can also be used as a lighting device.

Figure 32:
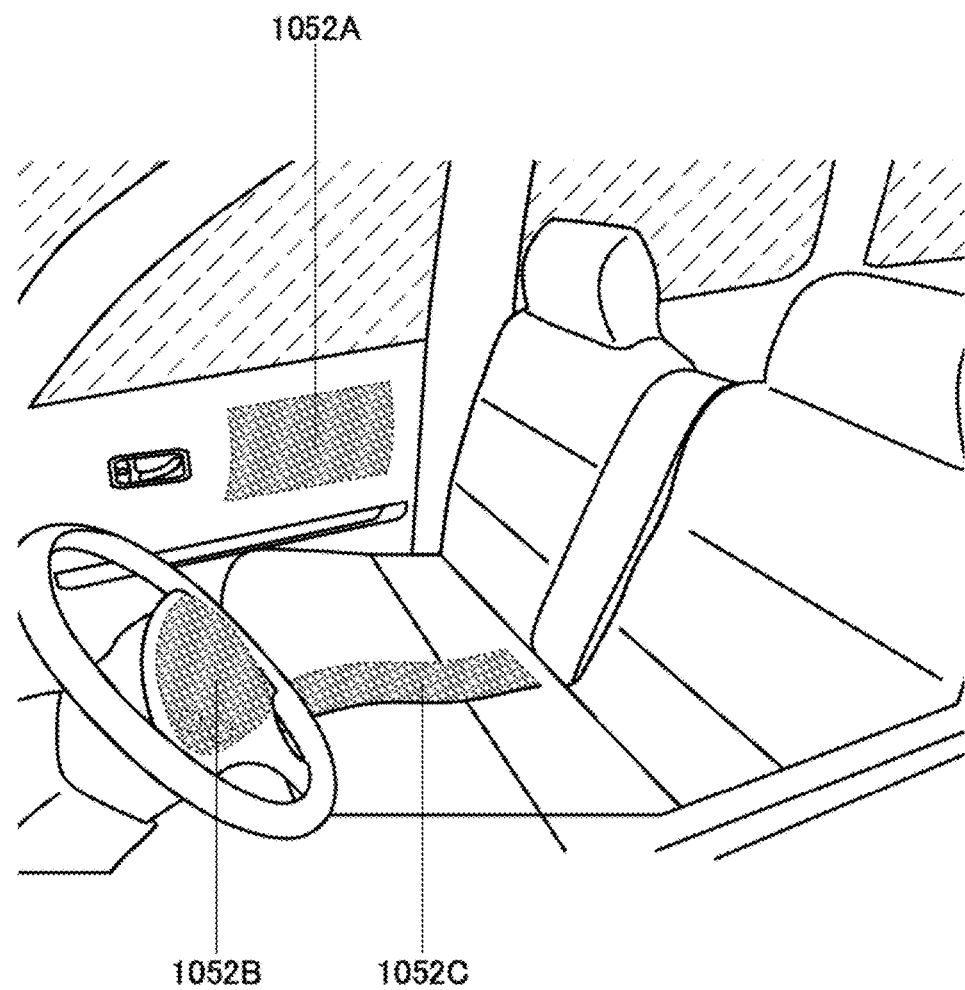
FIG. 32 illustrates an example of a moving vehicle.

FIG. 32 illustrates the inside of an automobile in which a bench seat is used as a driver seat and a front passenger seat. FIG. 32 illustrates a display portion 1052A which is provided on a door, a display portion 1052B which is provided on a steering wheel, and a display portion 1052C which is provided in the middle of the seating surface of the bench seat.

The display portion 1052A can compensate for the view hindered by the door by displaying an image taken by a camera provided for the car body, for example.

The display portions 1052B and 1052C can provide display images including a variety of kinds of information such as navigation information, a speedometer, a tachometer, a mileage, a fuel meter, a gearshift indicator, air-condition setting, and the like. Since these display images are corrected based on the information obtained by a sensor or the like as described above, the images are easily viewed by the user regardless of an influence of a surrounding environment such as external light. The display content, layout, or the like on the display portions can be changed as appropriate in accordance with his or her preference. The display portions 1052B and 1052C can also be used as lighting devices.

Figure 33:
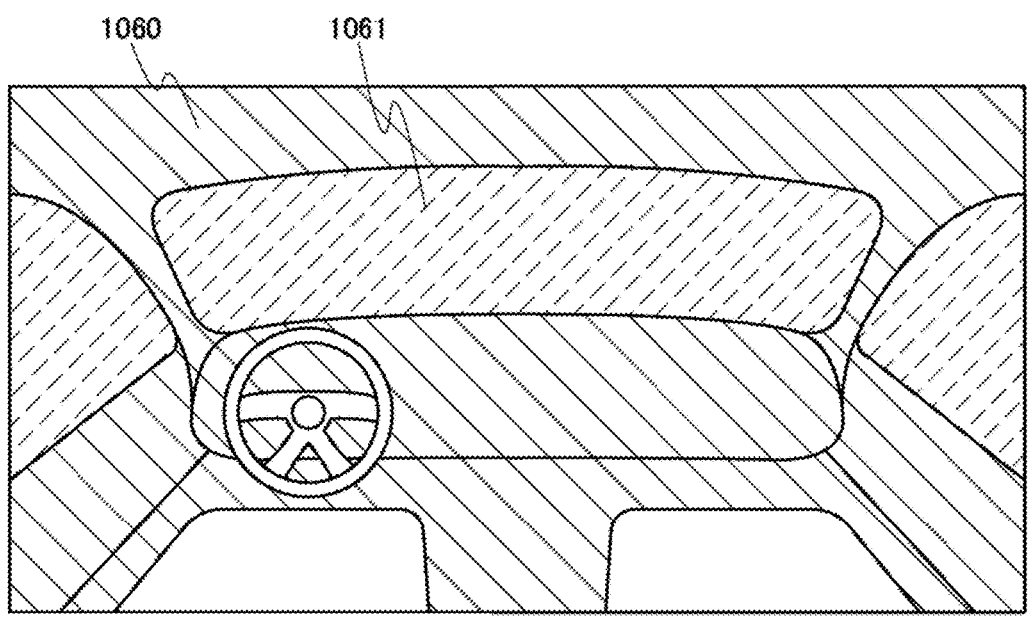
FIG. 33 illustrates an example of a moving vehicle.
Figure 34A:
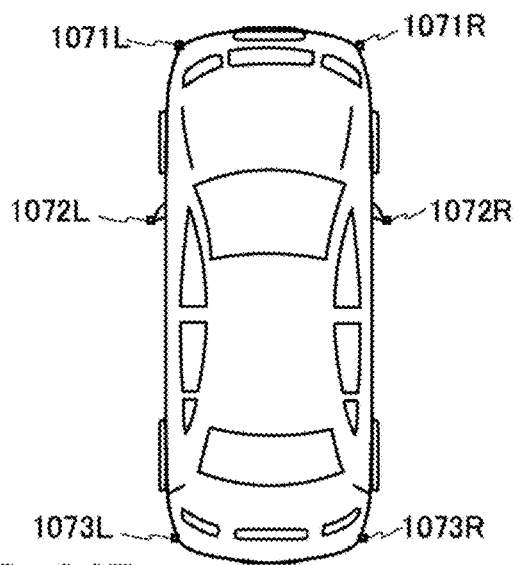
FIGS. 34A and 34B illustrate an example of a moving vehicle.
Figure 34B:
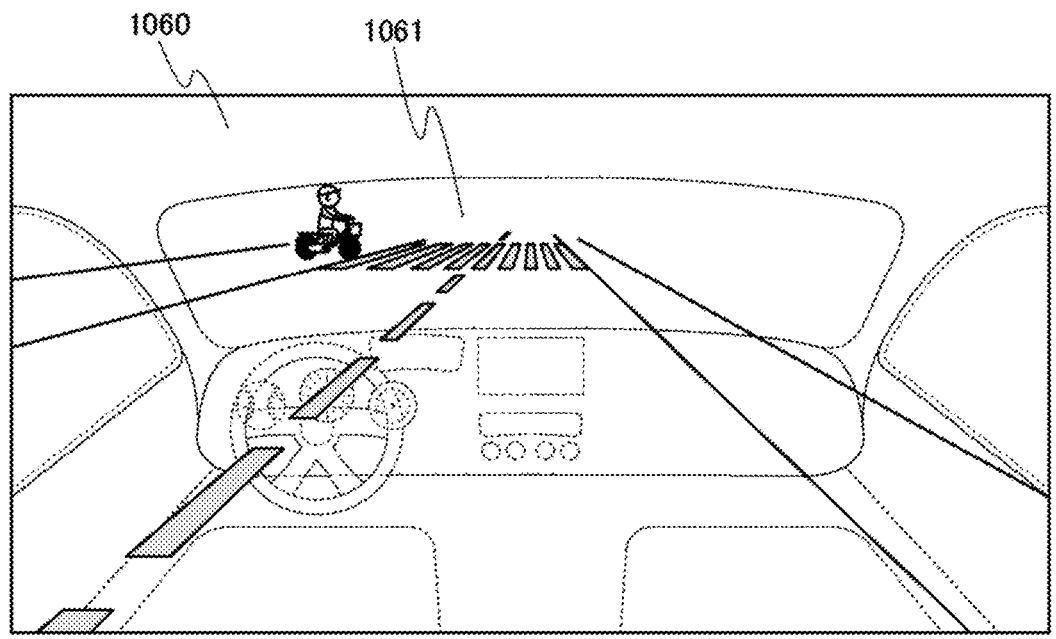

The display portions provided everywhere inside the car as illustrated in FIG. 33 and FIGS. 34A and 34B are effectively used as units for transmitting an urgent signal out of the car by being used as lighting devices. In the case where an abnormal health condition of the user (driver) is sensed by a sensor or the like, for example, the display portions can be made flash on and off at the highest luminance.

As the above-described display portions, display portions 1060 can be provided on the inner surfaces of the car body except windows 1061 as illustrated in FIG. 33. This structure can display images of the outside of the car except the outside of the windows 1061, so that blind areas can be eliminated and the safety can be enhanced.

In the case where the display portions are provided on the inner surfaces of the car body except the windows 1061 as illustrated in FIG. 33, depending on the positions of the display portions, a plurality of cameras, i.e., a camera 1071L, a camera 1072L, a camera 1073L, a camera 1071R, a camera 1072R, and a camera 1073R are preferably provided outside the car body as illustrated in FIG. 34A. Note that two or more cameras are preferably arranged side by side to obtain information about a distance to an object. Since the cameras that are provided for the car body also serve as the above-described optical sensors, the number of components can be reduced.

The structures in FIG. 33 and FIG. 34A make it possible to display the images of the outside of the car except the windows 1061 as illustrated in FIG. 34B. Thus, the moving vehicle can compensate for the user's blind areas and enhance its safety.

In the structure including the display portions 1060 provided on the inner surfaces of the car body except the windows 1061, a position on which the meter or the like is displayed is changeable because the display portions are provided on a variety of places. Since the display positions can be freely changed in that case, the display position can be changed depending on the surrounding environment such as external light so that the display is easily viewed by the user. The display position can be changed as appropriate depending on the preference, build, and the like of the user.

Furthermore, learning is performed using information obtained by an optical sensor provided for a display device and an optical sensor provided for a car body; thus, image correction can be performed more effectively. A specific example will be explained.

There is a limitation on the number of optical sensors which can be provided for a display device in some cases. Therefore, the intensity of external light in the vicinity of the display portion can be effectively determined, whereas the incident direction of external light might be difficult to determine. For example, there is a possibility that the incident direction of light which suddenly comes into sight, such as light of another automobile or a streetlight, cannot be determined or the necessity of changing the display setting cannot be determined stably. When the display setting is excessively changed in response to unexpected light, an image is hardly viewed by the user in some cases as described above.

Therefore, an optical sensor provided for a car body is used to solve this problem.

For example, in the case where optical sensors on the right and left sides of the car body are used to sense light of a headlight of another automobile on the left lane, the optical sensor on the left side senses stronger light than the optical sensor on the right side. Furthermore, in the case where light of a streetlight is delivered from the right side, the optical sensor on the right side senses stronger light than the optical sensor on the left side.

As described above, the optical sensors provided for the car body can accurately sense light which suddenly comes into sight, such as light of a headlight of another automobile or a streetlight, more accurately than the optical sensors provided for the display devices.

In the case where the learning is performed using information obtained by the sensors provided for the display devices and the car body, the learning is performed so that image correction is not performed when unexpected light is sensed by the sensors provided for the car body, and the results thereof can be stored as weight coefficients.

As described above, the learning is performed using information obtained by the optical sensors provided for the display devices and the optical sensors provided for the car body, whereby high-level learning which is hardly performed by only the optical sensors provided for the display devices can be performed.

A plurality of kinds of optical sensors may be provided so that light with different wavelengths can be sensed with the optical sensors provided for the car body and the optical sensors provided for the display devices. For example, external light such as sunlight can be sensed by the optical sensors provided for the display devices and unexpected light can be sensed by the optical sensors provided for the car body. With a plurality of kinds of sensors, learning can be performed using information obtained by the optical sensors provided for the car body in a complementary manner.

Although an optical sensor is described above, a sensor (a sensor having a function of measuring force, displacement, position, speed, acceleration, angular velocity, rotational frequency, distance, magnetism, temperature, chemical substance, sound, time, hardness, electric field, current, voltage, electric power, radiation, flow rate, humidity, gradient, oscillation, odor, or infrared rays) may be included. For example, an optical sensor and a time sensor are used in combination to display an image more suitable to a user because the wavelength, intensity, incident angle, or the like of the external light significantly changes depending on the time.

The surrounding environment such as external light can be sensed by not only a dedicated sensor but also another sensor, a camera, a radar, or the like of the car body. For example, a forward facing camera/radar, a rear facing camera/radar, a side facing camera/radar, a driver monitoring camera, a vehicle position sensor, a forward inter-vehicle distance/forward obstacle sensor, a backward inter-vehicle distance/backward obstacle sensor, a lateral inter-vehicle distance/side obstacle sensor, a drive recorder, or the like can be used. Especially, a camera is preferably used because more information can be obtained. When a camera has a sensor function or the like, the number of components can be reduced, which leads to cost reduction. Furthermore, the weight of the car body can be reduced, and thus, energy or cost for transport can be reduced. For example, in the case of a so-called mirrorless car using a camera monitoring system, a camera is preferably used as an optical sensor and the display device of one embodiment of the present invention is preferably used as a display portion because an increase in the number of components can be minimized.

Figure 36:
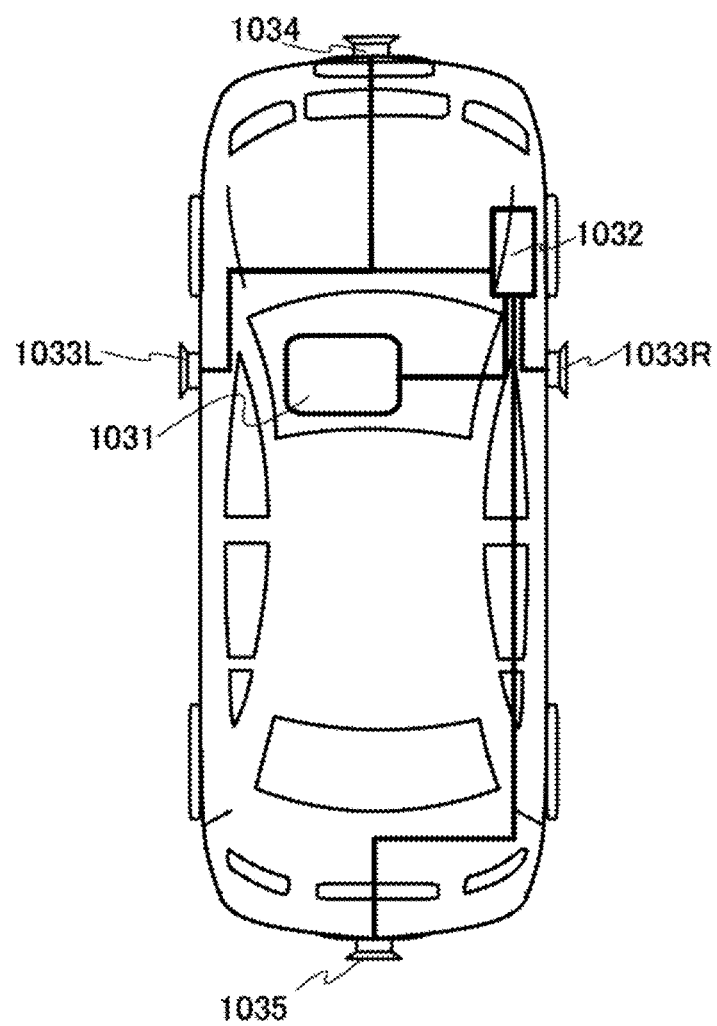
FIG. 36 illustrates an example of a moving vehicle.

A variety of communication standards can be applied to a communication environment of the car body, e.g., a sensor, a camera, a radar, or a display device. For example, Ethernat, CAN, LIN, MOST, or FlexRay can be used. Especially, Ethernat is suitable because high-speed communication can be achieved. FIG. 36 is a block diagram illustrating a communication environment of a car body. As illustrated in FIG. 36, information obtained by a camera 1033R, a camera 1033L, an optical sensor 1034, and an optical sensor 1035 is output to the arithmetic circuit 1032, and information obtained by the arithmetic circuit 1032 can be displayed on the display portion 1031. The positions, numbers, or shapes of the sensors, circuits, display portions, or the like are not limited to those in the car body illustrated in FIG. 36.

The display portion can be provided in a variety of positions in the car body and may be provided either outside or inside the car. In the case where the display portion is provided outside the car, the surrounding environment such as external light has a large influence compared with the case where the display portion is provided inside the car. Thus, the use of the above-described display device is more effective.

Note that as the display portion, not only the hybrid display device including the reflective element and the light-emitting element which is described in Embodiment 6 and the like but also a variety of display devices can be used. For example, a liquid crystal element, a microelectromechanical system (MEMS) shutter element, an optical interference type MEMS element, a display element using a microcapsule method, an electrophoretic method, an electrowetting method, an Electronic Liquid Powder (registered trademark) method, or the like, an organic light-emitting diode (OLED), a light-emitting diode (LED), a quantum-dot light-emitting diode (QLED), or the like can be used. In particular, since a hybrid display device including a reflective element and a light-emitting element has a function of displaying an image using a light-emitting element and a function of displaying an image by reflecting environment light, display performance can be considerably changed depending on the surrounding environment. Thus, the visibility of the user is easily adjusted to be in a preferable state and the display portion can be suitably used for the moving vehicle.

<Examples of Moving Vehicle>

Examples of a moving vehicle will be described.

A moving vehicle for which the display device of one embodiment of the present invention can be employed can be used as a moving vehicle including a surface on which a display portion can be provided. Specific examples of the moving vehicles are illustrated in FIGS. 35A to 35D.

Figure 35A:
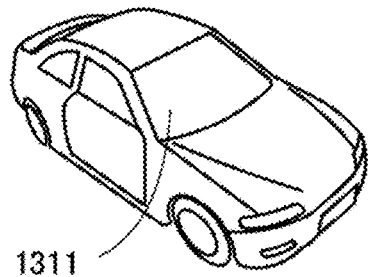
FIGS. 35A to 35D each illustrate an example of a moving vehicle.

FIG. 35A illustrates an automobile 1301. The automobile 1301 includes a window 1311. A moving vehicle of one embodiment of the present invention can be the automobile 1301 including the window 1311. The display portion provided for the automobile 1301 can display an image which is corrected based on information about the surrounding environment obtained by a sensor, a camera, or the like; thus, display which is easily viewed by the user regardless of the influence of the surrounding environment such as external light can be achieved. In the case where a camera is used, images of the outside of the automobile 1301 can be displayed on the display portion in the automobile 1301. Thus, the automobile 1301 can reduce the blind areas excluding the window 1311.

Figure 35B:
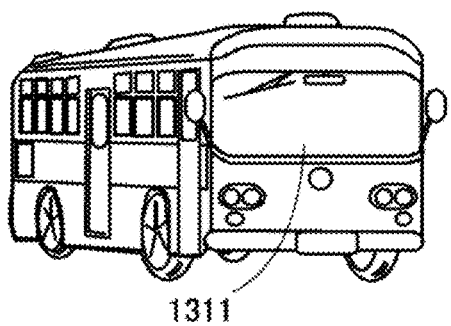

FIG. 35B illustrates a bus 1302. The bus 1302 includes the window 1311. A moving vehicle of one embodiment of the present invention can be the bus 1302 including the window 1311. The display portion provided for the bus 1302 can display an image which is corrected based on information about the surrounding environment obtained by a sensor, a camera, or the like; thus, display which is easily viewed by the user regardless of the influence of the surrounding environment such as external light can be achieved. In the case where a camera is used, images of the outside of the bus 1302 can be displayed on the display portion in the bus 1302. Thus, the bus 1302 can reduce the blind areas excluding the window 1311.

Figure 35C:
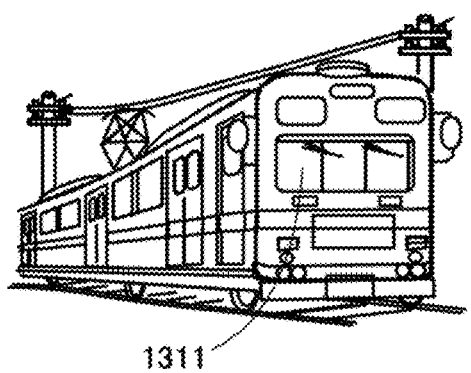

FIG. 35C illustrates a train 1303. The train 1303 includes the window 1311. A moving vehicle of one embodiment of the present invention can be the train 1303 including the window 1311. The display portion provided for the train 1303 can display an image which is corrected based on information about the surrounding environment obtained by a sensor, a camera, or the like; thus, display which is easily viewed by the user regardless of the influence of the surrounding environment such as external light can be achieved. In the case where a camera is used, images of the outside of the train 1303 can be displayed on the display portion in the train 1303. Thus, the train 1303 can reduce the blind areas excluding the window 1311.

Figure 35D:
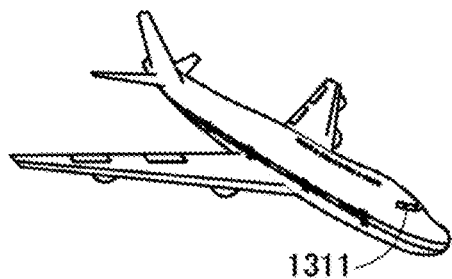

FIG. 35D illustrates an airplane 1304. The airplane 1304 includes the window 1311. A moving vehicle of one embodiment of the present invention can be the airplane 1304 including the window 1311. The display portion provided for the airplane 1304 can display an image which is corrected based on information about the surrounding environment obtained by a sensor, a camera, or the like; thus, display which is easily viewed by the user regardless of the influence of the surrounding environment such as external light can be achieved. In the case where a camera is used, images of the outside of the airplane 1304 can be displayed on the display portion in the airplane 1304. Thus, the airplane 1304 can reduce the blind areas excluding the window 1311.

The display device of one embodiment of the present invention can be mounted on a variety of electronic devices as well as the above moving vehicles. A building may be used as a housing for which an optical sensor is provided. For example, in the case where the display device of one embodiment of the present invention is used as a wall-hung type display, a plurality of optical sensors may be provided on the wall on which the display is provided and information obtained by the optical sensors may be input to an arithmetic circuit of the display device. In the case where the display device of one embodiment of the present invention is used as a display incorporated in a prefabricated bath, a plurality of sensors can be provided for the prefabricated bath.

This embodiment can be implemented in appropriate combinations with any of the other embodiments.

Embodiment 13

In this embodiment, a method for driving a pixel of a display device including a reflective element and a light-emitting element will be described.

<Circuit Configuration of Pixels>

The display device of one embodiment of the present invention includes pixels 2000. The pixels 2000 are arranged in a matrix, and the pixel 2000 in the m-th row and the n-th column (here, m and n are each an integer greater than or equal to 1) is referred to as a pixel 2000(m,n).

Figure 37:
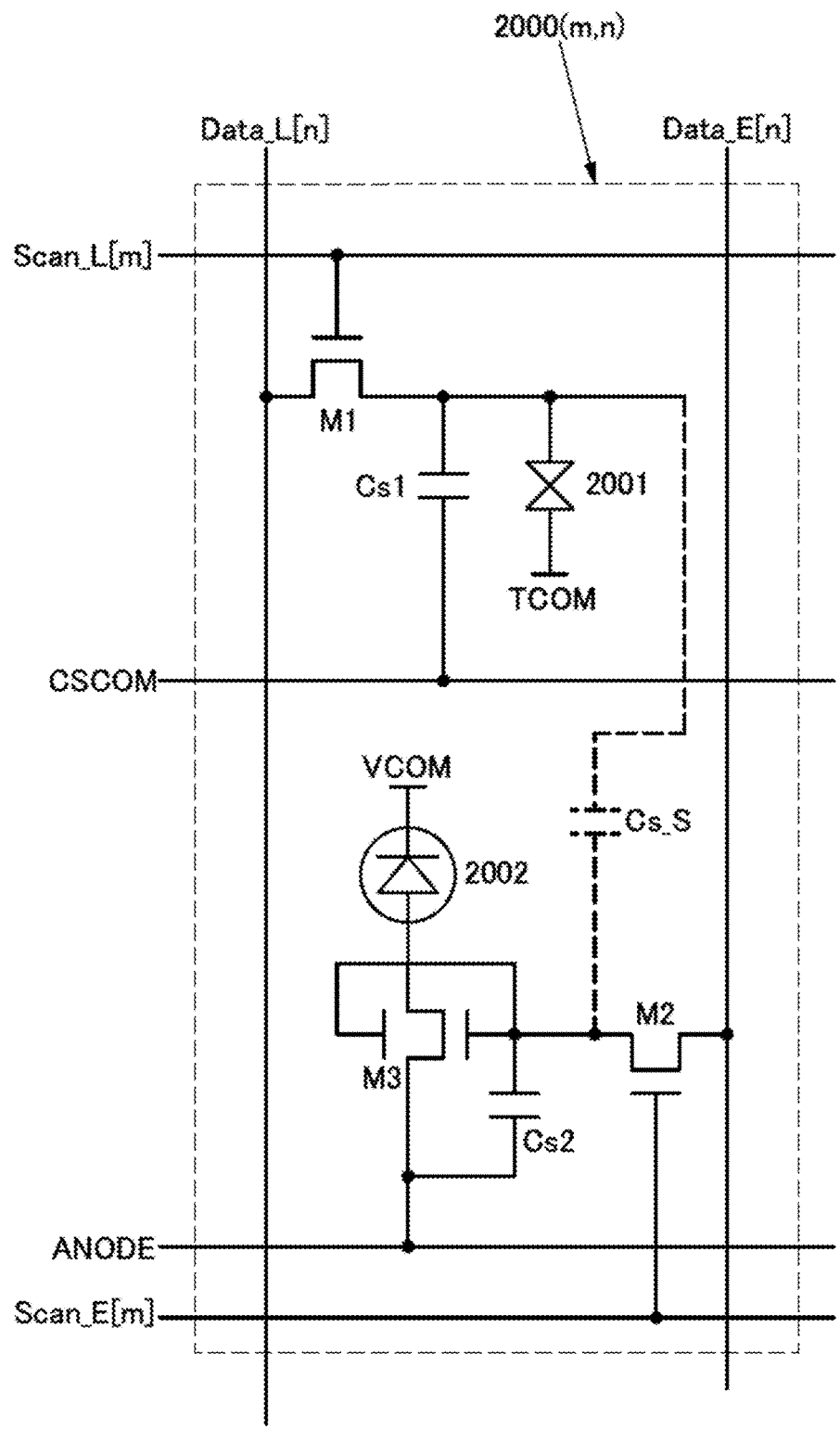
FIG. 37 is a circuit diagram illustrating a pixel.

FIG. 37 is a circuit diagram illustrating an example of a circuit configuration of the pixel 2000(m,n). The pixel 2000(m,n) includes a transistor M1, a transistor M2, a transistor M3, a capacitor Cs1, a capacitor Cs2, a liquid crystal element 2001, and a light-emitting element 2002.

One of a source and a drain of the transistor M1 is electrically connected to one electrode of the capacitor Cs1 and one electrode of the liquid crystal element 2001. One of a source and a drain of the transistor M2 is electrically connected to a gate of the transistor M3 and one electrode of the capacitor Cs2. One of a source and a drain of the transistor M3 is electrically connected to one electrode of the light-emitting element 2002.

Parasitic capacitance Cs_S is generated between the one electrode of the capacitor Cs1 and the one electrode of the capacitor Cs2.

The other of the source and the drain of the transistor M1 is electrically connected to a wiring Data_L[n]. A gate of the transistor M1 is electrically connected to a wiring Scan_L[m]. The other of the source and the drain of the transistor M2 is electrically connected to a wiring Data_E[n]. A gate of the transistor M2 is electrically connected to a wiring Scan_E[m]. The other of the source and the drain of the transistor M3 and the other electrode of the capacitor Cs2 are electrically connected to a wiring ANODE. The other electrode of the capacitor Cs1 is electrically connected to a wiring CSCOM. The other electrode of the liquid crystal element 2001 is electrically connected to a wiring TCOM. The other electrode of the light-emitting element 2002 is electrically connected to a wiring VCOM.

In this specification and the like, a wiring Data_L electrically connected to the pixels 2000 in the n-th column is denoted by the wiring Data_L[n], and a wiring Data_E electrically connected to the pixels 2000 in the n-th column is denoted by the wiring Data_E[n]. A wiring Scan_L electrically connected to the pixels 2000 in the m-th row is denoted by the wiring Scan_L[m], and a wiring Scan_E electrically connected to the pixels 2000 in the m-th row is denoted by the wiring Scan_E[m].

A data signal of a potential corresponding to data written to the pixels 2000 in the n-th column is supplied to the wiring Data_L[n] and the wiring Data_E[n]. A selection signal for selecting the pixels 2000 in the m-th row is supplied to the wiring Scan_L[m] and the wiring Scan_E[m]. A constant potential, for example, can be supplied to the wirings ANODE, CSCOM, TCOM, and VCOM.

The transistor M1 has a function of controlling writing data to the pixel 2000(m,n) through the wiring Data_L[n] by being turned on or off. The transistor M2 has a function of controlling writing data to the pixel 2000(m,n) through the wiring Data_E[n] by being turned on or off. The transistor M3 functions as a driving transistor which controls current supplied to the light-emitting element 2002.

The capacitor Cs1 has a function of retaining data written to the pixel 2000(m,n) through the wiring Data_L[n]. The capacitor Cs2 has a function of retaining data written to the pixel 2000(m,n) through the wiring Data_E[n].

The liquid crystal element 2001 has a function of controlling transmission or reflection of light. In particular, a so-called reflective liquid crystal element, which controls reflection of light, is preferably used as the liquid crystal element 2001. When the liquid crystal element 2001 is the reflective liquid crystal element, an image can be displayed using external light, which leads to a reduction in power consumption of the display device of one embodiment of the present invention. For example, the liquid crystal element 2001 may have a combined structure of a reflective film, a liquid crystal element, and a polarizing plate, a structure using a microelectromechanical systems (MEMS), or the like. A transmissive liquid crystal element which does not include a reflective film may be used as the liquid crystal element 2001.

The light-emitting element 2002 has a function of emitting light. As the light-emitting element 2002, a self-luminous light-emitting element such as an organic light-emitting diode (OLED), a light-emitting diode (LED), a quantum-dot light-emitting diode (QLED), an inorganic electroluminescence (IEL), or a semiconductor laser can be used, for example. The luminance and the chromaticity of light emitted from such a light-emitting element is not affected by external light. Therefore, an image with high color reproducibility (a wide color gamut) and a high contrast can be displayed. That is, a high-quality image can be displayed.

When the transistor M3 includes a back gate, that is, the transistor M3 includes a plurality of gates as illustrated in FIG. 37, the reliability or driving capability of the transistor M3 can be improved. For example, as illustrated in FIG. 37, the back gate of the transistor M3 is electrically connected to the gate (also referred to as a first gate or a front gate) of the transistor M3, which leads to improvement of the current driving capability of the transistor M3. Although not illustrated, the back gate of the transistor M3 is electrically connected to the one or the other of the source and the drain of the transistor M3, so that the potential of the transistor M3 on the back channel side can be fixed.

The transistors M1 to M3 each preferably include a metal oxide in a channel formation region. The transistor including a metal oxide can have relatively high field-effect mobility and thus can operate at high speed. The off-state current of the transistor including a metal oxide is extremely low. Therefore, the luminance of the displayed image can be kept even when the refresh rate of the display device of one embodiment of the present invention is lowered, so that power consumption can be reduced.

<Method for Driving Pixel>

Figure 38:
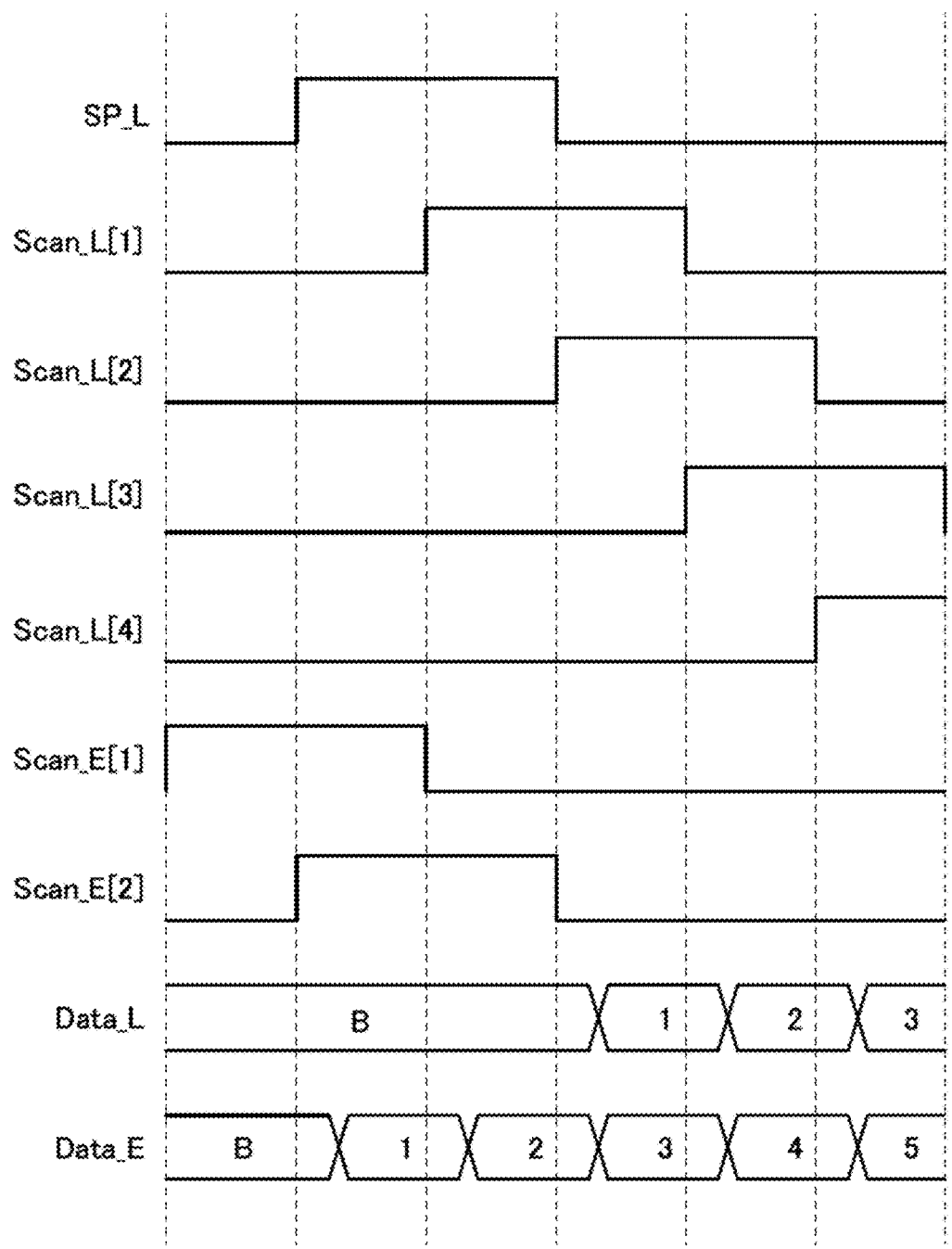
FIG. 38 is a timing chart showing operations of pixels.

FIG. 38 is a timing chart showing a method for driving the pixel 2000. In FIG. 38, the potential of a wiring SP_L, the potential of a wiring Scan_L[1], the potential of a wiring Scan_L[2], the potential of a wiring Scan_L[3], the potential of a wiring Scan_L[4], the potential of a wiring Scan_E[1], the potential of a wiring Scan_E[2], the potential of a wiring Data_L, and the potential of a wiring Data_E are shown. Note that the wiring SP_L has a function of supplying a start pulse. For example, in the case where the display device of one embodiment of the present invention includes pixels 2000 for p columns (here, p is an integer greater than or equal to 2), the wiring Data_L denotes wirings Data_L[1] to Data_L[p] and the wiring Data_E denotes wirings Data_E[1] to Data_E[p].

As for the wirings Data_L and Data_E, B represents a retrace period and the number represents a potential corresponding to data that is written to the pixels 2000 in which row. For example, in a period represented by 1 of the wiring Data_L, the potential of the wiring Data_L is a potential corresponding to data that is written to the pixels 2000 in the first row. For example, in a period represented by 1 of the wiring Data_E, the potential of the wiring Data_E is a potential corresponding to data that is written to the pixels 2000 in the first row.

In the timing chart in FIG. 38 and the like, a driving method of the transistors M1 and M2 which are n-channel transistors will be described. That is, the transistor M1 is turned on by supplying a high potential to the wiring Scan_L and turned off by supplying a low potential to the wiring Scan_L. Moreover, the transistor M2 is turned on by supplying a high potential to the wiring Scan_E and turned off by supplying a low potential to the wiring Scan_E. Note that a low potential can be a ground potential, for example.

The transistors M1 and M2 may be p-channel transistors. In that case, the transistor M1 is turned on by supplying a low potential to the wiring Scan_L and turned off by supplying a high potential to the wiring Scan_L. Moreover, the transistor M2 is turned on by supplying a low potential to the wiring Scan_E and turned off by supplying a high potential to the wiring Scan_E. The transistor M3 may also be either an n-channel transistor or a p-channel transistor.

As shown in FIG. 38, the pixels 2000 in each row are sequentially selected by supplying a high potential sequentially to the wiring Scan_L electrically connected to the pixels 2000 in the row, so that the transistors M1 provided for the pixels 2000 in the row are sequentially turned on. Thus, data is sequentially written to the pixels 2000 in the row through the wiring Data_L. When the transistors M1 are turned off, the pixels 2000 in which the data has been written are brought into a holding state. Accordingly, an image can be displayed by the liquid crystal element 2001.

Furthermore, as shown in FIG. 38, the pixels 2000 in each row are sequentially selected by supplying a high potential sequentially to the wiring Scan_E electrically connected to the pixels 2000 in the row, so that the transistors M2 provided for the pixels 2000 in the row are sequentially turned on. Thus, data is sequentially written to the pixels 2000 in the row through the wiring Data_E. When the transistors M2 are turned off, the pixels 2000 in which the data has been written are brought into a holding state. In addition, the amount of current flowing between the source and the drain of the transistor M3 is controlled in accordance with the data which has been written (the potential of a data signal supplied from the wiring Data_E), and the light-emitting element 2002 emits light with a luminance corresponding to the amount of flowing current. Accordingly, an image can be displayed by the light-emitting element 2002.

The display device of one embodiment of the present invention can display an image using at least one of the liquid crystal element 2001 and the light-emitting element 2002. For example, the liquid crystal element 2001 can improve visibility under an environment with external light having high intensity. On the other hand, the light-emitting element 2002 can improve visibility under an environment with external light having weak intensity.

Note that the display device of one embodiment of the present invention may display an image with both the liquid crystal element 2001 and the light-emitting element 2002, in which case the visibility can be improved regardless of the intensity of external light.

Figure 39:
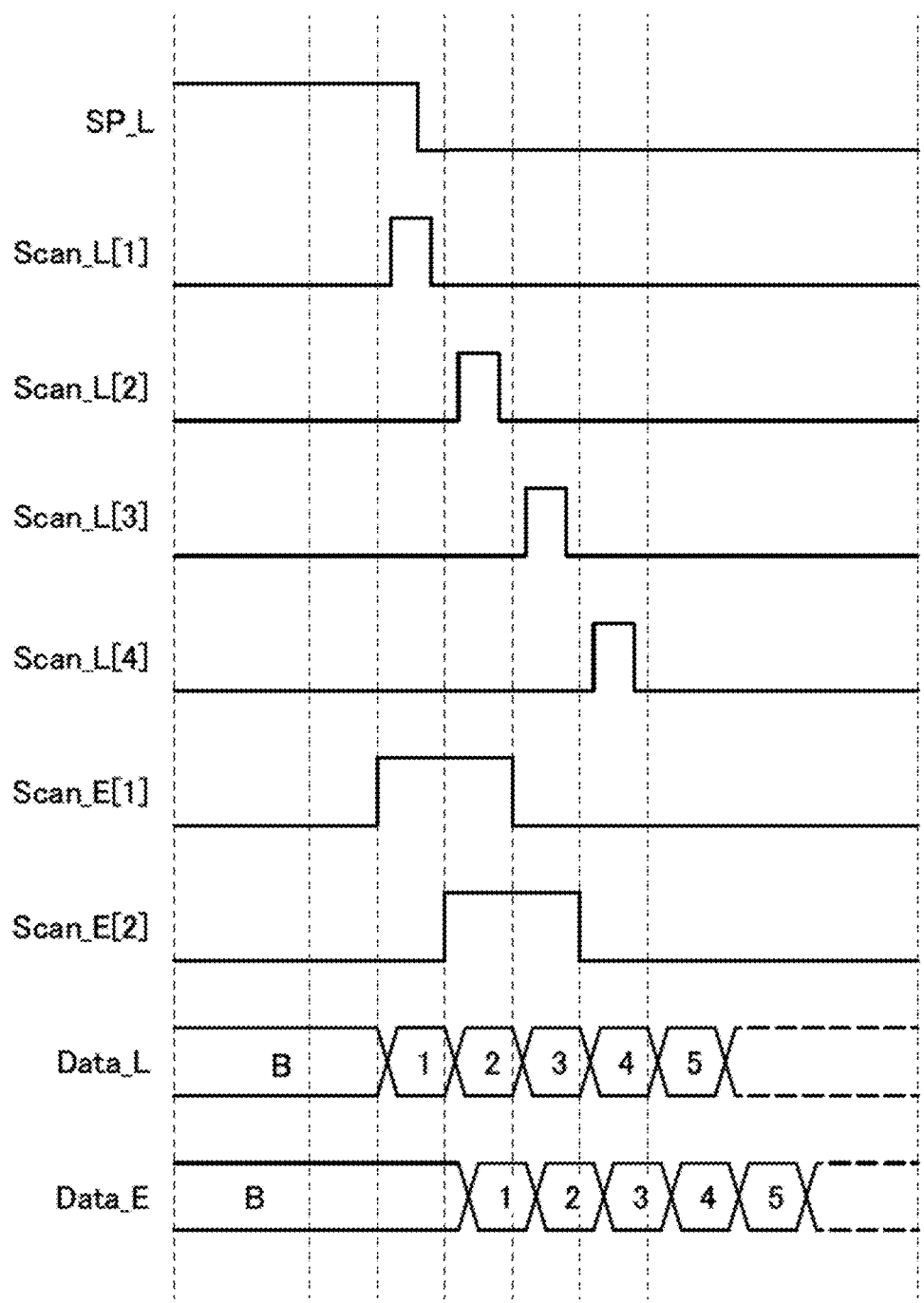
FIG. 39 is a timing chart showing operations of pixels.

Although the period during which the wiring Scan_L has a high potential and the period during which the wiring Scan_E has a high potential are set to have an equal length in FIG. 38, they do not necessarily have an equal length. For example, as shown in FIG. 39, the period during which the wiring Scan_L has a high potential may be shorter than the period during which the wiring Scan_E has a high potential. In FIG. 39, after data is written to the pixels 2000 in the m-th row through the wiring Data_L, data is written to the pixels 2000 in the m-th row through the wiring Data_E. Thus, a change in data held in the capacitor Cs2 due to parasitic capacitance Cs_S can be suppressed. Therefore, black floating can be prevented from occurring in an image displayed by the light-emitting element 2002, and the contrast ratio of the image can be enhanced.

This embodiment can be implemented in appropriate combinations with any of the other embodiments.

Embodiment 14

<Composition of CAC-OS>

Described below will be the composition of a cloud-aligned composite oxide semiconductor (CAC-OS) applicable to a transistor of one embodiment of the present invention.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a c-axis-aligned crystalline or c-axis-aligned a-b-plane-anchored crystal (CAAC) structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a layered structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be deposited by a sputtering method under conditions where a substrate is not heated intentionally, for example. In the case of depositing the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow rate of an oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

As described above, the CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility (t) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, a leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current (Ion) and high field-effect mobility (t) can be achieved.

A semiconductor element including a CAC-OS has high reliability. Thus, the CAC-OS is suitably used in a variety of semiconductor devices typified by a display.

At least part of this embodiment can be implemented in appropriate combination with any of the other embodiments described in this specification.

(Notes on the Description in this Specification and the Like)

The following are notes on the description of the above embodiments and the structures in the embodiments.

<Notes on One Embodiment of the Present Invention Described in Embodiments>

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

<Notes on Ordinal Numbers>

In this specification and the like, ordinal numbers such as "first", "second", and "third" are used in order to avoid confusion among components. Thus, the terms do not limit the number or order of components. In the present specification and the like, for example, a "first" component in one embodiment can be referred to as a "second" component in other embodiments or claims. Furthermore, in the present specification and the like, for example, a "first" component in one embodiment can be omitted in other embodiments or claims.

<Notes on the Description for Drawings>

Embodiments are described with reference to drawings. However, the embodiments can be implemented with various modes. It is readily appreciated by those skilled in the art that modes and details can be changed in various ways without departing from the spirit and scope of the present invention. Thus, the present invention should not be interpreted as being limited to the description of the embodiments. Note that in the structures of the embodiments, the same portions or portions having similar functions are denoted by the same reference numerals in different drawings, and the description of such portions is not repeated.

In this specification and the like, terms for describing arrangement, such as "over" and "under", are used for convenience to indicate a positional relation between components with reference to drawings. The positional relation between components is changed as appropriate in accordance with the direction in which each component is described. Therefore, terms for describing arrangement are not limited to the terms used in the description in the specification, and can be appropriately reworded depending on situations.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can include the case where another component is provided between the insulating layer A and the electrode B.

In this specification and the like, components are classified on the basis of the functions, and shown as blocks independent of one another in block diagrams. However, in an actual circuit or the like, it may be difficult to separate components on the basis of the functions, so that one circuit may be associated with a plurality of functions and several circuits may be associated with one function. Therefore, the segmentation of a block in the block diagrams is not limited by any of the components described in the specification, and can be differently determined as appropriate depending on situations.

In the drawings, the size, the layer thickness, or the region has arbitrary magnitude for convenience for the description. Therefore, the scale is not necessarily limited to that illustrated in the drawings. Note that the drawings are schematically illustrated for clarity, and shapes or values are not limited to those illustrated in the drawings. For example, the following can be included: variation in signal, voltage, or current due to noise or difference in timing.

In drawings such as a perspective view, some of components might not be illustrated for clarity of the drawings.

In the drawings, the same components, components having similar functions, components formed of the same material, or components formed at the same time are denoted by the same reference numerals in some cases, and the description thereof is not repeated in some cases.

<Notes on Expressions that can be Rephrased>

In this specification and the like, in description of connections of a transistor, the terms "one of a source and a drain" (or a first electrode or a first terminal) and "the other of the source and the drain" (or a second electrode or a second terminal) are used. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation. In this specification and the like, two terminals except a gate are sometimes referred to as a first terminal and a second terminal or as a third terminal and a fourth terminal.

A transistor includes three terminals called a gate, a source, and a drain. A gate is a terminal that controls the conduction state of a transistor. Depending on the channel type of the transistor or the levels of potentials supplied to the terminals, one of terminals (an input terminal and an output terminal) functions as a source and the other functions as a drain. Therefore, the terms "source" and "drain" are interchangeable in this specification and the like. Furthermore, the two terminals other than the gate may be referred to as a first terminal and a second terminal or as a third terminal and a fourth terminal in this specification and the like.

In addition, in this specification and the like, the term such as an "electrode" or a "wiring" does not limit the function of a component. For example, an "electrode" is used as part of a "wiring" in some cases, and vice versa. Furthermore, the term "electrode" or "wiring" can also mean a combination of a plurality of "electrodes" or "wirings" formed in an integrated manner.

In this specification and the like, the terms "voltage" and "potential" are interchangeable in appropriate cases. The term "voltage" refers to a potential difference between a given potential and a reference potential. When the reference potential is a ground potential, the term "voltage" can be replaced with the term "potential". The ground potential does not necessarily mean 0 V. Note that a potential is relative, and a potential supplied to wirings or the like may be changed depending on a reference potential.

In this specification and the like, the terms "film", "layer", and the like can be interchanged with each other depending on the case or circumstances. For example, the term "conductive layer" can be changed into the term "conductive film" in some cases. Moreover, the term "insulating film" can be changed into the term "insulating layer" in some cases, or can be replaced with a word not including the term "film" or "layer" depending on the case or circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring", "signal line", "power supply line", and the like can be interchanged with each other depending on circumstances or conditions. For example, the term "wiring" can be changed into the term such as "signal line" or "power supply line" in some cases. The term such as "signal line" or "power supply line" can be changed into the term "wiring" in some cases. The term such as "power supply line" can be changed into the term such as "signal line" in some cases. The term such as "signal line" can be changed into the term such as "power supply line" in some cases. The term "potential" that is supplied to a wiring can be changed into the term "signal"

or the like depending on circumstances or conditions. Inversely, the term "signal" or the like can be changed into the term "potential" in some cases.

<Notes on Definitions of Terms>

The following are definitions of the terms mentioned in the above embodiments.

<<Semiconductor>>

Note that in this specification, a "semiconductor" may have the characteristics of an "insulator" when the conductivity is sufficiently low, for example. In addition, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Note that a "semiconductor" may have the characteristics of a "conductor" when the conductivity is sufficiently high, for example. In addition, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that impurities in a semiconductor refer to, for example, elements other than the main components of a semiconductor layer. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the semiconductor; specifically, there are hydrogen (included in water), lithium, sodium, silicon, boron, phosphorus, carbon, and nitrogen, for example. Furthermore, in the case of an oxide semiconductor, oxygen vacancies may be formed by entry of impurities such as hydrogen. In the case where the semiconductor is a silicon layer, examples of an impurity which changes the characteristics of the semiconductor include oxygen, Group 1 elements except hydrogen, Group 2 elements, Group 13 elements, and Group 15 elements.

<<Transistor>>

In this specification, a transistor is an element having at least three terminals of a gate, a drain, and a source. The transistor has a channel formation region between the drain (a drain terminal, a drain region, or a drain electrode) and the source (a source terminal, a source region, or a source electrode), and current can flow between the source and the drain through the channel formation region.

Furthermore, functions of a source and a drain might be switched when transistors having different polarities are employed or a direction of current flow is changed in circuit operation, for example. Therefore, the terms "source" and "drain" can be switched in this specification and the like.

<<Switch>>

In this specification and the like, a switch is an element that is brought into a conduction state or a non-conduction state (is turned on or off) to determine whether a current flows therethrough or not. Alternatively, the switch is an element having a function of selecting and changing a current path.

For example, an electrical switch, a mechanical switch, or the like can be used as a switch. That is, any element can be used as a switch as long as it can control a current, without limitation to a certain element.

A transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), or a logic circuit in which such elements are combined can be used as an electrical switch.

When a transistor is used as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically disconnected. Note that if the transistor operates just as a switch, there is no particular limitation on the polarity (conductivity type) of the transistor.

An example of a mechanical switch is a switch formed using a MEMS (microelectromechanical system) technology, such as a digital micromirror device (DMD). Such a switch includes an electrode which can be moved mechanically, and operates by controlling conduction and non-conduction in accordance with movement of the electrode.

<<Connection>>

In this specification and the like, when it is described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limitation to a predetermined connection relation, for example, the connection relation shown in the drawings and the texts.

Here, X, Y, and the like each denote an object (e.g., a device, an element, a circuit, a wiring, an electrode, a terminal, a conductive film, or a layer).

For example, in the case where X and Y are electrically connected, one or more elements that enable electrical connection between X and Y (e.g., a switch, a transistor, a capacitor, an inductor, a resistor, a diode, a display element, a light-emitting element, and a load) can be connected between X and Y. A switch is controlled to be on or off. That is, a switch is conducting or not conducting (is turned on or off) to determine whether a current flows therethrough or not.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit and a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that when it is explicitly described that X and Y are connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, the explicit expression "X and Y are electrically connected" is the same as the explicit simple expression "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to a part of Z1 and another part of Z1 is directly connected to X while a drain (or a second terminal or the like) of the transistor is directly connected to a part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are only examples and one embodiment of the present invention is not limited to the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and Perpendicular>>

In this specification, the term "parallel" indicates that the angle formed between two straight lines is greater than or equal to −100 and less than or equal to 100, and accordingly also includes the case where the angle is greater than or equal to −50 and less than or equal to 50. In addition, the term "substantially parallel" indicates that the angle formed between two straight lines is greater than or equal to −300 and less than or equal to 300. In addition, the term "perpendicular" indicates that the angle formed between two straight lines is greater than or equal to 800 and less than or equal to 1000, and accordingly also includes the case where the angle is greater than or equal to 850 and less than or equal to 950. In addition, the term "substantially perpendicular" indicates that the angle formed between two straight lines is greater than or equal to 600 and less than or equal to 1200.

<<Trigonal and Rhombohedral>>

In this specification, trigonal and rhombohedral crystal systems are included in a hexagonal crystal system.

REFERENCE NUMERALS

DRL: wiring, SNL: wiring, CTαβ: capacitor, GL: wiring, SL: wiring, GE: wiring, GEa: wiring, GEb: wiring, DL: wiring, DLa: wiring, DLb: wiring, AL: wiring, ML: wiring, MLa: wiring, MLb: wiring, PD1: photodiode, PD2: photodiode, PD3: photodiode, PD4: photodiode, PD5: photodiode, PD6: photodiode, PD7: photodiode, PD8: photodiode, PD9: photodiode, PD10: photodiode, PD11: photodiode, PD: photodiode, OUT[1]: column output circuit, OUT[j]: column output circuit, OUT[n]: column output circuit, Cref: reference column output circuit, AM[1,1]: memory cell, AM[i,1]: memory cell, AM[m,1]: memory cell, AM[1,j]: memory cell, AM[i,j]: memory cell, AM[i+1,j]: memory cell, AM[i,j+1]: memory cell, AM[i+1,j+1]: memory cell, AM[m,j]: memory cell, AM[1,n]: memory cell, AM[i,n]: memory cell, AM[m,n]: memory cell, AMref[1]: memory cell, AMref[i]: memory cell, AMref[i+1]: memory cell, AMref[m]: memory cell, N[1,1]: node, N[i,1]: node, N[m,1]: node, N[1,j]: node, N[i,j]: node, N[i+1,j]: node, N[i,j+1]: node, N[i+1,j+1]: node, N[m,j]: node, N[1,n]: node, N[i,n]: node, N[m,n]: node, Nref[i]: node, Nref[i+1]: node, ORP: wiring, OSP: wiring, B[1]: wiring, B[j]: wiring, B[j+1]: wiring, B[n]: wiring, Bref: wiring, RW[1]: wiring, RW[i]: wiring, RW[i+1]: wiring, RW[m]: wiring, WW[1]: wiring, WW[i]: wiring, WW[i+1]: wiring, WW[m]: wiring, WD[1]: wiring, WD[j]: wiring, WD[j+1]: wiring, WD[n]: wiring, WDref: wiring, VR: wiring, VDDL: wiring, VSSL: wiring, CM: current mirror circuit, CI: constant current circuit, CIref: constant current circuit, CT1: terminal, CT2: terminal, CT3: terminal, CT4: terminal, CT5[1]: terminal, CT5[j]: terminal, CT5[j+1]: terminal, CT5[n]: terminal, CT6[1]: terminal, CT6[j]: terminal, CT6[j+1]: terminal, CT6[n]: terminal, CT7: terminal, CT8: terminal, OT[1]: output terminal, OT[i]: output terminal, OT[j+1]: output terminal, OT[n]: output terminal, OTref: output terminal, IL[1]: wiring, IL[j]: wiring, IL[j+1]: wiring, IL[n]: wiring, ILref: wiring, BG[1]: wiring, BG[j]: wiring, BG[j+1]: wiring, BG[n]: wiring, BGref: wiring, OL[1]: wiring, OL[j]: wiring, OL[j+1]: wiring, OL[n]: wiring, OLref: wiring, NCMref: node, Tr1: transistor, Tr2: transistor, Tr3: transistor, Tr4: transistor, Tr5: transistor, Tr6: transistor, Tr7: transistor, Tr11: transistor, Tr12: transistor, C1: capacitor, C2: capacitor, M1: transistor, M2: transistor, M3: transistor, Cs1: capacitor, Cs2: capacitor, Cs_S: capacitance, Data_L[n]: wiring, Scan_L[m]: wiring, Data_E[n]: wiring, Scan_E[m]: wiring, ANODE: wiring, CSCOM: wiring, TCOM: wiring, VCOM: wiring, 10: pixel, 10a: reflective element, 10b: light-emitting element, 100: substrate, 101: substrate, 102: display portion, 103: display portion, 104: bonding layer, 110: display unit, 111: pixel array, 113: gate driver, 114: gate driver, 115: controller IC, 120: touch sensor unit, 121: sensor array, 125: peripheral circuit, 126: TS driver, 127: sensing circuit, 130: display device, 140: host, 141: sensor, 143: optical sensor, 144: open/close sensor, 145: external light, 146: acceleration sensor, 150: interface, 151: frame memory, 152: decoder, 153: sensor controller, 154: controller, 155: clock generation circuit, 160: image processing portion, 161: gamma correction circuit, 162: dimming circuit, 163: color calibration circuit, 164: EL correction circuit, 165: data processing circuit, 165*a*: product-sum operation circuit, 165*b*: switch circuit, 165*c*: bus, 170: memory, 173: timing controller, 175: register, 180: source driver, 181: source driver, 182: source driver, 184: touch sensor controller, 200: display device, 201: substrate, 202: substrate, 203: light-emitting element, 204: liquid crystal element, 205: transistor, 206: transistor, 207: pixel electrode, 208: common electrode, 209: liquid crystal layer, 210: layer, 210*a*: layer, 210*b*: layer, 300: pixel, 301: liquid crystal element, 302: light-emitting element, 303: transistor, 304: capacitor, 305: transistor, 306: transistor, 307: capacitor, 308: transistor, 309: transistor, 310: transistor, 311: conductive layer, 312: insulating layer, 313: semiconductor layer, 314: conductive layer, 315: conductive layer, 316: insulating layer, 317: conductive layer, 318: insulating layer, 319: conductive layer, 320: conductive layer, 321: conductive layer, 322: semiconductor layer, 323: conductive layer, 324: insulating layer, 325: insulating layer, 326: conductive layer, 327: conductive layer, 328: insulating layer, 329: conductive layer, 330: insulating layer, 331: EL layer, 332: conductive layer, 333: bonding layer, 334: coloring layer, 335: spacer, 336: light-blocking layer, 340: conductive layer, 341: insulating layer, 342: semiconductor layer, 343: insulating layer, 344: conductive layer, 345: insulating layer, 346: conductive layer, 347: conductive layer, 348: conductive layer, 349: conductive layer, 350: pixel, 351: pixel, 351*a*: pixel, 351*b*: pixel, 351*c*: pixel, 351*d*: pixel, 360: insulating layer, 361: conductive layer, 362: bonding layer, 363: insulating layer, 364: alignment film, 365: alignment film, 366: liquid crystal layer, 411: circuit, 413: circuit, 414: circuit, 415: circuit, 500: substrate, 501: pixel portion, 502: scan line driver circuit, 503: scan line driver circuit, 504: IC, 505: IC, 506: wiring, 508: FPC, 509: FPC, 510: FPC, 511: wiring, 512: wiring, 513: pixel, 514: display region, 515: display region, 516: display region, 517: display region, 518: display region, 600: optical sensor, 601: light-blocking film, 602: light-blocking film, 700: semiconductor device, 710: offset circuit, 711: offset circuit, 712: offset circuit, 713: offset circuit, 715: offset circuit, 716: offset circuit, 720: memory cell array, 721: memory cell array, 750: offset circuit, 760: memory cell array, 800: image processing portion, 801: host, 1000: car body, 1002: window, 1004: optical sensor, 1004L: optical sensor, 1004R: optical sensor, 1012: dashboard, 1015: pillar, 1031 display portion, 1032 arithmetic circuit, 1033L: camera, 1033R: camera, 1034: optical sensor, 1035: optical sensor, 1051A: display portion, 1051B: display portion, 1051C: display portion, 1051D: display portion, 1052A: display portion, 1052B: display portion, 1052C: display portion, 1060: display portion, 1061: window, 1071L: camera, 1071R: camera, 1072L: camera, 1072R: camera, 1073L: camera, 1073R: camera, 1301: automobile, 1302: bus, 1303: train, 1304: airplane, 1311: window, 2000: pixel, 2001: liquid crystal element, 2002: light-emitting element, 5200: information terminal, 5201: information terminal, 5221: housing, 5222: display portion, 5223: operation button, 5224: speaker, 5225X: optical sensor, 5225Y: optical sensor.

This application is based on Japanese Patent Application Serial No. 2016-128736 filed with Japan Patent Office on Jun. 29, 2016 and Japanese Patent Application Serial No. 2016-151239 filed with Japan Patent Office on Aug. 1, 2016, the entire contents of which are hereby incorporated by reference.

The invention claimed is:
1. An electronic device comprising:
a sensor; and
a semiconductor device, the semiconductor device including a first memory cell, a second memory cell, and an offset circuit,
wherein the first memory cell is configured to output a first current in accordance with first analog data held in the first memory cell,
wherein the second memory cell is configured to output a second current in accordance with reference analog data held in the second memory cell,
wherein the offset circuit is configured to output a third current corresponding to a difference between the first current and the second current,
wherein the first memory cell is configured to output a fourth current in accordance with the first analog data held in the first memory cell and second analog data in the case where the second analog data is supplied as a signal to the first memory cell,
wherein the second memory cell is configured to output a fifth current in accordance with the reference analog data held in the second memory cell and the second analog data in the case where the second analog data is supplied to the second memory cell as the signal,
wherein the semiconductor device is configured to output a sixth current that corresponds to a sum of products of the first analog data and the second analog data and that is obtained by subtracting the third current from a difference between the fourth current and the fifth current,
wherein the sensor is configured to acquire first data,
wherein the semiconductor device is configured to generate third data in accordance with the first data, second data selected by a user, and the sixth current, and
wherein the second data includes a set value corresponding to first luminance and a first color tone.
2. The electronic device according to claim 1, further comprising a first display element and a second display element,
wherein the third data includes fourth data including a set value corresponding to second luminance and a second color tone and fifth data including a set value corresponding to third luminance and a third color tone,
wherein the first display element is configured to display an image depending on the set value corresponding to the second luminance and the second color tone with use of reflection of light, and
wherein the second display element is configured to display an image depending on the set value corresponding to the third luminance and the third color tone by self-emission.
3. The electronic device according to claim 1 or 2,
wherein the first memory cell, the second memory cell, and the offset circuit, each including a transistor, and
wherein a channel formation region in the transistor includes an oxide containing at least one of indium, zinc, and an element M that is aluminum, gallium, yttrium, or tin.

4. The electronic device according to claim 1 or 2,
wherein the sensor includes a first sensor portion,
wherein the first sensor portion includes a first light-blocking film, a second light-blocking film, and a plurality of optical sensors,
wherein the first light-blocking film is provided with a plurality of first openings at intervals of a first distance,
wherein the second light-blocking film is provided with a plurality of second openings at intervals of a second distance longer than the first distance,
wherein the first light-blocking film is located over the optical sensors,
wherein the second light-blocking film is located over the first light-blocking film, and
wherein one of the plurality of optical sensors, one of the plurality of first openings, and one of the plurality of second openings partly overlap with one another.

5. The electronic device according to claim 1 or 2,
wherein the sensor further includes a second sensor portion, and
wherein the second sensor portion includes an acceleration sensor.

6. The electronic device according to claim 1, wherein the semiconductor device is configured such that the second data is selected by a user.

7. A moving vehicle comprising:
a sensor;
a semiconductor device including a first memory cell, a second memory cell, and an offset circuit; and
a display portion,
wherein the first memory cell is configured to output a first current in accordance with first analog data held in the first memory cell,
wherein the second memory cell is configured to output a second current in accordance with reference analog data held in the second memory cell,
wherein the offset circuit is configured to output a third current corresponding to a difference between the first current and the second current,
wherein the first memory cell is configured to output a fourth current in accordance with the first analog data held in the first memory cell and second analog data in the case where the second analog data is supplied as a signal to the first memory cell,
wherein the second memory cell is configured to output a fifth current in accordance with the reference analog data held in the second memory cell and the second analog data in the case where the second analog data is supplied to the second memory cell as the signal,
wherein the semiconductor device is configured to output a sixth current that corresponds to a sum of products of the first analog data and the second analog data and that is obtained by subtracting the third current from a difference between the fourth current and the fifth current,
wherein the sensor is configured to acquire first data,
wherein the semiconductor device is configured to generate third data in accordance with the first data, second data selected by a user, and the sixth current,
wherein the second data includes a set value corresponding to first luminance and a first color tone, and
wherein the display portion displays an image based on the third data.

8. The moving vehicle according to claim 7,
wherein the sensor is provided in a housing.

9. The moving vehicle according to claim 7, wherein the semiconductor device is configured such that the second data is selected by a user.

\* \* \* \* \*